US005772758A

United States Patent [19]

Collins et al.

[11] Patent Number: 5,772,758

[45] Date of Patent: Jun. 30, 1998

[54] NEAR REAL-TIME EXTRACTION OF DEPOSITION AND PRE-DEPOSITION CHARACTERISTICS FROM ROTATING SUBSTRATES AND CONTROL OF A DEPOSITION APPARATUS IN NEAR REAL-TIME

[75] Inventors: Douglas A. Collins; Thomas C. McGill; George O. Papa, all of Pasadena, Calif.

[73] Assignee: California Institute of Technology, Pasadena, Calif.

[21] Appl. No.: 602,144

[22] Filed: Feb. 15, 1996

Related U.S. Application Data

[63] Continuation of Ser. No. 365,830, Dec. 29, 1994, abandoned.

[51] Int. Cl.[6] .............. C30B 25/16

[52] U.S. Cl. .............. 117/85; 117/86; 117/108; 117/202

[58] Field of Search .............. 117/85, 86, 108, 117/202

[56] References Cited

U.S. PATENT DOCUMENTS

| | | | |
|---|---|---|---|
| 4,855,013 | 8/1989 | Ohta et al. | 117/85 |
| 4,931,132 | 6/1990 | Aspnes et al. | 117/85 |
| 5,120,393 | 6/1992 | Kubo et al. | 117/85 |
| 5,238,525 | 8/1993 | Turner et al. . | |

OTHER PUBLICATIONS

Maes et al, "Detection of Misfit Strain Relaxation in MBE Grown Si1–x Gex Films By Dynamic . . . ", Mechanisms of Heteropitaxial Growth Symp. Mater Res. Soc. 1992 pp. 427–431.

J. M. Van Hove, C. S. Lent, P. R. Pukite, P. I. Cohen, "Damped oscillations in reflection high energy electron diffraction during GaAs MBE," J. Vac. Sci. Tech., B1(3), 741 (Jul.–Sep. 1983).

J. H. Neave, B. A. Joyce, P. J. Dobson and N. Norton, "Dynamics of film growth of GaAs by MBE from RHEED Observations," Appl. Phys. A31, 1 (1983).

G. W. Turner and A. J. Isles, "Measurement of reflection high–energy electron diffraction oscillations during molecular–beam epitaxial growth of GaAs on a rotating substrate," J. Vac. Sci. Tech., B10(4), 1784 (Jul./Aug. 1992).

A. Savitzky and M. J. E. Golay, "Smoothing and differentiation of data by simplified least squares procedures," Anal. Chem., vol. 36, No. 8, 1627 (1964).

*Primary Examiner*—Robert Kunemund

*Attorney, Agent, or Firm*—Blakely, Sokoloff, Taylor & Zafman LLP

[57] ABSTRACT

Methods and apparatus are provided for monitoring deposition and pre-deposition characteristics such as the growth rates, oxide desorption, surface reconstruction, anion surface exchange reaction and smoothness of the surface of rotating substrates in near real-time during molecular beam epitaxy by processing the data in the time domain and for controlling a deposition apparatus in near real-time. An apparatus for extracting the characteristics and controlling the deposition apparatus in near real-time includes the following: (a) the deposition apparatus having a rotating substrate, (b) an energy pattern generator for subjecting the substrate to a beam of energy and for producing energy patterns, (c) an imaging unit for obtaining video images of the energy patterns, video images each having pixels, (d) a data processing unit for monitoring a selected set of the pixels on each of the video images, generating time-domain data for each video image and generating deposition parameters in near real-time, and (e) a deposition control unit for controlling the deposition apparatus in response to receiving the deposition parameters in near real-time. The method of extracting the characteristics and controlling the deposition apparatus in near real-time includes the following steps: obtaining video images of energy patterns coming from the substrate, monitoring a selected set of the pixels on each video image to generate time-domain data, filtering the time-domain data in near real-time, and controlling the deposition apparatus in near real-time.

21 Claims, 11 Drawing Sheets

MOTOR
RHEED GENERATOR
VIDEO CAMERA
MBE CONTROL UNIT
INTERFACE
CENTRAL PROCESSOR
CURSOR DEVICE
STORAGE DEVICE
MEMORY
DISPLAY
KEYBOARD
PRINTER

VIDEO CAMERA
RHEED GENERATOR
MOTOR
MBE CONTROL UNIT
STORAGE DEVICE
CURSOR DEVICE
PRINTER
CENTRAL PROCESSOR
KEYBOARD
DISPLAY
INTERFACE
MEMORY
1001
1017
1018
1014
1002
1012
1010
1019
1008
1016
10
12
13
14
15
16
17
19
20
21
22
24
26
28
30
18
1

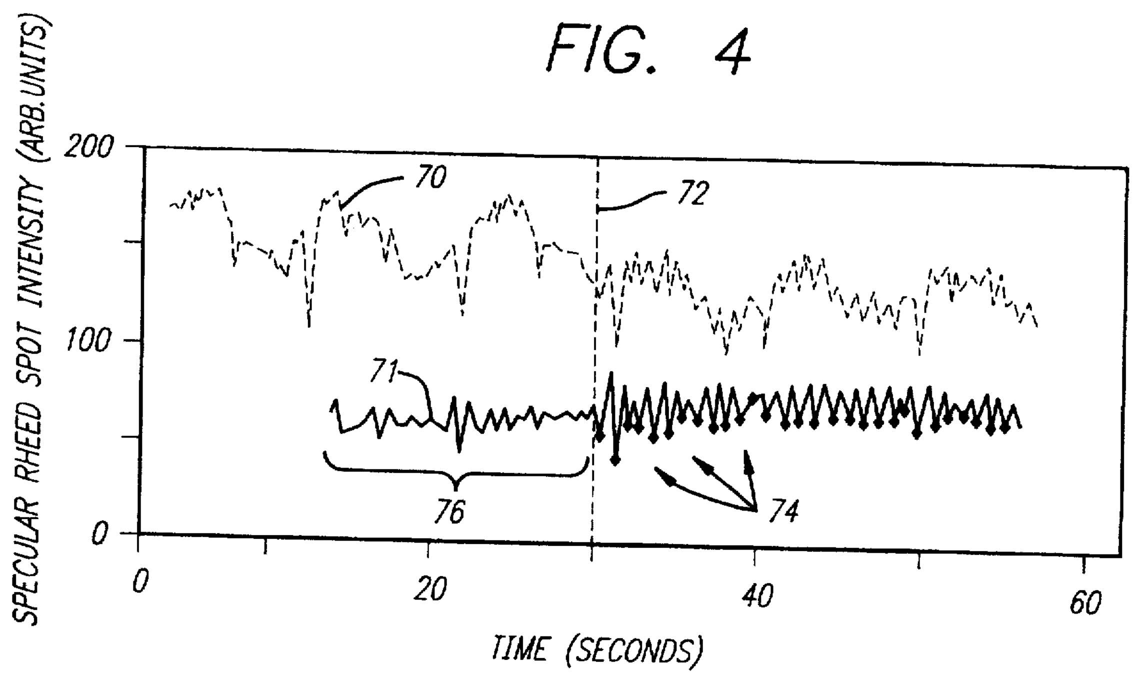
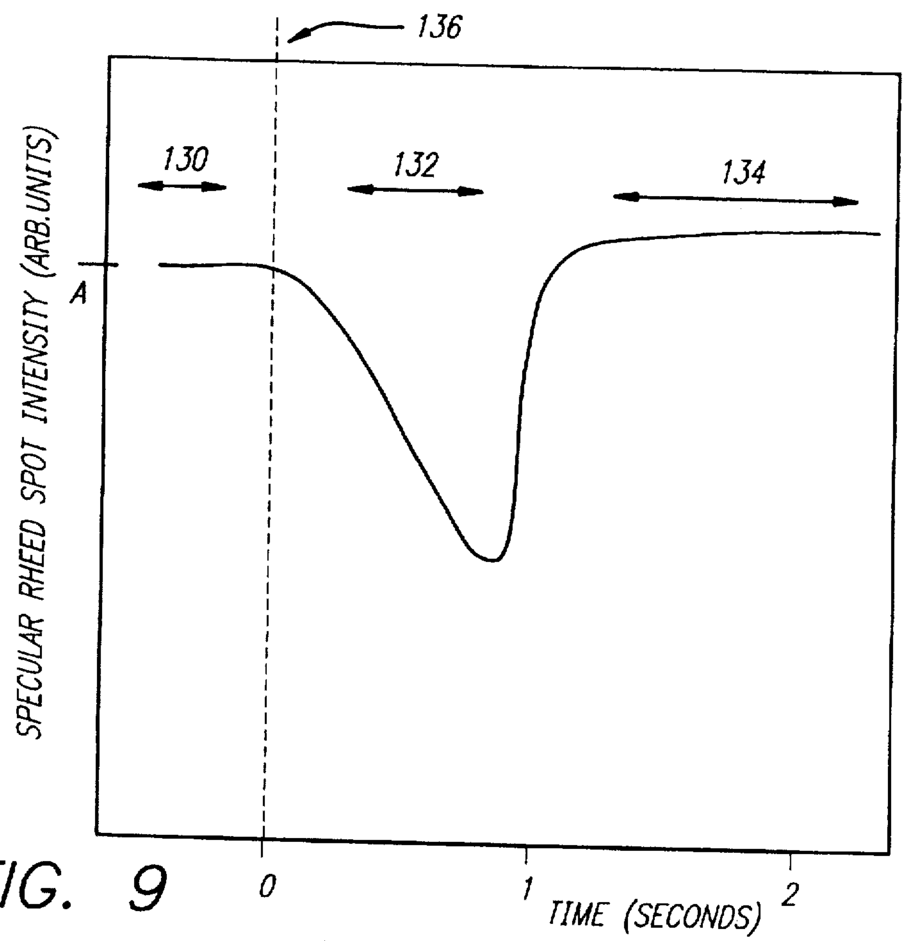
FIG. 9

REAL-TIME GROWTH RATE (MONOLAYERS/SECOND)
1.2
1.1
1.0
0.9
0
10
20
RUN NUMBER
81
82
83

STATIONARY SUBSTRATES
SPECULAR RHEED SPOT INTENSITY (a.u.)
106
105
101 GaAs SUBSTRATE
102 GaSb SUBSTRATE
0
2
4
6
TIME (MINUTES)

ROTATING SUBSTRATES
SPECULAR RHEED SPOT INTENSITY (a.u.)
108
107
103 GaAs SUBSTRATE
104 GaSb SUBSTRATE
0
2
4
6
TIME (MINUTES)

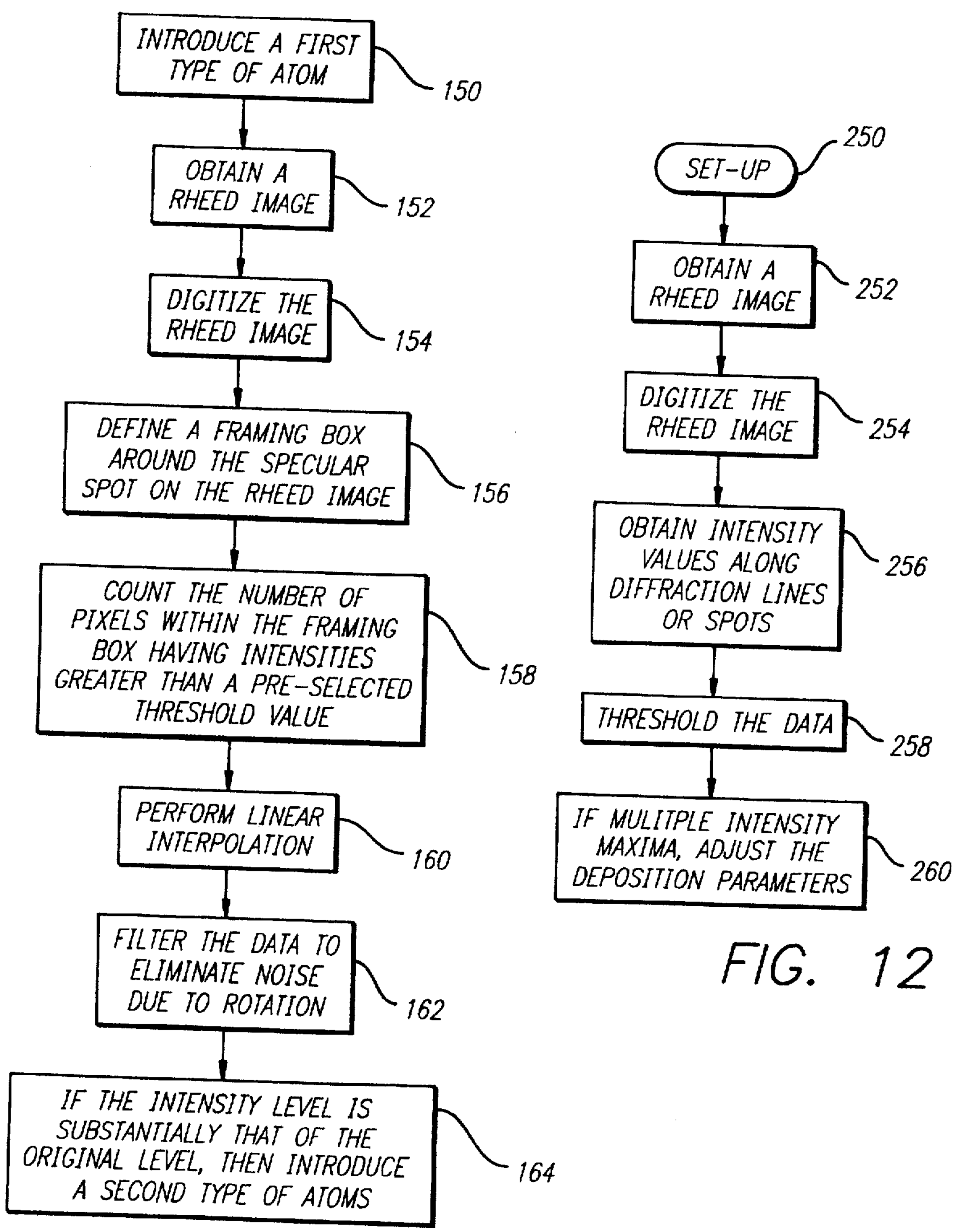
FIG. 10
INTRODUCE A FIRST TYPE OF ATOM
150
OBTAIN A RHEED IMAGE
152
DIGITIZE THE RHEED IMAGE
154
DEFINE A FRAMING BOX AROUND THE SPECULAR SPOT ON THE RHEED IMAGE
156
COUNT THE NUMBER OF PIXELS WITHIN THE FRAMING BOX HAVING INTENSITIES GREATER THAN A PRE-SELECTED THRESHOLD VALUE
158
PERFORM LINEAR INTERPOLATION
160
FILTER THE DATA TO ELIMINATE NOISE DUE TO ROTATION
162
IF THE INTENSITY LEVEL IS SUBSTANTIALLY THAT OF THE ORIGINAL LEVEL, THEN INTRODUCE A SECOND TYPE OF ATOMS
164
SET-UP
250
OBTAIN A RHEED IMAGE
252
DIGITIZE THE RHEED IMAGE
254
OBTAIN INTENSITY VALUES ALONG DIFFRACTION LINES OR SPOTS
256
THRESHOLD THE DATA
258
IF MULITPLE INTENSITY MAXIMA, ADJUST THE DEPOSITION PARAMETERS
260
FIG. 12

212
200
202
208
210
204
206
Y
X1
214
X2
216
X 232
222
228
242
246
224
Y′
230
X1′
X2′
234
236
X′

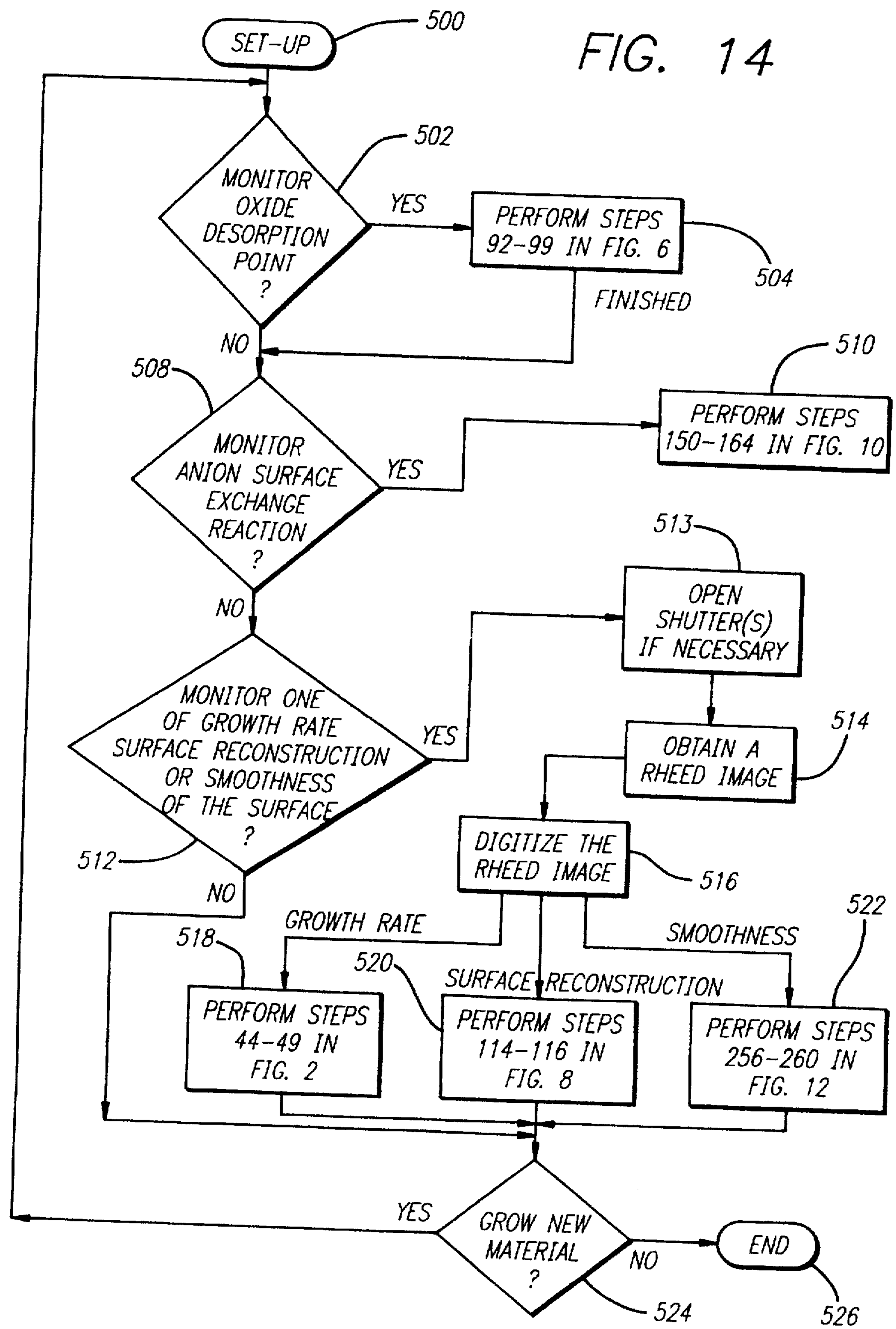
FIG. 14
500
SET-UP
502
MONITOR OXIDE DESORPTION POINT ?
YES
PERFORM STEPS 92-99 IN FIG. 6
504
FINISHED
NO
508
MONITOR ANION SURFACE EXCHANGE REACTION ?
YES
510
PERFORM STEPS 150-164 IN FIG. 10
NO
513
OPEN SHUTTER(S) IF NECESSARY
MONITOR ONE OF GROWTH RATE SURFACE RECONSTRUCTION OR SMOOTHNESS OF THE SURFACE ?
YES
514
OBTAIN A RHEED IMAGE
512
DIGITIZE THE RHEED IMAGE
516
NO
GROWTH RATE
522
518
SMOOTHNESS
520
SURFACE RECONSTRUCTION
PERFORM STEPS 44-49 IN FIG. 2
PERFORM STEPS 114-116 IN FIG. 8
PERFORM STEPS 256-260 IN FIG. 12
YES
GROW NEW MATERIAL ?
NO
END
524
526

NEAR REAL-TIME EXTRACTION OF DEPOSITION AND PRE-DEPOSITION CHARACTERISTICS FROM ROTATING SUBSTRATES AND CONTROL OF A DEPOSITION APPARATUS IN NEAR REAL-TIME

CROSS-REFERENCES TO RELATED APPLICATIONS

This is a continuation of a U.S. patent application (Application Ser. No. 08/365,830) filed Dec. 29, 1994, now abandoned.

STATEMENT OF GOVERNMENT INTEREST

The United States Government has certain rights in this invention pursuant to Contract Numbers N00014-89-J-3196, N00014-89-J-1141 and N00014-93-1-0710 awarded by the Office of Naval Research.

BACKGROUND OF THE INVENTION

1. Field of the Invention

The present invention relates to the field of molecular beam epitaxy and, more particularly, to reflection high energy electron diffraction (RHEED) measurements and characterizations of epilayer growth.

2. Description of the Related Art

Reflection high energy electron diffraction (RHEED) has long been used in molecular beam epitaxy (MBE) to measure growth rates, since under the proper growth conditions the intensity of the specular RHEED spot varies periodically with a frequency equal to the growth rate. To date, measurements of growth rates have been limited to stationary substrates, though Turner et al. have succeeded in extracting growth rates from rotating substrates using Fourier transform techniques, as described in U.S. Pat. No. 5,238,525 issued to G. W. Turner and A. J. Isles and in an article by G. W. Turner and A. J. Isles, J. Vac. Sci. Tech., B10, 1784 (1992). However, by its nature, this scheme is not real-time since several oscillations in the measured specular RHEED spot intensity are needed to determine the growth rate, producing a delay that is on the order of 10 seconds or more. As a result, Turner's technique can not be used to actively control layer thicknesses but rather it is limited to determining the thicknesses of layers after the layers have been deposited.

Unlike the prior art references, the present invention provides methods and apparatus for monitoring MBE deposition and pre-deposition characteristics in near real-time which typically does not exceed a delay of 0.33 seconds on rotating substrates by processing the data in the time domain rather than in the frequency domain and for controlling an MBE deposition apparatus in near real-time.

SUMMARY OF THE INVENTION

The present invention provides methods and apparatus for monitoring deposition and pre-deposition characteristics such as the growth rates, oxide desorption, surface reconstruction, anion surface exchange reaction and smoothness of the surface of a rotating substrate in near real-time during molecular beam epitaxy by processing the data in the time domain and for controlling an MBE deposition apparatus accordingly in near real-time.

First, the growth rate can be extracted in real-time by obtaining video RHEED images of the surface of the rotating substrate, digitizing the video RHEED images where each of the video RHEED image has pixels, defining a framing box around the specular RHEED spot on each of the digitized RHEED images, counting the number of the pixels within the framing box having intensities greater than a pre-selected threshold value to generate data points in the time domain where each data point represents the size (or the intensity) of the specular RHEED spot on a corresponding one of the RHEED images, performing linear interpolation if the data points are not evenly spaced with respect to time, filtering the data to eliminate noise due to rotation, identifying the peaks of the data points to determine the growth rate where each peak represents one monolayer, and adjusting the deposition parameters if the measured growth rate is different from the target value.

Second, the present invention can monitor the oxide desorption point and control the MBE deposition apparatus in near real-time using a method similar to that for extracting the growth rate. The differences are the following: The growth rate is extracted while materials are deposited on the substrate; the oxide desorption point is extracted while no materials are deposited on the substrate. After the filtering step, to determine the growth rate, the present invention identifies the peaks of the data points; to determine the oxide desorption point, the present invention monitors the changes in the values of the data points each representing the size (or the intensity) of the specular RHEED spot. When the values increase and level out, the present invention sends the appropriate signal(s) to the MBE deposition apparatus to introduce a new material or new materials to the substrate.

Third, the present invention can also monitor the surface reconstruction process substantially in real-time by obtaining a RHEED image, digitizing the RHEED image, identifying the number of the diffraction lines and the spacing between the diffraction lines on the RHEED image, comparing the measured values to the target values, and adjusting the deposition parameters if the two values are different.

Fourth, the anion surface exchange reaction can be monitored in near real-time using a method similar to that for extracting the growth rate. The difference is that while the present invention identifies the peaks of the data points to extract the growth rate, to analyze the anion surface exchange reaction, the present invention monitors whether the values of the data points have returned to an initial level after decreasing and increasing. When the data points return to the initial level, the substrate is ready to receive another type of atoms.

Finally, the smoothness of the surface of the substrate can be monitored substantially in real-time. The method includes the following steps: A RHEED image is obtained and digitized. The RHEED intensity values along the diffraction lines or diffraction spots on the RHEED image are obtained. The intensity values not exceeding a threshold value are set to zero. If multiple intensity maxima occur, then the deposition parameters are adjusted.

In the preferred embodiment, while the extraction process of the growth rate, oxide desorption point or anion surface exchange reaction is done in near real-time producing a delay not exceeding 0.33 seconds, monitoring the surface reconstruction or the smoothness of the surface of the substrate can be performed substantially in real-time producing a delay much less than 0.33 seconds.

BRIEF DESCRIPTION OF THE DRAWINGS

FIG. 4 shows another plot of the measured specular RHEED spot intensity versus time.

FIG. 9 shows a plot of the changes in the specular RHEED spot intensity versus time when a material is first introduced to a substrate.

FIG. 10 is a flow chart for monitoring the anion surface exchange reactions and controlling the MBE deposition apparatus in near real-time.

FIG. 12 is a flow chart for monitoring the smoothness of the surface and controlling the MBE deposition apparatus substantially in real-time.

FIG. 14 is a flow chart of a computer program for extracting various deposition and pre-deposition characteristics and controlling the MBE deposition apparatus in near real-time according to one embodiment of the present invention.

DETAILED DESCRIPTION OF THE INVENTION

GENERAL SYSTEM CONFIGURATION

The present invention provides methods and apparatus for extracting in near real-time various characteristics of the surface of a rotating substrate including, but not limited to, the growth rates, oxide desorption, surface reconstruction, anion surface exchange reaction, and smoothness of the surface by analyzing the reflection high energy electron diffraction (RHEED) patterns in the time domain during molecular beam epitaxy (MBE) in order to control an MBE deposition apparatus in near real-time.

Figure 1:
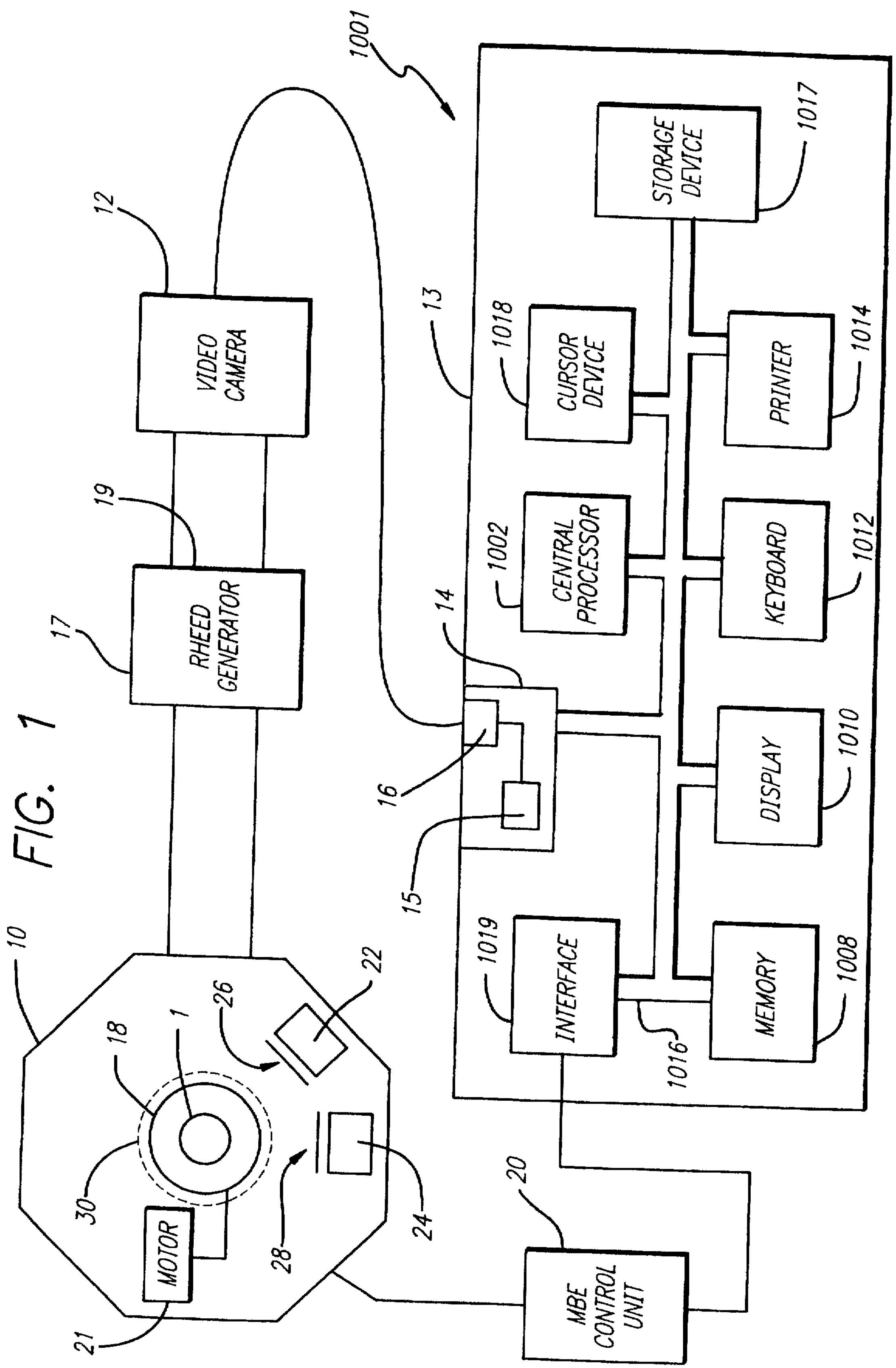
FIG. 1 is a molecular beam epitaxy (MBE) system according to the preferred embodiment of the present invention.

Referring to FIG. 1, in the preferred embodiment of the present invention, an MBE system 1001 includes an MBE deposition apparatus 10 having a substrate 11 on which epilayers are deposited, a substrate holder 18 for holding substrate 11, a motor 21 for rotating substrate holder 18, source cells 22 and 24, and shutters 26 and 28. MBE system 1001 further includes an MBE control unit 20 for controlling MBE deposition apparatus 10, a RHEED generator 17 for directing an electron beam to substrate 11 and producing RHEED patterns on its RHEED screen 19, a video camera 12 for obtaining video RHEED images of the RHEED patterns from RHEED screen 19, and a computer 13 for processing data and feeding information to MBE control unit 20 so that MBE control unit 20 can control MBE deposition apparatus 10 automatically.

Computer 13 may provide to MBE control unit 20 deposition parameters including, but not limited to, the appropriate substrate temperature, temperature of source cells 22 and 24 to adjust the atomic flux into the deposition chamber 30 and opening and closing of shutters 26 and 28 which let atoms to travel from the source cells 22 and 24 to substrate 11.

Computer 13 includes a memory 1008, a central processor 1002, a system bus 1016 for communicating information, a display device 1010, and a frame grabber card 14 for digitizing video RHEED images. Computer 13 further includes an alphanumeric input device 1012 including alphanumeric and function keys coupled to bus 1016 for communicating information and command selections to central processor 1002, a cursor control device 1018 for communicating user input information and command selections to central processor 1002 based on a user's hand movement, and an interface device 1019 coupled to bus 1016 for communicating information to and from computer 13. Interface device 1019 is coupled to MBE control unit 20 to send deposition parameters to MBE control unit 20. Interface device 1019 may also be coupled to a communication modem, a network system, other memory devices, other computers, etc. (not shown). Computer 13 may also include a data storage device 1017 such as a magnetic disk or optical disk drive for storing data and instructions and a printer 1014 for outputting data.

A computer such as a 486-based desktop computer is fast enough to perform the computations described below. A benefit of using a 486-based computer is its wide variety of frame grabber cards available as compared to workstations. Because of the broader range of product choices, a 486-based computer should provide better performance at relatively low costs than a workstation.

To obtain real-time deposition and pre-deposition characteristics and control MBE deposition apparatus 10 in near real-time, video camera 12 takes video images of the RHEED patterns on RHEED screen 19, and computer 13 digitizes and processes the images, extracts the characteristics and sends the appropriate deposition parameters to MBE control unit 20. To obtain a video image of a RHEED pattern, video camera 12 is focused on the diffraction pattern on RHEED screen 19. In the preferred embodiment, the video image is digitized into a 640×480 array of single-byte data using a frame grabber card 14. In another embodiment, it may be digitized into a different size of array. The digitized video image resides in a frame grabber memory 15 located on frame grabber card 14 which can be directly accessed and manipulated using programming pointers such as C-language pointers. As a result, the video image does not need to be copied into the computer's memory 1008 which greatly increases the frame grabbing rate. In the preferred embodiment, computer 13 can digitize up to 60 frames/second (fps), depending on the amount of image processing being done, with the maximum frame grabbing rate selected by the operator. In another embodiment, computer 13 can digitize more than or less than 60 frames/second. In addition, look-up tables used by analog to digital converters 16 in frame grabber card 14 are software programmable. This allows the video image to be processed as it is digitized to reduce the computational overhead. Using this feature of frame grabber card 14, the operator can interactively remove constant backgrounds and adjust the contrast and brightness of the digitized image.

The extraction of usable information from the RHEED image of rotating substrate 11 can be broken into two parts: (a) image processing which generates a usable stream of data and (b) data processing which extracts information from the data stream. Image processing is discussed first. By their nature, RHEED screen 19 produces RHEED patterns that are continuous in time. In the preferred embodiment, the RHEED patterns are first captured in a video frame stream with a characteristic frame rate (~30 fps for standard video equipment). To extract the growth rates, oxide desorption point or anion surface exchange reaction, a single data point characteristic of a single diffraction spot or streak which may consist of more than one video pixel is extracted from each such video frame; that is, if the image processing rate is sufficiently fast, then a series of time-domain data points can be obtained at a rate of ~30 fps. To monitor the surface reconstruction or the smoothness of the surface of the substrate, multiple data points characteristic of individual diffraction spots or streaks each of which may consist of more than one video pixel are obtained for each video frame.

Data processing may include, but is not limited to, interpolating the data points, filtering noise due to rotation of substrate 11, identifying the peaks of the data points, comparing the actual data to target values and detecting changes in the data values.

EXTRACTION OF GROWTH RATES

Figure 2:
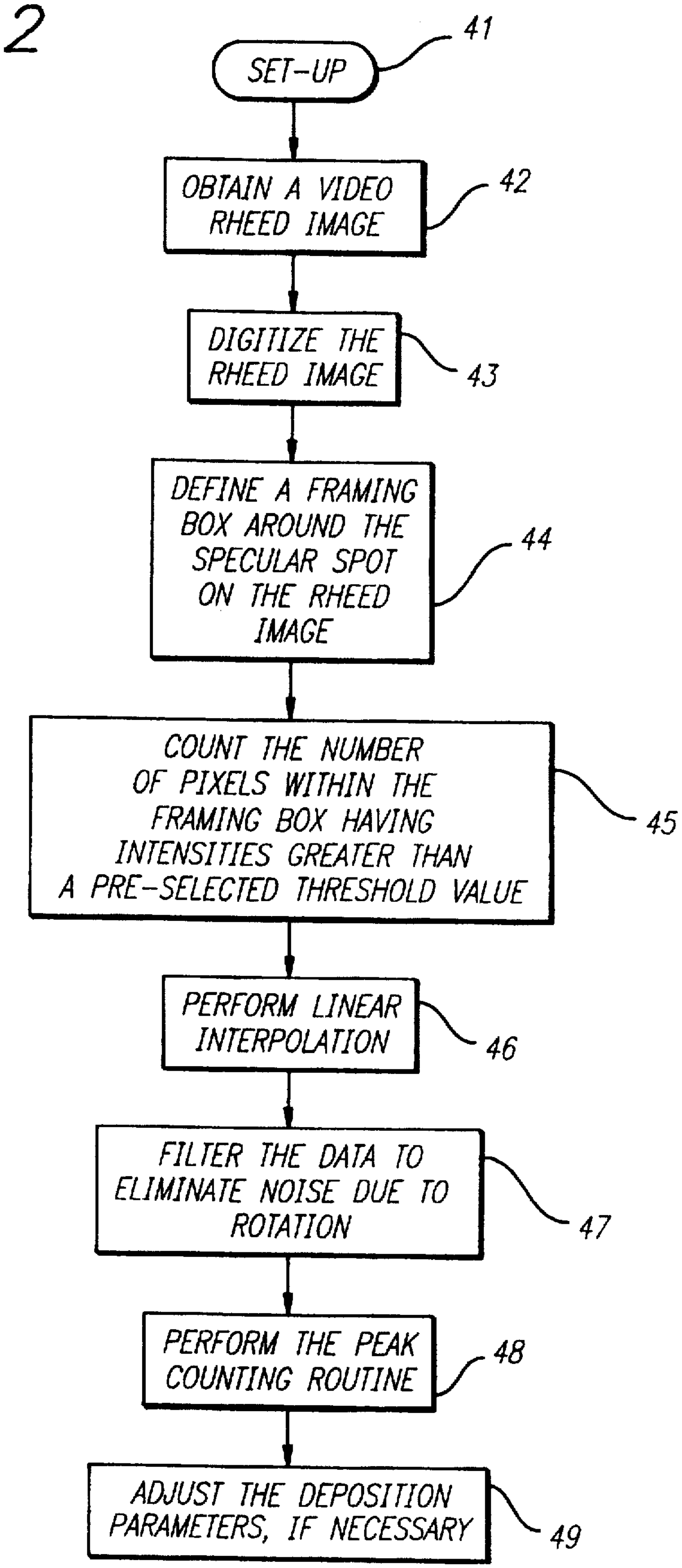
FIG. 2 is a flow chart for extracting growth rates from RHEED images and controlling an MBE deposition apparatus in near real-time.

Now referring to FIGS. 1 and 2, the present invention utilizes the following steps to extract the MBE growth rates from the RHEED images. At step 41, during the initial set-up, substrate 11 is placed on substrate holder 18 which may or may not be rotated by motor 21. An operator sets the frame grabbing rate using a graphical interface, starts the data acquisition program of the present invention, and opens the shutter(s) to allow appropriate gas element(s) to enter deposition chamber 30 to deposit material on substrate 11. At step 42, video camera 12 is directed at RHEED screen 19 to produce video frames of RHEED images. FIG. **11*a* shows a RHEED image having a specular RHEED spot 200. At step 43, computer 13 digitizes the RHEED images. At step 44, since the specular RHEED spot on the RHEED image occupies a relatively small percentage of the total image, computer 13 defines a framing box that completely surrounds the specular RHEED spot which is assumed to be the brightest diffraction spot. Because substrate 11 rotates, the specular RHEED spot moves within the video frame due to the changing diffraction conditions. To compensate this, computer 13 constantly re-enters the framing box. At step 45, computer 13** counts the number of pixels within the framing box whose intensities fall above an operator-selected threshold value. The net result produces a pixel count that corresponds to the size (or equivalently the intensity) of the specular RHEED spot for each successive video frame of the RHEED images.

Steps 42 through 45 are executed on each RHEED image sequentially in time so that steps 43 through 45 essentially do not contribute to the computational overhead; that is, as a video RHEED image is obtained (step 42), the RHEED image is digitized (step 43), a framing box is defined around the specular RHEED spot of the RHEED image (step 44) and the number of pixels within the framing box having intensities greater than a pre-selected threshold value is counted (step 45). While video camera 12 continuously produces video frames of RHEED images, steps 43 through 45 are performed continuously on each such RHEED image.

At step 46, after repeating steps 42 through 45 at least twice to obtain two data points, if the data points are not evenly spaced in time, linear interpolation is performed between the data points. From this linear interpolation, an evenly spaced (in time) series of measurements of the size of the specular RHEED spot can be obtained. These data points are represented as a discrete sample set $\{x_i, t_i\}$ where the time interval, $\Delta t = t_i - t_{i-1}$, is constant. The set $\{x_i, t_i\}$ is a sample of a continuous data x(t) that contains information about the actual material growth rate.

Figure 3:
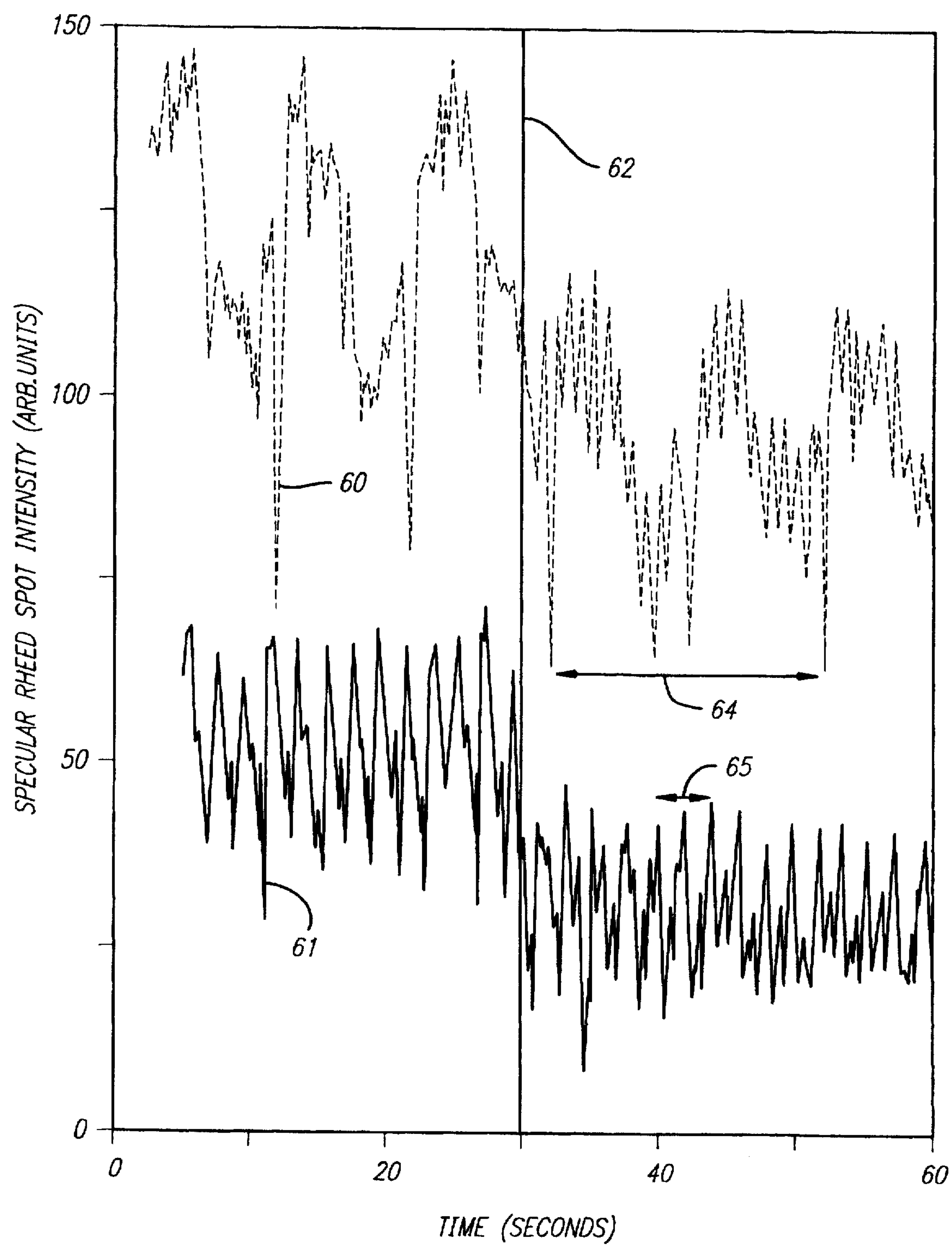
FIG. 3 shows a plot of the measured specular RHEED spot intensity versus time for two different rotation frequencies.

FIG. 3 shows the measured specular RHEED spot intensity (or size) versus time for two different rotation frequencies. The data have been vertically offset for clarity, with an upper dotted curve 60 corresponding to a rotation rate of approximately 3 rpm while a solid curve 61 corresponds to a rotation rate of approximately 15 rpm. A solid vertical line 62 marks the start of the epilayer growth, and the two horizontal lines 64 and 65 show the rotation period. Two important points are clearly demonstrated. First, there is an obvious change in the signal when the growth is started. Second, the large changes in the signal due solely to the rotation must be accounted for when trying to measure oscillations due to the growth of the epilayer.

Now referring back to FIG. 2, at step 47, the data points $\{x_i, t_i\}$ are filtered to remove noise in the data due to the rotation of substrate 11. As will be discussed later with respect to digital filtering techniques, in the preferred embodiment, step 47 is performed after at least 10 data points are obtained. In another embodiment, data points that are more or less than 10 can be used. For a stationary substrate, this specular RHEED spot size data points $\{x_i, t_i\}$ are closely correlated with the actual growth rate while for a rotating substrate, this data x(t) represents the growth rate modulated by the substrate rotation.

In general, it is possible to select growth rates that differ substantially in frequency from the rotation rate (e.g., a rotation rate of 5 revolutions/second for an expected growth rate of 1 monolayer/second) and to use digital filtering techniques to extract this growth rate component from the composite signal. By keeping only a small range of frequencies around the growth rate, the noise due to the substrate rotation is strongly suppressed. In the preferred embodiment, the present invention uses a frequency range of 0.8 to 1.2 monolayer per second for an expected 1 monolayer per second growth. It is assumed that the strongest component in this selected range represents the actual growth. This has been verified by comparing the growth rate extracted from a rotating substrate with that obtained from a stationary one under the same growth conditions.

Digital filtering techniques are used so that this growth information can be obtained in pseudo real-time. The time lag between the filter output $y_i$ and the leading edge of the data stream $x_i$ can be selectively controlled. In the preferred embodiment, a lag of ~0.3 seconds is used to obtain good results. To illustrate, consider the actual recursive digital filtering equation:

$$y_k = \sum_{n=0}^{L} b_n x_{k-n} - \sum_{n=1}^{L} a_n y_{k-n} \tag{1}$$

where $y_i$ depends on $\{x_k, \ldots, x_{k-L}\}$ as well as $\{y_{k-1}, \ldots, y_{k-L}\}$. Typically L is on the order of 10 while the stream of $x_i$'s is arriving at a rate of approximately 30 per second, thus producing 0.3 second lag. The selection of the $a_n$'s and $b_n$'s in equation (1) constitutes the filter design problem, and it is this selection that controls the passband or stop-band characteristics of the filter. This is a well studied problem and software is available off the shelf to accomplish the filter design. The filter design can be found in a book entitled "Signal Processing Algorithms in Fortran and C," by S. D. Stearns and R. A. David, PTR Prentis-Hall, Englewood Cliffs, N.J. (1993).

In the preferred embodiment, infinite impulse response filters having 5th order, 40 dB stop band rejection and 3 dB ripple are used. This form of digital filtering requires a relatively small number of coefficients, thus achieving the short lag time necessary to enable use of this technique as an active growth control feedback mechanism. The type of filter (whether it is Chebyshev type I or II or Butterworth or whether it is a bandpass or bandstop filter), the number and order of filter sections desired and the attenuation are all chosen by the operator. Once the operator has selected the filter characteristics, the $a_n$'s and $b_n$'s in equation (1) are calculated. This calculation typically requires less than one second of computation.

In the present invention, the filter characteristics are selected prior to step 41 by examining the Fourier power spectrum of the measured dynamic spot size during rotation without depositing materials on substrate 11 and by considering the expected growth rate. Although a hardware based approach can be used, as described by J. P. A. Van der Wagt and J. S. Harris at the North American Molecular-Beam Epitaxy Conference, Stanford, Calif., Sep. 13–15, 1993, a software based approach of the present invention is vastly superior in its flexibility since it allows the MBE operator to tailor the filter for a particular rotation and growth rate. In addition, with a sophisticated numerical filtering technique, the software approach is fast enough to allow real-time data collection.

Continuing to refer to FIG. 2, at step 48, to determine the growth rate, the peak counting routine of the present invention counts zero crossings of the numerical derivative of the filtered (or smoothed) signal. This is illustrated with reference to FIG. 4 that shows a measured specular RHEED spot intensity (or size) of rotating substrate 11 versus time.

In FIG. 4, while a dotted curve 70 is the raw data, a solid curve 71 is the data obtained after numerical filtering. Solid diamonds 74 superimposed on filtered data 71 mark the zero crossings ("oscillation peaks") of the numerical derivative of the filtered signal, as determined by the peak counting routine. The derivative is determined by taking the dot product between a vector of data points and a vector of appropriately chosen weights. Since this method only involves multiplication and addition, it is not computer intensive. The derivative is determined from five data points which typically introduces a delay of roughly 0.15 seconds into the peak counting routine. The computation itself is essentially instantaneous on the time scales of importance. The overall delay in the signal caused by the frame grabbing, filtering and peak counting is approximately 0.33 seconds. Because of this delay, the present invention monitors the growth rate in near real-time rather than in real-time. While this delay does not affect the growth rate fed into MBE control unit 20, it must be accounted for in applications where layer growth times are determined by counting monolayers as they are deposited.

To determine the growth rate, since each oscillation peak 74 in FIG. 4 corresponds to one monolayer, the computer program of the present invention records the times at which oscillation peaks 74 are identified, and computer screen 1010 displays the resulting growth rate in near real-time. For instance, in FIG. 4, since there are twenty one peaks in a twenty second period, the resulting growth rate is 1.05 monolayers per second.

Still referring to FIG. 4, a dotted vertical line 72 marks the time when the growth has started. As can be seen from the data, the computer program of the present invention can quite easily extract the growth oscillations from the filtered signal. The oscillations in filtered signal 71 prior to the commencement of the layer growth (a region 76) are due to Fourier components in the substrate rotation rate near the growth rate. These can be rejected (a) by having the computer program monitor the opening and closing of shutters 26 and 28 in MBE deposition apparatus 10, and only counting peaks during epilayer deposition or (b) by the operator signaling the start of growth to computer 13.

Referring back to FIG. 2, at step 49, after comparing the actual growth rate to the target growth rate, if the values are different, computer 13 sends the appropriate deposition parameters including, but not limited to, the substrate temperature and temperature of source cells 22 and 24 to MBE control unit 20.

While the present invention allows an operator to monitor the growth rate and control MBE deposition apparatus 10 in near real-time as discussed above, the growth rate obtained during the epilayer growth can be further refined using a post-growth analysis. Two types of post-growth analyses can be utilized: Fourier transforms and binning of the oscillation periods. Growth rates determined from stationary substrates are not affected by the post growth analysis. The precision of growth rates extracted from rotating substrates increases from approximately 2% to better than 1% with the post-growth Fourier transform analysis similar to that disclosed by Turner.

During binning of the oscillation periods, the computer program of the present invention searches through the list of oscillation peak positions, removes any extraneous peaks and displays the final, average growth rate along with the number of peaks used to determine it. This allows the operator to assign a level of certainty to the measurement. Both the raw data and average measured growth rate can be saved to a disk.

A few comments are noted below for obtaining accurate growth rates. First, the slower the rotation rate is, the more accurate the growth rates become. In practice, the minimum rotation rate is determined by the requirement that substrate 11 must complete several rotations during the growth of the thinnest epilayer of interest, to ensure good thickness uniformity. Second, in order to optimize the extraction of growth rates, it is necessary to examine the Fourier spectra of the data during rotation of the substrate prior to depositing materials on substrate 11. This allows the operator to choose a rotation rate that interferes the least with the expected oscillation signal due to growth. The optimal rotation rate must be determined for each growth rate of interest and is highly system dependent. In contrast, very little variation is seen between different substrates, and the optimal rotation rate does not change after system vents.

Figure 5:
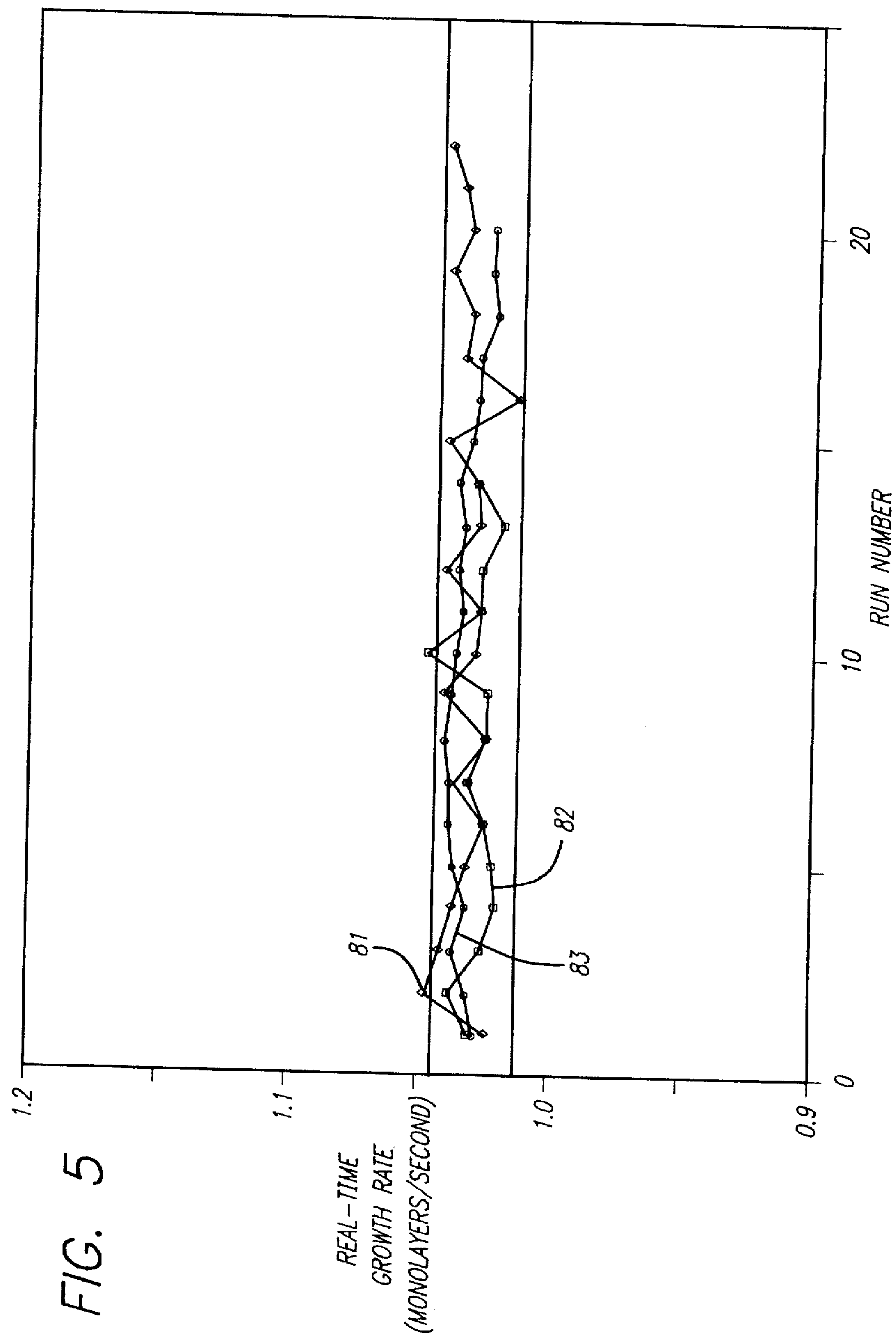
FIG. 5 shows a plot of the measured growth rates for three different rotation frequencies and for various growth runs.

To demonstrate the efficacy of the present invention, the results of a series of experiments where growth rates were measured on rotating substrate 11 while depositing GaAs are plotted in FIG. 5. The growth rates were measured consecutively while the temperature of the Ga source cell was held constant. In FIG. 5, a curve 81 with diamonds, a curve 82 with squares and a curve 83 with circles are the measured near real-time growth rates for substrates rotating at 3, 10 and 15 rpm, respectively. As the data in FIG. 5 shows, the precision of the measurement is approximately ±2% over almost 60 separate measurements. The growth rates displayed are the growth rates determined by near real-time extraction of RHEED oscillations due to the epilayer growth and are displayed in near real-time. Since the RHEED images can be analyzed in near real-time, the thickness of very thin layers can be actively controlled. This should lead to improvements in run to run uniformity.

OXIDE DESORPTION

A method of extracting and processing the RHEED images similar to the one described above can be used to monitor oxide desorption in near real-time. The onset of the oxide desorption point is monitored so that the epilayer growth can start at the onset since the surface of substrate 11 becomes free of oxide at the onset of the oxide desorption point.

Figure 6:
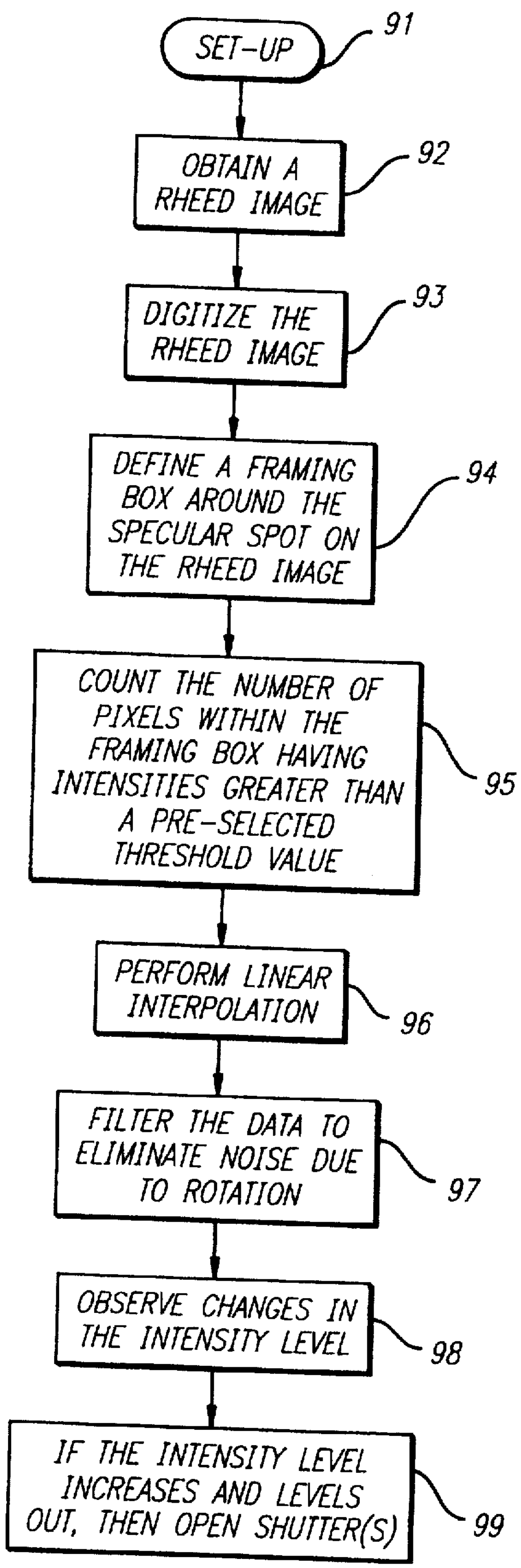
FIG. 6 is a flow chart for monitoring the oxide desorption point and controlling the MBE deposition apparatus in near real-time.

FIG. 6 describes the steps of monitoring the oxide desorption point. At step 91, substrate 11 is placed on substrate holder 18 and may or may not be rotated. An operator sets the frame grabbing rate using a graphical interface and starts the data acquisition program of the present invention. Shutters 26 and 28 are kept closed so that no growth occurs. A video camera 12 is directed at RHEED screen 19 to produce video frames of the RHEED images. Steps 92 through 97 are substantially those of steps 42 through 47 in FIG. 2. At step 92, a video RHEED image is obtained. At step 93, computer 13 digitizes the RHEED image. At step 94, computer 13 defines a framing box that completely surrounds the specular RHEED spot of the RHEED image which should be the brightest diffraction spot. If substrate 11 rotates, computer 13 constantly re-enters the framing box to compensate the rotation. At step 95, computer 13 counts the number of pixels within the framing box whose intensities fall above a pre-selected threshold. Steps 92 through 95 are repeated continuously to produce a series of pixel counts that corresponds to the size of the specular RHEED spot for each successive video frame of the RHEED images.

At step 96, if the stream of pixel counts are not evenly spaced in time, linear interpolation is performed between the data points. At step 97, the data points are filtered to remove noise in the data due to the rotation of substrate 11, as described earlier with reference to step 47 in FIG. 2.

FIGS. *7a* and *7b* show the changes in the specular RHEED spot intensity as oxide is removed from substrate 11. FIG. *7a* presents the changes in the specular RHEED spot intensity for stationary substrates. A curve 101 is for a GaAs substrate, and a curve 102 is for a GaSb substrate. In region 105, the surface of substrate 11 contains oxide while in regions 106, the surface of substrate 11 is free of oxide as determined by other methods.

FIG. *7b* presents the changes in the specular RHEED spot intensity for rotating substrates. A curve 103 is for a GaAs substrate, and a curve 104 is for a GaSb substrate. In region 107, the surface of substrate 11 contains oxide while in region 108, the surface of substrate 11 is free of oxide. Thus, by monitoring specular RHEED spot intensity with time, the present invention can determine the onset of the oxide desorption point, identify when the oxide is gone, and start the epilayer growth process by opening shutters 26 and 28. As shown in FIGS. *7a* and *7b*, the present invention can be utilized for both stationary and rotating substrates. It should be noted that the present invention does not require substrate alignments to observe oxide desorption.

Referring back to FIG. 6, at step 98, the computer program observes the changes in the intensity level. At step 99, if the intensity level increases and levels out (e.g., region 106 or 108), then computer 13 sends the appropriate signals to MBE control unit 20 to open the shutter(s) and/or adjust the substrate temperature.

SURFACE RECONSTRUCTION

The present invention can also extract real-time information regarding the surface reconstruction during an MBE process. Observation of the surface reconstruction is useful in determining whether the ratio of two or more elements that are being deposited on substrate 11 is proper. Referring to FIG. *11a*, the surface reconstruction process is observed by monitoring the number of diffraction lines such as 202, 204, 208 and 210 and the spacing between the diffraction lines on a RHEED image.

Figure 8:
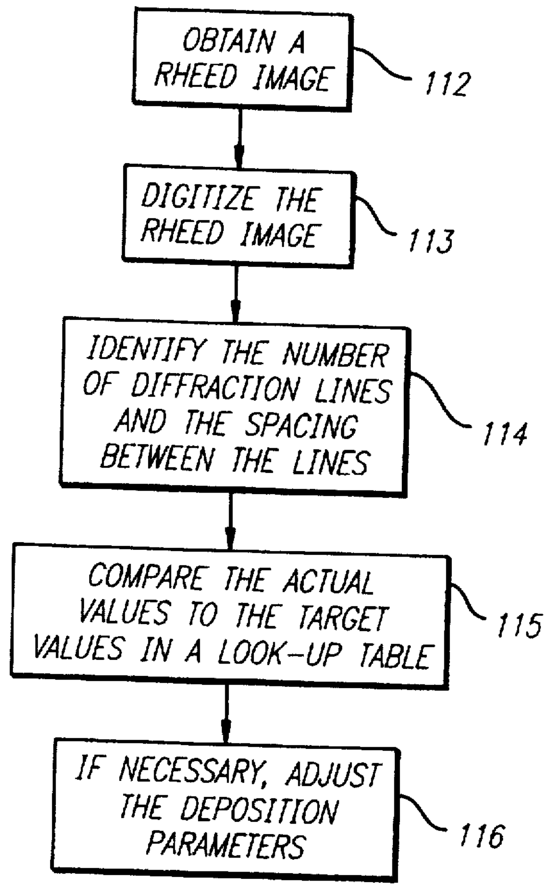
FIG. 8 is a flow chart for monitoring the surface reconstruction process and controlling the MBE deposition apparatus substantially in real-time.

FIG. 8 illustrates the steps of monitoring the surface reconstruction process. While materials are being deposited on rotating substrate 11, video camera 12 is directed at RHEED screen 19 to produce video frames of the RHEED images. Steps 112 and 113 and substantially those of steps 42 and 43 in FIG. 2. At step 112, a video RHEED image is obtained. At step 113, computer 13 digitizes the RHEED images. At step 114, the number of the diffraction lines and the spacing between the diffraction lines on the RHEED image are identified. At step 115, the actual number of the diffraction lines and the spacing are compared to the target values stored in a look-up table. At step 116, if the measured values are different from the target values, then computer 13 sends the appropriate signals to MBE control unit 20 to change the deposition parameters such as the substrate temperature and temperature of source cells 22 and 24 to adjust the atomic flux ratio (e.g., group V and group III flux ratio).

The amount of computation time required to determine the atomic flux ratio is much shorter than the amount of time required to determine the growth rate because steps 44 through 48 in FIG. 2 are not necessary in determining the atomic flux ratio, and steps 114 and 115 in FIG. 8 require only minimum computation. Thus, monitoring the surface reconstruction and controlling MBE deposition apparatus 10 can be accomplished substantially in real-time.

ANION EXCHANGE

The present invention can monitor the anion surface exchange reactions (e.g., an exchange reaction between Sb and As when Sb is introduced to an InAs surface) and control MBE deposition apparatus 10 accordingly in near real-time. Monitoring the anion surface exchange reactions is important in growing epilayers with multiple materials (e.g., InAs/AlSb/GaSb, InAs/GaSb and InAs/GaInSb) to ensure minimum anion cross incorporation and controllable interface composition.

A method of monitoring the anion surface exchange reactions is described below in detail with respect to InAs/AlSb layers. It will be appreciated that the method described below is not limited to the InAs/AlSb system and can be applied to layers having other materials. In the InAs/AlSb system, to minimize anion cross incorporation and to provide abrupt, composition controllable interfaces, the present invention first introduces Sb atoms (without Al atoms) to the InAs surface so that As atoms at the surface can be exchanged with Sb atoms, forming Sb—In chemical bonds. Once Sb—In bonds are made, both Al and Sb atoms are deposited on the InAs surface. Forming Sb—In chemical bonds reduces anion cross incorporation across the interface of InAs and AlSb and provides controllable interface composition.

When a new material is introduced to substrate 11, because of the reaction between the new material and the old material on substrate 11, the specular RHEED spot intensity changes. FIG. 9 presents the changes in the specular RHEED spot intensity versus time when a substrate with an InAs surface layer or an InAs substrate is exposed to Sb atoms which are the new material in this instance. The dashed vertical line 136 denotes when the Sb atoms are first introduced to the InAs surface. As shown in FIG. 9, the specular RHEED spot intensity decreases at first (region 132), and then it recovers to the original level A in region 134. Once the specular RHEED spot intensity reaches the original level A, the InAs surface is ready for deposition of both Sb and Al atoms. Thus, by monitoring the specular RHEED spot intensity, one can determine when to start growing a new layer with all of its species.

The preferred method of monitoring the anion surface exchange reactions and controlling MBE deposition apparatus 10 in near real-time is illustrated in FIG. 10. At step 150, while a substrate having an InAs surface (or a substrate that is entirely composed of InAs) rotates, the shutter for Sb atoms is opened to introduce the Sb atoms to the InAs surface. Steps 152 through 162 are identical to steps 42 through 47 in FIG. 2, and thus the descriptions are not repeated here. At step 164, when the specular RHEED spot intensity becomes substantially that of the original level A, computer 13 signals MBE control unit 20 to open the shutter for Al atoms so that both Sb and Al atoms can be deposited on the substrate. Although FIG. 10 illustrates depositing AlSb on InAs, the method described above can be applied to other materials as well.

SMOOTHNESS OF THE SURFACE

The present invention can also monitor substantially in real-time the smoothness of the surface of substrate 11 and adjust the deposition parameters if the surface is found to be rough. Having a smooth growth surface is critical to forming sharp, high quality interfaces. The present invention monitors and analyzes RHEED images to provide smooth surfaces having greater reproducibility and better device performance.

Figure 11A:
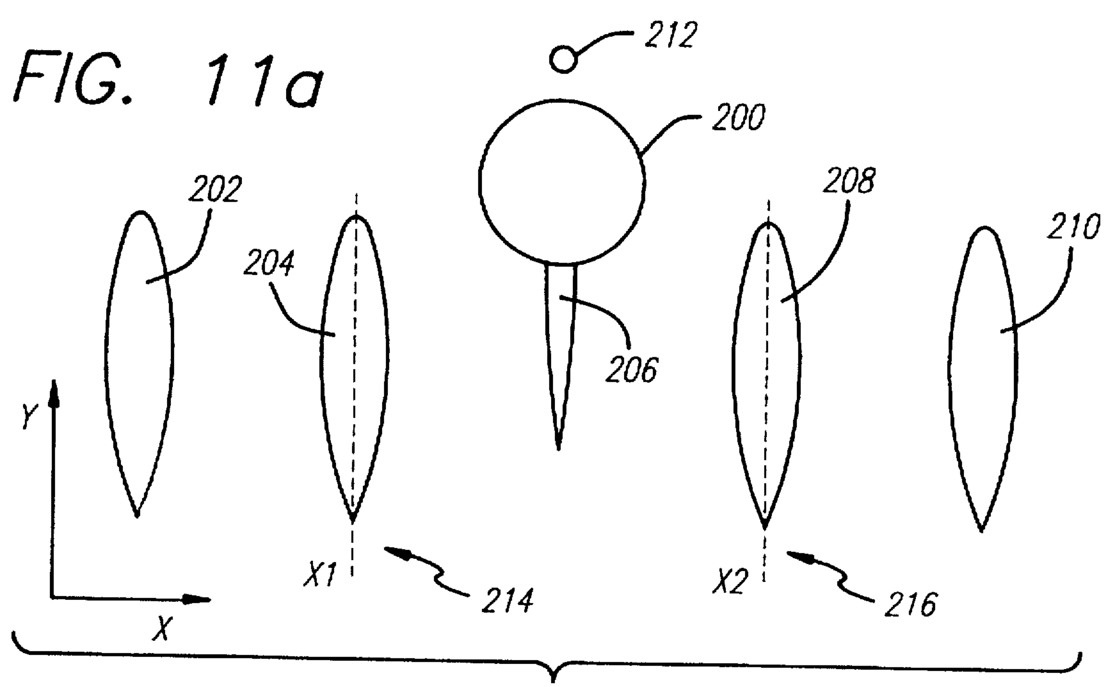
FIG. 11*a* is a RHEED image of a smooth surface.
Figure 11B:
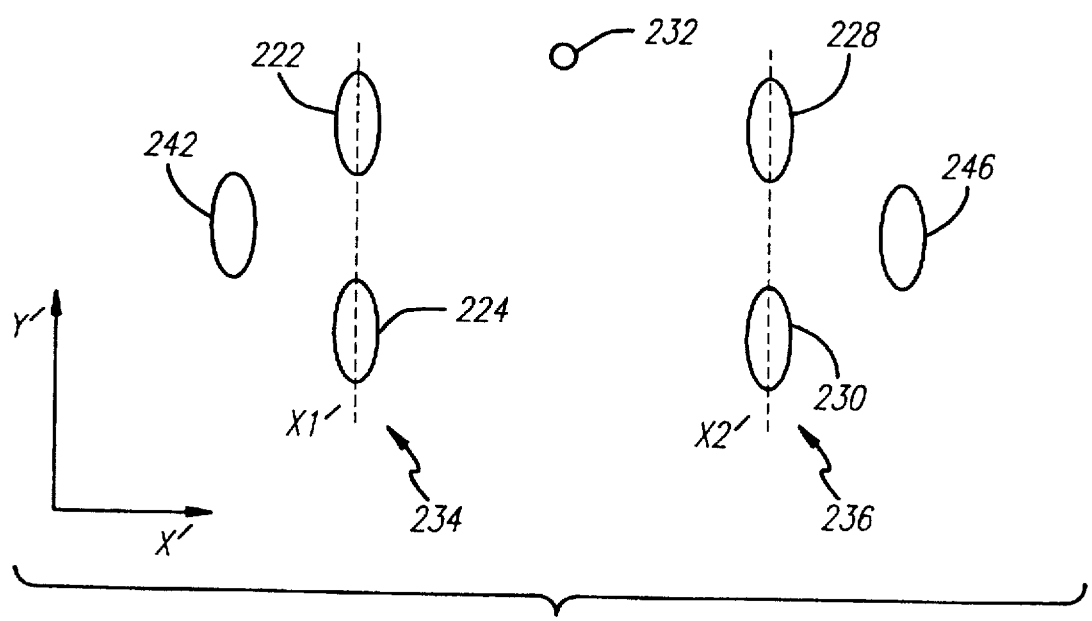
FIG. 11*b* is a RHEED image of a rough surface.

The smoothness of the surface is monitored by observing the RHEED images according to the preferred embodiment of the present invention. FIG. 11*a* is a RHEED image of a smooth surface. The smooth surface provides streaky RHEED diffraction lines such as lines 202, 204, 206, 208 and 210. In FIG. 11*a*, the RHEED image shows a specular RHEED spot 200 which is the brightest spot, a reference spot 212, integral order diffraction lines (or steaks) 202, 204, 206, 208 and 210. FIG. 11*b* shows a RHEED image of a rough surface. The rough surface provides a spotty RHEED diffraction pattern including spots 222, 224, 228 and 230. In FIG. 11*b*, the RHEED image shows a reference spot 232 and integral order diffraction spots 222, 224, 228, 230, 242 and 246.

The reference spot (212 in FIG. 11*a* or 232 in FIG. 11*b*) is obtained from the electrons that travel across the surface of a substrate but do not touch the surface, and it is used to locate at least one of the integral order streaks (202, 204, 208 or 230) or one of the integral order spots (222, 224, 228 or 230). Once a streak or spot is located, the positions of the streaks or spots at other horizontal locations are readily known since the spacing between the steaks or between the spots is inversely proportional to the crystal lattice constant.

FIG. 12 shows a flow chart for monitoring the smoothness of the surface and controlling MBE deposition apparatus 10 substantially in real-time. At step 250, while substrate 11 rotates having at least one material deposited or having no materials deposited, video camera 12 is directed at RHEED screen 19 to produce video frames of the RHEED images. At step 252, a RHEED image is obtained. At step 254, the RHEED image is digitized. At step 256, integral order diffraction lines 204 and 208 (or integral order diffraction spots if the surface is not smooth) are located, and the RHEED intensity levels of the pixels along the diffraction lines (or spots) are obtained. At step 258, the RHEED intensity levels that fall below an operator-specified threshold value are set to zero.

Figure 13A:
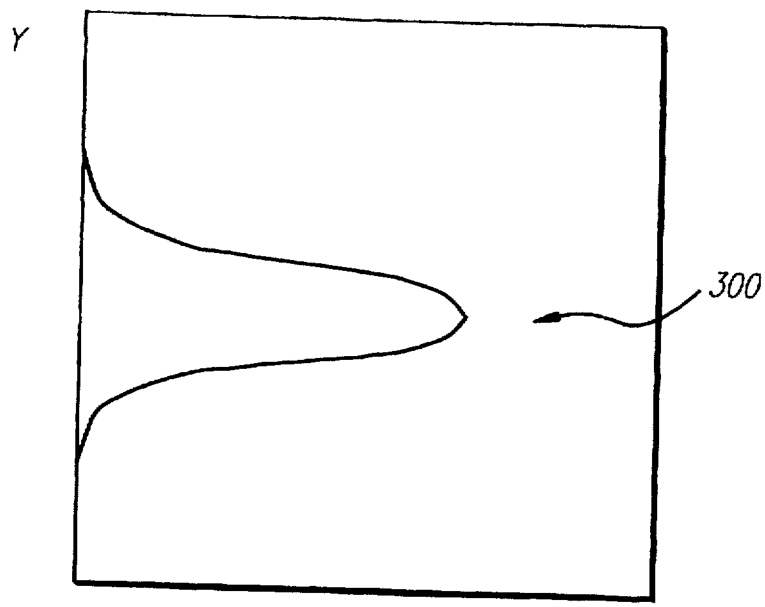
FIG. 13*a* shows the measured RHEED intensity along a diffraction line obtained from a smooth surface.
Figure 13B:
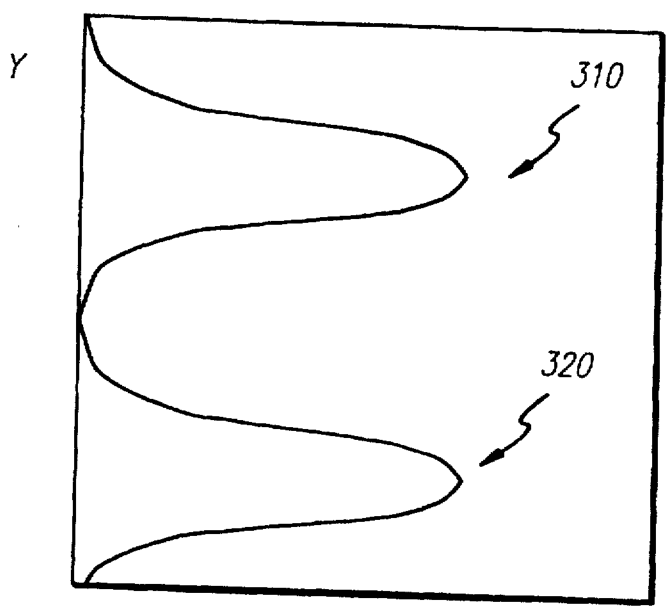
FIG. 13*b* shows the measured RHEED intensity along diffraction spots obtained from a rough surface.

FIG. 13*a* shows the measured RHEED intensity levels along a vertical slice 214 located at point x1 in FIG. 11*a* after the thresholding step 254. Because a streaky diffraction line such as 202 has a single intensity maximum, when the RHEED intensity levels along a diffraction line are plotted against the vertical position, there is only one intensity maximum 300 as shown in FIG. 13*a*. FIG. 13*b* shows the measured RHEED intensity levels along a vertical slice 234 located at point x1' in FIG. 11*b*. While each of the streaky diffraction lines in FIG. 11*a* produces one intensity maximum, a spotty RHEED pattern such as the one shown in FIG. 11*b* produces multiple intensity maxima along each vertical slice. In this instance, vertical slice 234 produces two intensity maxima 310 and 320 as shown in FIG. 13*b*.

Referring back to FIG. 12, at step 260, if there are multiple maxima, then computer 13 sends the appropriate signals to MBE control unit 20 to adjust the growth condition. If only a signal intensity maximum is found, then the surface is smooth, and thus the growth condition is not adjusted. It should be noted that monitoring the smoothness of the surface requires much less time in computation than extracting the growth rate since steps 44 through 48 in FIG. 2 are not required. Steps 256 through 260 in FIG. 12 are simple in computation. Thus, monitoring the smoothness of the surface and controlling MBE deposition apparatus 10 can be accomplished substantially in real-time.

In the preferred embodiment, the present invention monitors two vertical slices such as slices 214 and 216 or slices 234 and 236 to ensure accuracy. Because (i) the reference spot such as spot 212 or 232 can be easily identified, (ii) the horizontal spacing between reference spot 212 and streak 204 or reference spot 232 and spot 222 are predetermined and (iii) the horizontal spacing between the streaks or between the spots is the crystal lattice constant, the locations of the streaks and spots can be accurately determined. In another embodiment, only one vertical slice per RHEED image or more than two slices per RHEED image may be monitored.

EXTRACTION OF MULTIPLE CHARACTERISTICS USING ONE COMPUTER PROGRAM

The present invention can extract the deposition characteristics discussed above using one computer program. Although there are many different implementations, FIG. 14 illustrates one flow chart for extracting various deposition and pre-deposition characteristics and for controlling MBE deposition apparatus 10 accordingly. At step 500, substrate 11 is placed on substrate holder 18 and rotates. At step 502, if the oxide desorption point needs to be extracted to determine when the surface of substrate 11 becomes free of oxide, then the present invention executes step 504 which performs steps 92 through 99 in FIG. 6, and upon completion of step 99, step 508 is executed. If, on the other hand, the oxide desorption point does not need to be determined, step 508 is executed. At step 508, if the anion surface exchange reaction is to be determined, then steps 150 through 164 in FIG. 10 are performed as shown in step 510, and upon completion of step 164, step 512 is executed. If the extraction of the anion surface exchange reaction is not needed, then step 512 is executed without performing step 510.

Continuing to refer to FIG. 14, at step 512, if information regarding at least one of the growth rate, surface reconstruction or smoothness of the surface needs to be obtained, then at step 513, shutter(s) may need to be opened if they are not yet opened. Then steps 514 and 516 which are identical to steps 42 and 43 in FIG. 2 are performed. Video images are continuously obtained and digitized in steps 514 and 516 to supply the necessary data to steps 518, 520 and/or 522. If the growth rate is to be determined, then the present invention executes step 518 that performs steps 44 through 49 in FIG. 2. If the surface reconstruction information is needed, then the present invention executes step 520 that performs steps 114 through 116 in FIG. 8. If the quality of the surface is to be determined, then step 522 including steps 256 through 260 of FIG. 12 is executed. Upon completion of steps 518, 520 and 522, the present invention executes step 524. At step 512, if no information is desired regarding the growth rate, surface reconstruction or smoothness of the surface, then step 512 is directly followed by step 524.

Still referring to FIG. 14, if, at step 524, a new material or new materials are to be deposited, then step 524 continues to step 502. Otherwise, the computer program of the present invention ends at step 526.

While the present invention has been particularly described with reference to various figures, it should be understood that the figures are for illustration only and should not be taken as limiting the scope of the invention. Many changes and modifications may be made to the invention, by one having ordinary skill in the art, without departing from the spirit and scope of the invention as disclosed herein. Instead of using RHEED patterns, other light scattering or reflected patterns generated by electron beams, photon beams, ion beams or X-ray beams may be used. Also, various deposition materials and substrates including, but not limited to, metals, semiconductors, insulators, and superconductors can be utilized. Furthermore, the deposition chamber may be a vapor-phase or molecular beam deposition chamber.

A computer program source code shown in Appendix A has implemented the method of near real-time extraction of growth rates from rotating substrates during molecular beam epitaxy. The computer program in Appendix A monitors the digitized RHEED image stored in the frame grabber memory 15. In the current implementation, information extracted from the RHEED image is not used to control crystal growth. Using a graphical interface, the operator selects the rate at which the video card digitizes RHEED images and can adjust the contrast and brightness of the digitized image through the software programmable analog to digital converters on the frame grabber card. Once the video digitization parameters have been set, the operator can choose to monitor the RHEED image for oxide desorption, growth rates, anion surface exchange reaction or intensity versus position profiles.

Figure 7A:
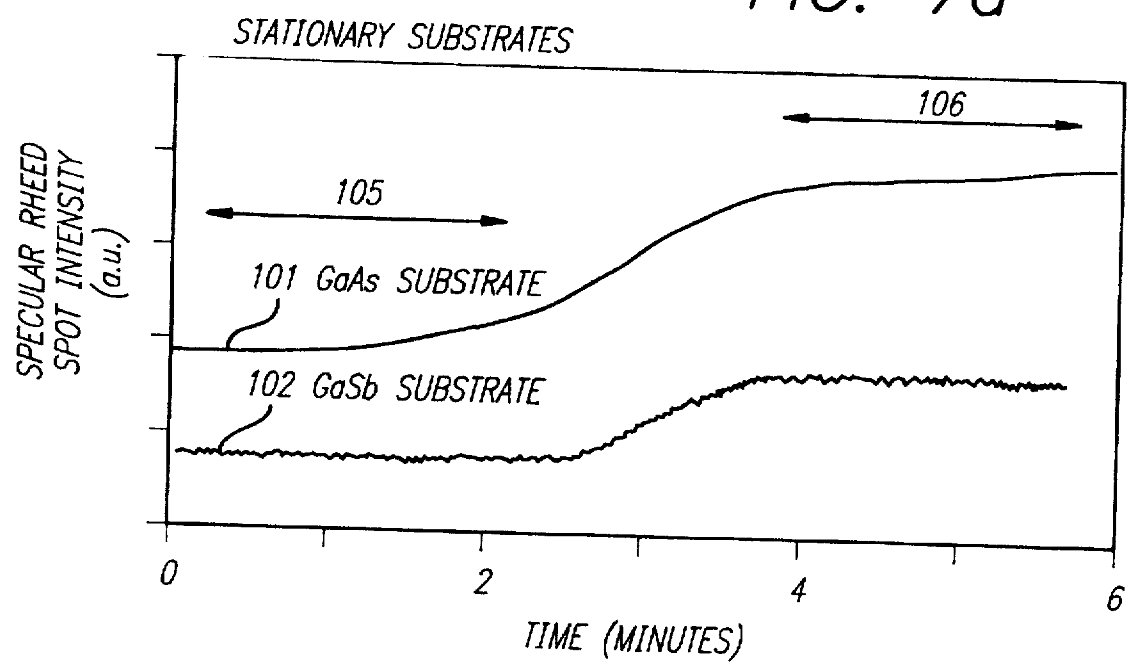
FIG. 7*a* shows a plot of the measured specular RHEED spot intensity versus time while no material is deposited on a stationary substrate to monitor the oxide desorption point.
Figure 7B:
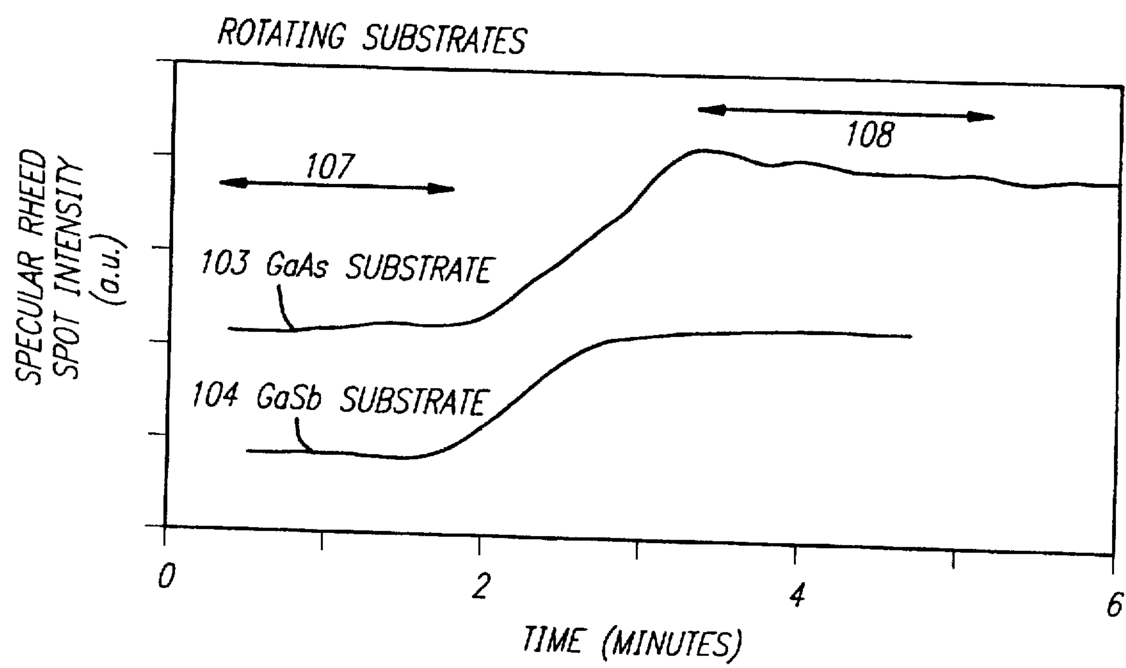
FIG. 7*b* shows a plot of the measured specular RHEED spot intensity versus time while no material is deposited on a rotating substrate to monitor the oxide desorption point.

For oxide desorption, the computer program shown in Appendix A locates and monitors the brightest, or equivalently largest, diffraction spot. The operator can have the program display the size or intensity of the spot on display 1010 as the program determines it for each digitized frame. The operator chooses whether or not to digitally filter the intensity or size profile, as well as the filter characteristics. The operator chooses whether or not to write the data to a disk. The result is the data shown in FIGS. 7a and 7b. The program signals the operator on the video terminal when the oxide has desorbed. This is determined by waiting for the intensity or size of the monitored diffraction spot to stabilize.

For growth rate measurements, the program in Appendix A locates and monitors the brightest, or equivalently largest, diffraction spot. The operator chooses whether or not to digitally filter the intensity or size profile, as well as the filter characteristics. Digital filtering is only needed if the substrate is rotating. The operator can choose to write either the raw or filtered data, or both to a disk. The resulting data is shown in FIGS. 3 and 4. The operator can choose to have the computer count oscillation peaks in the data. If the computer counts oscillation peaks, the growth rate is displayed on display 1010. The displayed growth rate is updated every time another oscillation is determined to have occurred by the program. When the operator stops the program from acquiring data, the periods of all oscillation peaks are examined and extraneous data points are excluded. The newly calculated average growth rate is displayed on display 1010 along with the number of oscillation periods used to determine it. The average growth rate can be written to a disk, resulting in the data shown in FIG. 5.

For surface anion exchange measurements, the program in Appendix A locates and monitors the brightest, or equivalently largest, diffraction spot. The operator chooses whether or not to digitally filter the intensity or size profile, as well as the filter characteristics. The resulting size or intensity information is displayed on display 1010 as the program determines it for each digitized frame. The data can be written to a disk.

If instructed by the operator, the program can also extract an intensity profile from the digitized image. The operator uses a graphical interface to select a line of pixels in the video image. The line can be any length, as long as it is smaller than the image, and can be horizontal, vertical or any angle in between. The resulting intensity versus position profile is displayed on display 1010. The program can write the profile determined from each digitized image to a disk. These intensity versus position profiles as a function of time can then be fed into separate programs which can determine either the surface reconstruction or surface smoothness. There is no fundamental reason why these surface reconstruction and surface smoothness recognition programs could not be incorporated into the current implementation of the program as shown in Appendix A.

08/365830

Appendix A

Makefile 1

```
# Makefile for xvid
#
.KEEP_STATE:
 PROGRAM = xvid
debug := CFLAGS += -g
optimise := CFLAGS += -O

CPPFLAGS += -I$(GUIDEHOME)/include -I$(OPENWINHOME)/include -I../include -DMAIN
LDFLAGS += -L$(GUIDEHOME)/lib -L$(OPENWINHOME)/lib
LDLIBS += -lguide -lguidexv -lxview -lolgx -lX11 -lm

SRCS = nrutil.c xvid_colors.c xvid_ui.c low_level.c xvid_xwindows.c s2200_lib.c xvid_aut
o.c xvid_popup.c xvid.c
OBJS = $(SRCS:.c=.o)

all debug optimise : $(PROGRAM)

$(PROGRAM): $(OBJS)
        gcc -g -o $(PROGRAM) $(OBJS) $(LDFLAGS) $(LDLIBS)

dbxtool: debug
        $(OPENWINHOME)/bin/xview/dbxtool $(PROGRAM)

dbx:    debug
        dbx $(PROGRAM)

clean:
        rm -f $(OBJS) $(PROGRAM)
```

xvid.c 1

```
#include <stdlib.h>
#include <stdio.h>
#include <xview/xview.h>
#include <xview/panel.h>
#include <xview/notice.h>
#include <xview/openmenu.h>
#include <xview/cms.h>
#include <xview/canvas.h>
#include <xview/xv xrect.h>
#include <X11/Xlib.h>
#include <X11/X.h>

#include "xvid_includes.h"
#include "xvid_globals.c"
#include "globals.c"
#include "s2200_lib.h"

void reset_everything();
void make_x_image_structures();
void reset_board();
void update_full_video();
void update_slice();

Notify_value update();

void
main(argc, argv)
        int             argc;
        char            **argv;
{
        s2200_map_devices(); /* map board address into process space */
        s2200_flush_vcon();
        s2200_init_composite();
        s2200_select_svideo_input();

        xv_init(XV_INIT_ARGC_PTR_ARGV, &argc, argv, 0);
        INSTANCE = xv_unique_key();

        xvid_basewin  = xvid_basewin_objects_initialize(NULL, NULL);
        xvid_rheed_slice = xvid_rheed_slice_objects_initialize(NULL, xvid_basewin->basew
in);
        xvid_slice_popup = xvid_slice_popup_objects_initialize(NULL, xvid_basewin->basew
in);
        xvid_auto_popup = xvid_auto_popup_objects_initialize(NULL, xvid_basewin->basewin
);
        xvid_full_video = xvid_full_video_objects_initialize(NULL, xvid_basewin->basewin
);

        reset_everything();
        make_x_image_structures();

        status.slice_line = 0;
        status.start_slice = 0;
        status.end_slice = status.full_width;

        printf("width: %d, height: %d\n", status.full_width, status.full_height);

        xv_main_loop(xvid_basewin->basewin);
        exit(0);
}

/*
 * Notify callback function for 'live_button'.
 */
void
live_notify(item, event)
        Panel_item      item;
        Event           *event;
{
        printf("live_button\n");
}

void
fit_notify(item, event)
        Panel_item      item;
        Event           *event;
{
        printf("fit_button\n");
}

void
slice_data_write_notify(item, event)
        Panel_item      item;
        Event           *event;
{
        char    fn1[255], *fname;
        int     i;

        for(i=0; i<641; i++)
                inten[i] = 0.0;

        DUMP = 20;
        fname = (char *)xv_get(xvid_slice_popup->slice_write_textfield,PANEL_VALUE);
                sprintf(fn1, "%s.d", fname);
        fp2 = fopen(fn1,"w");
        fprintf(fp2,"\n");

}

void
fit_write_notify(item, event)
        Panel_item      item;
        Event           *event;
{
        printf("fit_write_button\n");
}

void
width_notify(item, event)
        Panel_item      item;
        Event           *event;
{
        struct timeval  tp;
        struct timezone tzp;
        char    fn1[255], *fname;

        GETWIDTH = 1;
        XClearWindow(dpy, xwin1_id);
        fname = (char *)xv_get(xvid_slice_popup->slice_write_textfield,PANEL_VALUE);
        if (INTEN)
                sprintf(fn1, "%s.slice.inten", fname);
        else
                sprintf(fn1, "%s.slice.width", fname);
        fp1 = fopen(fn1,"w");
        fprintf(fp1,"\n");
        Colnum =1;
        gettimeofday(&tp, &tzp);
```

xvid.c 2

```
        InitialTime = tp.tv_sec;
}

void
stop_notify(item, event)
        Panel_item      item;
        Event           *event;
{
        xv_set(xvid_rheed_slice->slice_message, PANEL_LABEL_STRING, "", NULL);
        GETWIDTH = 0;
        fclose(fpl);
}

void
quit_notify(item, event)
        Panel_item      item;
        Event           *event;
{
        printf("quit_button\n");
}

void
repaint_pattern(canvas, paint_window, display, xid, rects)
        Canvas          canvas;
        Xv_window       paint_window;
        Display         *display;
        Window          xid;
        Xv_xrectlist    *rects;
{
        xwin2_id = xid;
        XPutImage(dpy, xwin2_id, gc, x_image_green, 0,0,0,0, status.
                image_width, status.image_height);
        XDrawLine(dpy,xwin2_id,gc,(status.start_slice)/2,(status.slice_line)/1,
(status.end_slice)/2,(status.slice_line)/1);
}

void
repaint_slice(canvas, paint_window, display, xid, rects)
        Canvas          canvas;
        Xv_window       paint_window;
        Display         *display;
        Window          xid;
        Xv_xrectlist    *rects;
{
    register ui32 *vram_ptr;
    register int width = status.image_width;

    int i=0;
    int y1, y2;

    xwin1_id = xid;
    vram_ptr = status.slice_line * status.full_width + (ui32*) vram;

    XSetForeground(dpy, gc, 1);
     for(i=0; i < (status.image_width-1); i++)
     {
        y1 = (char) rt_hash_to_pixel[((ui8) *vram_ptr)>>1];
        y2 = (char) rt_hash_to_pixel[((ui8) *(vram_ptr+2))>>1];
        y1 = ((y1<0)?128:y1);
        y2 = ((y2<0)?128:y2);

        XDrawLine(display,xid,gc,i,y1,i+1,y2);
        vram_ptr += 2;
     }
}

void
set_capture_rate(item, value, event)
        Panel_item      item;
        int             value;
        Event           *event;
{
        xvid_basewin_objects     *ip = (xvid_basewin_objects *) xv_get(item, XV_KEY_DATA
, INSTANCE);


  if (value == 1) {
        timer.it_value.tv_usec = 999;
        timer.it_interval.tv_usec = 999;
  }
  else if (value > 1)
  {
     status.rate = value;
     timer.it_value.tv_usec = (1000/value) * 1000;
     timer.it_interval.tv_usec = (1000/value) * 1000;
     notify_set_itimer_func( (Frame) xvid_basewin->basewin, update,
         ITIMER_REAL, &timer, NULL);
  }
  else
     notify_set_itimer_func( (Frame) xvid_basewin->basewin,
NOTIFY_FUNC_NULL, ITIMER_REAL, NULL, NULL);
}

int set_slice_line(item, value, event)
Panel_item      item;
int             value;
Event           *event;
{
        status.slice_line = value;
}

int set_start_slice(item, value, event)
Panel_item      item;
int             value;
Event           *event;
{
       if(value < status.end_slice)
                status.start_slice = value;
        else
                status.start_slice = status.end_slice - 1;
}

int set_end_slice(item, value, event)
Panel_item      item;
int             value;
Event           *event;
{
       if(value > status.start_slice)
                status.end_slice = value;
        else
                status.end_slice = status.start_slice + 1;
}

int set_white(item, value, event)
Panel_item      item;
int             value;
Event           *event;
{
```

xvid.c

3

```
    if (value > bt253->black)
        bt253->white = value;
    else {
        bt253->white = ((bt253->black)+1);
        xv_set(xvid_basewin->white_slider,
                PANEL_VALUE,    bt253->white,
                NULL);
    }
}

int set_black(item, value, event)
Panel_item      item;
int             value;
Event           *event;
{
    if (value < bt253->white)
        bt253->black = value;
    else {
        bt253->black = ((bt253->white)-1);
        xv_set(xvid_basewin->black_slider,
                PANEL_VALUE,    bt253->black,
                NULL);
    }
}

int set_clamp(item, value, event)
Panel_item      item;
int             value;
Event           *event;
{
    if (value < bt253->white)
        bt253->clamp = value;
    else {
        bt253->clamp = ((bt253->white)-1);
        xv_set(xvid_basewin->clamp_slider,
                PANEL_VALUE,    bt253->clamp,
                NULL);
    }
}

int update_video_notify(item, value, event)
Panel_item      item;
int             value;
Event           *event;
{
        PAINTVIDEO = 0;
        if (value == 0 )
                PAINTVIDEO = 1;
}

int count_choice_notify(item, value, event)
Panel_item      item;
int             value;
Event           *event;
{
        COUNT = 0;
        if (value == 0 )
                COUNT = 1;
}

int meas_choice_notify(item, value, event)
Panel_item      item;
int             value;
Event           *event;
{
        INTEN = 0;
        if (value ==0 )
                INTEN = 1;
}

int rot_choice_notify(item, value, event)
Panel_item      item;
int             value;
Event           *event;
{
        ROT=0;
        if (value == 1)
                ROT =1;
}

int composite_init(item, value,event)
Panel_item      item;
int             value;
Event           *event;
{
        s2200_init_composite();
}

int rgb_init(item, value,event)
Panel_item      item;
int             value;
Event           *event;
{
        s2200_init_rgb();
}

int mono_init(item, value,event)
Panel_item      item;
int             value;
Event           *event;
{
        s2200_init_mono();
}

int comp_input(item, value,event)
Panel_item      item;
int             value;
Event           *event;
{
        s2200_select_comp_input();
}

int svideo_input(item, value,event)
Panel_item      item;
int             value;
Event           *event;
{
        s2200_select_svideo_input();
}


int overlay_border(item, value,event)
Panel_item      item;
int             value;
Event           *event;
{
        s2200_border();
        s2200_overlay_on();
```

xvid.c 4

```
}

int overlay_bars(item, value,event)
Panel_item      item;
int             value;
Event           *event;
{
        s2200_bars();
}

int overlay_hor_ramp(item, value,event)
Panel_item      item;
int             value;
Event           *event;
{
        s2200_horizontal_ramp();
}

int overlay_vert_ramp(item, value,event)
Panel_item      item;
int             value;
Event           *event;
{
        s2200 vertical_ramp();
}

void make_x_image_structures()
{
  int  i, j;
  ui8 *x_ptr_red, *x_ptr_slice;


  /* first malloc XImage data areas */
  /* ------------------------------ */
  x_ptr_red = (ui8*) malloc( status.image_width * status.image_height );
  if (x_ptr_red == NULL)
    fprintf(stderr, "M3: Unable to malloc red XImage area - no memory?\n");

  /* Now create Ximages */
  /* ---------------------- */

  x_image_green = XCreateImage(dpy, default_visual, default_depth, ZPixmap,
                               0, x_ptr_red, status.image_width, status.image_height, 8,
status.image_width);
    x_image_slice= XCreateImage(dpy, default_visual, default_depth, ZPixmap,
                               0, x_ptr_slice, status.image_width, status.image_height,
8,
status.image_width);

  /* Clear down malloc'ed areas */
  /* ------------------------------ */
  for (i = 0; i < status.image_height; i++)    /* Clear down XImage data area */
    for (j = 0; j < status.image_width; j++)
    {
      *x_ptr_red++   = (ui8) WhitePixel(dpy, default_screen);
    }
}

void reset_everything()  /* resets hw and sw etc */
{

  /* INITIALIZE Colourmaps etc */
  /* ------------------------- */
  setup_graphics_defaults();     /* depth, visual, gc etc */
  read_installed_colourmap();    /* read hardware palette */
  allocate_colours();            /* gets as many as poss r/w colours and
return index */
  /*generate_rt_hash_colour_cmap();*/
  generate_rt_hash_gray_cmap();  /* grayscale */
  install_our_colourmap();       /* call to XStoreColors  */
  read_installed_colourmap();
  generate_square_luts();

  status.rate = 5;   /* Hz refresh/update */
  reset_board();
  set_slider_default();

/*  set_window_sizes(); */

  timer.it_value.tv_usec = (1000/status.rate) * 1000;
  timer.it_interval.tv_usec = (1000/status.rate) * 1000;
  notify_set_itimer_func( (Frame) xvid_basewin->basewin, update, ITIMER_REAL,
&timer, NULL);
}

void reset_board()
{
  printf("\n3 Channel Monochrome Imaging: Initializing S2200...");

  /* first the board itself */
  s2200_map_devices();
  set_ccir_or_eia();      /* sets up status.display_width & height */

  bt473->command = EIGHTBIT | Bt473_FC24D | Bt281RESET;  /* reset 281 */
  bt473->palette_read_mask = 0xff;             /* don't forget this one */
  bt253->command = ADC_DECODER | SYNC_NTSC | ADC_24TRUE | ADC_SYNC125;
  bt281->address_low  = Bt281_CR0 & 0x0ff;
  bt281->address_high = (Bt281_CR0 & 0x0300) >> 8;

  vcon.vcon1  |= V_EXTERNAL;          /* General control 1         */
  vcon.vcon2 = V_ENABLE | V_MODE | V_POST; /* General Control 2    */
  vcon.vcon3 = 0;                     /* Interrupts - special case */
  vcon.vcon4 = V_INTERLACED;          /* Interlaced mode           */
  vcon.vcon5 = V_FULL;                /* Image Size                */
  vcon.vcon6a = V_X1;                 /* Zoom Factor               */
  vcon.vcon6b = V_X1;                 /* Sub-sample Factor         */
  vcon.vcon7a = 2;     /* Number of fields/frames - nibble 0       */
  vcon.vcon7b = 0;     /* Number of fields/frames - nibble 1       */
  vcon.vcon8a = 0;     /* capture/display start address - nibble 0 */
  vcon.vcon8b = 0;     /* capture/display start address - nibble 1 */
  vcon.vcon8c = 0;     /* capture/display start address - nibble 2 */
  vcon.vcon8d = 0;     /* capture/display start address - nibble 3 */
  vcon.vcon8e = 0;     /* capture/display start address - nibble 4 */
  vcon.vcon8f = 0;     /* capture/display start address - nibble 5 */
  /*s2200_ioctl(IOSFC_NOSYNCG); */
  s2200_ioctl(IOSFG_SYNCG);     /* sync on green */
  s2200_flush_vcon();

  /* Now enable Bt281 - and we should have a picture ! */
  bt473->command = EIGHTBIT | Bt281_NOT_RESET | Bt473_FC24D;
  bt281->data = 0x00;
  bt281->data = 0xe0;  /* el to disable outputs */

  status.display_width = status.full_width;
  status.display_height = status.full_height;

  status.image_width = status.full_width/2;
  status.image_height = status.full_height/2;
```

xvid.c 5

```
  /* now set direct RGB inputs and sync off green */
  bt253->command &= ~Bt253_SYNC_MASK;
  bt253->command |= SYNC_GVID1;

  set_ccir_or_eia();    /* sets up status.display_width & height */

  bt473->command = EIGHTBIT | Bt473_FC24D | Bt281RESET;
  bt473->palette_read_mask = 0xff;          /* don't forget this one */
  bt253->command = ADC_DECODER | SYNC_NTSC | ADC_24TRUE | ADC_SYNC125;
  bt281->address_low  = Bt281_CR0 & 0x0ff;
  bt281->address_high = (Bt281_CR0 & 0x0300) >> 8;

  bt253->white = DEFAULT_WHITE_LEVEL;
  bt253->black = DEFAULT_BLACK_LEVEL;
  bt253->clamp = DEFAULT_CLAMP_LEVEL;
  bt253->color = get_default_colour_level();
  bt253->uv_offset = DEFAULT_UV_OFFSET;
  bt253->IOUT5 = 0;

  vcon.vcon1  = V_EXTERNAL;
  vcon.vcon2  = V_ENABLE | V_MODE | V_POST;
  vcon.vcon3 = 0;                   /* Contains interrupts - use ioctls: */
  s2200_ioctl(IOSFG_SYNCG);         /* sync on green */
  vcon.vcon4  = V_INTERLACED;
  vcon.vcon5  = V_FULL;
  vcon.vcon6a = V_X1;
  vcon.vcon6b = V_X1;
  vcon.vcon7a = 2;
  vcon.vcon7b = 0;

  /* Now enable Bt281 - and we should have a picture ! */
  bt473->command = EIGHTBIT | Bt281_NOT_RESET | Bt473_FC24D;
  bt281->data = 0x00;
  bt281->data = 0xe0;               /* e1 to disable outputs */

  printf("Done\n");
}

Notify_value update()  /* called by timer interrupt */
{
  if (!GETWIDTH && !AUTO)
     update_full_video();
  else if (PAINTVIDEO)
     update_full_video();

     update_slice();
  return NOTIFY_DONE;
}

void update_full_video()
{
  register ui32 *vram_ptr;          /* ptr to S2200's vram
  */
  register int  pixel_no, line_no;
  register ui8 *x_ptr_green, *x_ptr_slice;
  register int width = status.image_width;

  /* initialize pointers */
  vram_ptr    = (ui32*) vram;
    x_ptr_green = (ui8*) x_image_green->data;
    x_ptr_slice = (ui8*) x_image_slice->data;

  /* read image into x_image structures */

  for (line_no = 0; line_no < status.image_height; line_no++)
    for (pixel_no = 0; pixel_no < width; pixel_no++)
    {
      *x_ptr_green++ = (char) rt_hash_to_pixel[(*vram_ptr >>
9) & 0x07f];
      vram_ptr += 2;
    }

      XPutImage(dpy, xwin2_id, gc, x_image_green, 0,0,0,0, width,
             status.image_height);
      XSetForeground(dpy, gc, 0);
      XDrawLine(dpy,xwin2_id,gc,(status.start_slice)/2,(status.slice_line)/1,
             (status.end_slice)/2,(status.slice_line)/1);
}

void update_slice()
{
   register ui32 *vram_ptr;
   register int width = status.image_width;

   int i=0;
   int line_no = 100;
   int y0, y1, y2, y3;
   char mess[300];
   struct timeval  tp;
   struct timezone tzp;
   float temp, wdth;
   int slc[640] , cnt = 1;

   vram_ptr = status.slice_line * status.full_width + (ui32*) vram;
   vram_ptr += status.start_slice;

   XSetForeground(dpy, gc, 1);
   XClearArea(dpy, xwin1_id, 0, 0, 0, 0, False);

 if(!AUTO)
  {
   for(i=((int) (status.start_slice/2)); i<((int) (status.end_slice/2)); i++)
    {
      y1 = (char) rt_hash_to_pixel[((ui8) *vram_ptr)>>1];
      y2 = (char) rt_hash_to_pixel[((ui8) *(vram_ptr+2))>>1];
      y2 = ((y2<0)?128:y2);
      y1 = ((y1<0)?128:y1);
      if(DUMP > 1) {
        printf("");
        inten[2*i] += (float) y1;
        y0 = (char) rt_hash_to_pixel[((ui8) *(vram_ptr+1))>>1];
        y0 = ((y0<0)?128:y0);
        inten[2*i+1] += (float) y0;
      }
      XDrawLine(dpy,xwin1_id,gc,i,y1,i+1,y2);

      vram_ptr += 2;
    }

      if(DUMP > 1)
            DUMP--;

    if (DUMP == 1 )   {
      printf("\n");
      for(i=((int) status.start_slice); i<((int) status.end_slice); i++) {
        fprintf(fp2,"%d %f\n",i,355.0-2.75/19*inten[i]);
      }
      DUMP = 0;
```

xvid.c 6

```
        fclose(fp2);
      }
    }

    XSetForeground(dpy, gc, 1);
    if(GETWIDTH)
     {   gettimeofday(&tp, &tzp);
         ClockTime = (double)(tp.tv_sec - InitialTime) +
                 (double)(tp.tv_usec / 1000000.0);

        vram_ptr = status.slice_line * status.full_width + (ui32*) vram;
        vram_ptr += status.start_slice;
        wdth =0;
        for(i = status.start_slice; i < status.end_slice; i++)
          {
            temp = ((float) (char) rt_hash_to_pixel[((ui8) *vram_ptr)>>1]);
            if(temp > 0)
                if (INTEN)
                    wdth += temp;
                else
                    wdth++;
            vram_ptr++;
          }
        fprintf(fp1,"%lf  %f\n", ClockTime,  wdth);

        if (INTEN)
            sprintf(mess, "Integrated Streak Intensity: %d", ((int) wdth));
        else
            sprintf(mess, "Streak Width: %d", ((int) wdth));

        xv_set(xvid_rheed_slice->slice_message, PANEL_LABEL_STRING, "", NULL);
        xv_set(xvid_rheed_slice->slice_message, PANEL_LABEL_STRING, mess, NULL);
     }
    XSetForeground(dpy, gc, 3);
    if(AUTO)
        which();
}
```

xvid_ui.c

```
/*
 * xvid_ui.c - User interface object initialization functions.
 * This file was generated by `gxv' from `xvid.G'.
 * DO NOT EDIT BY HAND.
 */

#include <stdio.h>
#include <sys/param.h>
#include <sys/types.h>
#include <xview/xview.h>
#include <xview/canvas.h>
#include <xview/icon_load.h>
#include <xview/panel.h>
#include <xview/scrollbar.h>
#include <xview/svrimage.h>
#include <xview/termsw.h>
#include <xview/text.h>
#include <xview/tty.h>
#include <xview/xv_xrect.h>
#include "xvid_ui.h"

/*
 * Create object `init_menu' in the specified instance.

 */
Xv_opaque
xvid_init_menu_create(ip, owner)
        caddr_t         *ip;
        Xv_opaque       owner;
{
        extern Menu_item        rgb_init();
        extern Menu_item        composite_init();
        extern Menu_item        mono_init();
        Xv_opaque       obj;

        obj = xv_create(XV_NULL, MENU_COMMAND_MENU,
                XV_KEY_DATA, INSTANCE, ip,
                MENU_ITEM,
                        XV_KEY_DATA, INSTANCE, ip,
                        MENU_STRING, "RGB",
                        MENU_GEN_PROC, rgb_init,
                        NULL,
                MENU_ITEM,
                        XV_KEY_DATA, INSTANCE, ip,
                        MENU_STRING, "Composite",
                        MENU_GEN_PROC, composite_init,
                        NULL,
                MENU_ITEM,
                        XV_KEY_DATA, INSTANCE, ip,
                        MENU_STRING, "Monochrome",
                        MENU_GEN_PROC, mono_init,
                        NULL,
                MENU_DEFAULT, 1,
                NULL);
        return obj;
}

/*
 * Create object `input_menu' in the specified instance.

 */
Xv_opaque
xvid_input_menu_create(ip, owner)
        caddr_t         *ip;
        Xv_opaque       owner;
{
        extern Menu_item        comp_input();
        extern Menu_item        svideo_input();
        Xv_opaque       obj;

        obj = xv_create(XV_NULL, MENU_COMMAND_MENU,
                XV_KEY_DATA, INSTANCE, ip,
                MENU_ITEM,
                        XV_KEY_DATA, INSTANCE, ip,
                        MENU_STRING, "Composite",
                        MENU_GEN_PROC, comp_input,
                        NULL,
                MENU_ITEM,
                        XV_KEY_DATA, INSTANCE, ip,
                        MENU_STRING, "S-Video",
                        MENU_GEN_PROC, svideo_input,
                        NULL,
                MENU_DEFAULT, 1,
                NULL);
        return obj;
}

/*
 * Create object `over_menu' in the specified instance.

 */
Xv_opaque
xvid_over_menu_create(ip, owner)
        caddr_t         *ip;
        Xv_opaque       owner;
{
        extern Menu_item        overlay_bars();
        extern Menu_item        overlay_border();
        extern Menu_item        overlay_hor_ramp();
        extern Menu_item        overlay_vert_ramp();
        Xv_opaque       obj;

        obj = xv_create(XV_NULL, MENU_COMMAND_MENU,
                XV_KEY_DATA, INSTANCE, ip,
                MENU_ITEM,
                        XV_KEY_DATA, INSTANCE, ip,
                        MENU_STRING, "Bars",
                        MENU_GEN_PROC, overlay_bars,
                        NULL,
                MENU_ITEM,
                        XV_KEY_DATA, INSTANCE, ip,
                        MENU_STRING, "Border",
                        MENU_GEN_PROC, overlay_border,
                        NULL,
                MENU_ITEM,
                        XV_KEY_DATA, INSTANCE, ip,
                        MENU_STRING, "H-ramp",
                        MENU_GEN_PROC, overlay_hor_ramp,
                        NULL,
                MENU_ITEM,
                        XV_KEY_DATA, INSTANCE, ip,
                        MENU_STRING, "V-ramp",
                        MENU_GEN_PROC, overlay_vert_ramp,
                        NULL,
                MENU_GEN_PIN_WINDOW, (Xv_opaque) ip[0], "Overlay",
                NULL);
        return obj;
}
```

xvid_ui.c

2

```
/*
 * Initialize an instance of object 'basewin'.
 */
xvid_basewin_objects *
xvid_basewin_objects_initialize(ip, owner)
        xvid_basewin_objects    *ip;
        Xv_opaque       owner;
{
        if (!ip && !(ip = (xvid_basewin_objects *) calloc(1, sizeof (xvid_basewin_object
s))))
                return (xvid_basewin_objects *) NULL;
        if (!ip->basewin)
                ip->basewin = xvid_basewin_basewin_create(ip, owner);
        if (!ip->controls1)
                ip->controls1 = xvid_basewin_controls1_create(ip, ip->basewin);
        if (!ip->initialize)
                ip->initialize = xvid_basewin_initialize_create(ip, ip->controls1);
        if (!ip->input_type)
                ip->input_type = xvid_basewin_input_type_create(ip, ip->controls1);
        if (!ip->overlay)
                ip->overlay = xvid_basewin_overlay_create(ip, ip->controls1);
        if (!ip->live_button)
                ip->live_button = xvid_basewin_live_button_create(ip, ip->controls1);
        if (!ip->width_button)
                ip->width_button = xvid_basewin_width_button_create(ip, ip->controls1);
        if (!ip->stop_button)
                ip->stop_button = xvid_basewin_stop_button_create(ip, ip->controls1);
        if (!ip->auto_button)
                ip->auto_button = xvid_basewin_auto_button_create(ip, ip->controls1);
        if (!ip->rate_slider)
                ip->rate_slider = xvid_basewin_rate_slider_create(ip, ip->controls1);
        if (!ip->white_slider)
                ip->white_slider = xvid_basewin_white_slider_create(ip, ip->controls1);
        if (!ip->black_slider)
                ip->black_slider = xvid_basewin_black_slider_create(ip, ip->controls1);
        if (!ip->clamp_slider)
                ip->clamp_slider = xvid_basewin_clamp_slider_create(ip, ip->controls1);
        if (!ip->update_video_choice)
                ip->update_video_choice = xvid_basewin_update_video_choice_create(ip, ip
->controls1);
        return ip;
}

/*
 * Create object 'basewin' in the specified instance.
 */
Xv_opaque
xvid_basewin_basewin_create(ip, owner)
        caddr_t         ip;
        Xv_opaque       owner;
{
        Xv_opaque       obj;

        obj = xv_create(owner, FRAME,
                XV_KEY_DATA, INSTANCE, ip,
                XV_WIDTH, 320,
                XV_HEIGHT, 245,
                XV_LABEL, "RHEED XCapture",
                FRAME_CLOSED, FALSE,
                FRAME_SHOW_FOOTER, FALSE,
                FRAME_SHOW_RESIZE_CORNER, FALSE,
                NULL);
        return obj;
}

/*
 * Create object 'controls1' in the specified instance.
 */
Xv_opaque
xvid_basewin_controls1_create(ip, owner)
        caddr_t         ip;
        Xv_opaque       owner;
{
        Xv_opaque       obj;

        obj = xv_create(owner, PANEL,
                XV_KEY_DATA, INSTANCE, ip,
                XV_X, 0,
                XV_Y, 0,
                XV_WIDTH, WIN_EXTEND_TO_EDGE,
                XV_HEIGHT, WIN_EXTEND_TO_EDGE,
                WIN_BORDER, FALSE,
                NULL);
        return obj;
}

/*
 * Create object 'initialize' in the specified instance.
 */
Xv_opaque
xvid_basewin_initialize_create(ip, owner)
        caddr_t         ip;
        Xv_opaque       owner;
{
        Xv_opaque       obj;

        obj = xv_create(owner, PANEL_BUTTON,
                XV_KEY_DATA, INSTANCE, ip,
                XV_X, 20,
                XV_Y, 4,
                XV_WIDTH, 86,
                XV_HEIGHT, 19,
                PANEL_LABEL_STRING, "Initialize",
                PANEL_ITEM_MENU, xvid_init_menu_create((caddr_t *) ip, NULL),
                NULL);
        return obj;
}

/*
 * Create object 'input_type' in the specified instance.
 */
Xv_opaque
xvid_basewin_input_type_create(ip, owner)
        caddr_t         ip;
        Xv_opaque       owner;
{
        Xv_opaque       obj;

        obj = xv_create(owner, PANEL_BUTTON,
                XV_KEY_DATA, INSTANCE, ip,
                XV_X, 130,
                XV_Y, 4,
                XV_WIDTH, 65,
```

xvid_ui.c 3

```
                XV_HEIGHT, 19,
                PANEL_LABEL_STRING, "Input",
                PANEL_ITEM_MENU, xvid_input_menu_create((caddr_t *) ip, NULL),
                NULL);
        return obj;
}

/*
 * Create object 'overlay' in the specified instance.

 */
Xv_opaque
xvid_basewin_overlay_create(ip, owner)
        caddr_t         ip;
        Xv_opaque       owner;
{
        Xv_opaque       obj;

        obj = xv_create(owner, PANEL_BUTTON,
                XV_KEY_DATA, INSTANCE, ip,
                XV_X, 220,
                XV_Y, 4,
                XV_WIDTH, 79,
                XV_HEIGHT, 19,
                PANEL_LABEL_STRING, "Overlay",
                PANEL_ITEM_MENU, xvid_over_menu_create((caddr_t *) ip, NULL),
                NULL);
        return obj;
}

/*
 * Create object 'live_button' in the specified instance.

 */
Xv_opaque
xvid_basewin_live_button_create(ip, owner)
        caddr_t         ip;
        Xv_opaque       owner;
{
        extern void             live_notify();
        Xv_opaque       obj;

        obj = xv_create(owner, PANEL_BUTTON,
                XV_KEY_DATA, INSTANCE, ip,
                XV_X, 35,
                XV_Y, 40,
                XV_WIDTH, 42,
                XV_HEIGHT, 19,
                PANEL_LABEL_STRING, "Live",
                PANEL_NOTIFY_PROC, live_notify,
                NULL);
        return obj;
}

/*
 * Create obje[illegible]th_button' in the specified instance.

 */
Xv_opaque
xvid_basewin_width_button_create(ip, owner)
        caddr_t         ip;
        Xv_opaque       owner;
{
        extern void             slice_popup_handler();
        Xv_opaque       obj;

        obj = xv_create(owner, PANEL_BUTTON,
                XV_KEY_DATA, INSTANCE, ip,
                XV_X, 100,
                XV_Y, 40,
                XV_WIDTH, 46,
                XV_HEIGHT, 19,
                PANEL_LABEL_STRING, "Slice",
                PANEL_NOTIFY_PROC, slice_popup_handler,
                NULL);
        return obj;
}

/*
 * Create object 'stop_button' in the specified instance.

 */
Xv_opaque
xvid_basewin_stop_button_create(ip, owner)
        caddr_t         ip;
        Xv_opaque       owner;
{
        extern void             stop_notify();
        Xv_opaque       obj;

        obj = xv_create(owner, PANEL_BUTTON,
                XV_KEY_DATA, INSTANCE, ip,
                XV_X, 180,
                XV_Y, 40,
                XV_WIDTH, 45,
                XV_HEIGHT, 19,
                PANEL_LABEL_STRING, "Stop",
                PANEL_NOTIFY_PROC, stop_notify,
                NULL);
        return obj;
}

/*
 * Create object 'auto_button' in the specified instance.

 */
Xv_opaque
xvid_basewin_auto_button_create(ip, owner)
        caddr_t         ip;
        Xv_opaque       owner;
{
        extern void             auto_popup_handler();
        Xv_opaque       obj;

        obj = xv_create(owner, PANEL_BUTTON,
                XV_KEY_DATA, INSTANCE, ip,
                XV_X, 250,
                XV_Y, 40,
                XV_WIDTH, 46,
                XV_HEIGHT, 19,
                PANEL_LABEL_STRING, "Auto",
                PANEL_NOTIFY_PROC, auto_popup_handler,
                NULL);
        return obj;
}

/*
 * Create object 'rate_slider' in the specified instance.
```

xvid_ui.c 4

```
 */
Xv_opaque
xvid_basewin_rate_slider_create(ip, owner)
        caddr_t         ip;
        Xv_opaque       owner;
{
        extern int              set_capture_rate();
        Xv_opaque       obj;

        obj = xv_create(owner, PANEL_SLIDER,
                XV_KEY_DATA, INSTANCE, ip,
                XV_X, 20,
                XV_Y, 72,
                XV_WIDTH, 225,
                XV_HEIGHT, 20,
                PANEL_VALUE_X, 107,
                PANEL_VALUE_Y, 72,
                PANEL_SLIDER_WIDTH, 50,
                PANEL_LABEL_STRING, "Frame Rate:",
                PANEL_LAYOUT, PANEL_HORIZONTAL,
                PANEL_DIRECTION, PANEL_HORIZONTAL,
                PANEL_SLIDER_END_BOXES, FALSE,
                PANEL_SHOW_RANGE, TRUE,
                PANEL_SHOW_VALUE, TRUE,
                PANEL_MIN_VALUE, 1,
                PANEL_MAX_VALUE, 60,
                PANEL_TICKS, 0,
                PANEL_NOTIFY_PROC, set_capture_rate,
                NULL);
        return obj;
}

/*
 * Create object 'white_slider' in the specified instance.

 */
Xv_opaque
xvid_basewin_white_slider_create(ip, owner)
        caddr_t         ip;
        Xv_opaque       owner;
{
        extern int              set_white();
        Xv_opaque       obj;

        obj = xv_create(owner, PANEL_SLIDER,
                XV_KEY_DATA, INSTANCE, ip,
                XV_X, 20,
                XV_Y, 100,
                XV_WIDTH, 196,
                XV_HEIGHT, 20,
                PANEL_VALUE_X, 108,
                PANEL_VALUE_Y, 100,
                PANEL_SLIDER_WIDTH, 50,
                PANEL_LABEL_STRING, "White:",
                PANEL_LAYOUT, PANEL_HORIZONTAL,
                PANEL_DIRECTION, PANEL_HORIZONTAL,
                PANEL_SLIDER_END_BOXES, FALSE,
                PANEL_SHOW_RANGE, TRUE,
                PANEL_SHOW_VALUE, TRUE,
                PANEL_MIN_VALUE, 0,
                PANEL_MAX_VALUE, 254,
                PANEL_TICKS, 0,
                PANEL_NOTIFY_PROC, set_white,
                NULL);
        return obj;
}

/*
 * Create object 'black_slider' in the specified instance.

 */
Xv_opaque
xvid_basewin_black_slider_create(ip, owner)
        caddr_t         ip;
        Xv_opaque       owner;
{
        extern int              set_black();
        Xv_opaque       obj;

        obj = xv_create(owner, PANEL_SLIDER,
                XV_KEY_DATA, INSTANCE, ip,
                XV_X, 20,
                XV_Y, 128,
                XV_WIDTH, 194,
                XV_HEIGHT, 20,
                PANEL_VALUE_X, 108,
                PANEL_VALUE_Y, 128,
                PANEL_SLIDER_WIDTH, 50,
                PANEL_LABEL_STRING, "Black:",
                PANEL_LAYOUT, PANEL_HORIZONTAL,
                PANEL_DIRECTION, PANEL_HORIZONTAL,
                PANEL_SLIDER_END_BOXES, FALSE,
                PANEL_SHOW_RANGE, TRUE,
                PANEL_SHOW_VALUE, TRUE,
                PANEL_MIN_VALUE, 0,
                PANEL_MAX_VALUE, 254,
                PANEL_TICKS, 0,
                PANEL_NOTIFY_PROC, set_black,
                NULL);
        return obj;
}

/*
 * Create object 'clamp_slider' in the specified instance.

 */
Xv_opaque
xvid_basewin_clamp_slider_create(ip, owner)
        caddr_t         ip;
        Xv_opaque       owner;
{
        extern int              set_clamp();
        Xv_opaque       obj;

        obj = xv_create(owner, PANEL_SLIDER,
                XV_KEY_DATA, INSTANCE, ip,
                XV_X, 20,
                XV_Y, 156,
                XV_WIDTH, 201,
                XV_HEIGHT, 20,
                PANEL_VALUE_X, 108,
                PANEL_VALUE_Y, 156,
                PANEL_SLIDER_WIDTH, 50,
                PANEL_LABEL_STRING, "Clamp:",
                PANEL_LAYOUT, PANEL_HORIZONTAL,
                PANEL_DIRECTION, PANEL_HORIZONTAL,
                PANEL_SLIDER_END_BOXES, FALSE,
```

xvid_ui.c

```
                PANEL_SHOW_RANGE, TRUE,
                PANEL_SHOW_VALUE, TRUE,
                PANEL_MIN_VALUE, 0,
                PANEL_MAX_VALUE, 254,
                PANEL_TICKS, 0,
                PANEL_NOTIFY_PROC, set_clamp,
                NULL);
        return obj;
}

/*
 * Create object 'update video choice' in the specified instance.

 */
Xv_opaque
xvid_basewin_update_video_choice_create(ip, owner)
        caddr_t         ip;
        Xv_opaque       owner;
{
        extern int              update_video_notify();
        Xv_opaque       obj;

        obj = xv_create(owner, PANEL_CHOICE,
                XV_KEY_DATA, INSTANCE, ip,
                XV_X, 12,
                XV_Y, 192,
                XV_WIDTH, 274,
                XV_HEIGHT, 46,
                PANEL_VALUE_X, 249,
                PANEL_VALUE_Y, 192,
                PANEL_LAYOUT, PANEL_HORIZONTAL,
                PANEL_CHOICE_NCOLS, 1,
                PANEL_LABEL_STRING, "Update Video When Taking Data ?",
                PANEL_NOTIFY_PROC, update_video_notify,
                PANEL_CHOICE_STRINGS,
                        "Yes",
                        "No",
                        0,
                NULL);
        return obj;
}

/*
 * Initialize an instance of object 'rheed_slice'.
 */
xvid_rheed_slice_objects *
xvid_rheed_slice_objects_initialize(ip, owner)
        xvid_rheed_slice_objects        *ip;
        Xv_opaque       owner;
{
        if (!ip && !(ip = (xvid_rheed_slice_objects *) calloc(1, sizeof (xvid_rheed_slic
e_objects))))
                return (xvid_rheed_slice_objects *) NULL;
        if (!ip->rheed_slice)
                ip->rheed_slice = xvid_rheed_slice_rheed_slice_create(ip, owner);
        if (!ip->slice_canvas)
                ip->slice_canvas = xvid_rheed_slice_slice_canvas_create(ip, ip->rheed_sl
ice);
        if (!ip->rheed_slice_controls)
                ip->rheed_slice_controls = xvid_rheed_slice_rheed_slice_controls_create(
ip, ip->rheed_slice);
        if (!ip->slice_message)
                ip->slice_message = xvid_rheed_slice_slice_message_create(ip, ip->rheed_
slice_controls);
        return ip;
}

/*
 * Create object 'rheed_slice' in the specified instance.

 */
Xv_opaque
xvid_rheed_slice_rheed_slice_create(ip, owner)
        caddr_t         ip;
        Xv_opaque       owner;
{
        Xv_opaque       obj;

        obj = xv_create(owner, FRAME_CMD,
                XV_KEY_DATA, INSTANCE, ip,
                XV_WIDTH, 320,
                XV_HEIGHT, 165,
                XV_LABEL, "RHEED slice",
                XV_SHOW, TRUE,
                FRAME_SHOW_FOOTER, FALSE,
                FRAME_SHOW_RESIZE_CORNER, FALSE,
                FRAME_CMD_PUSHPIN_IN, TRUE,
                NULL);
        xv_set(xv_get(obj, FRAME_CMD_PANEL), WIN_SHOW, FALSE, NULL);
        return obj;
}

/*
 * Create object 'slice_canvas' in the specified instance.

 */
Xv_opaque
xvid_rheed_slice_slice_canvas_create(ip, owner)
        caddr_t         ip;
        Xv_opaque       owner;
{
        extern void     repaint_slice();
        Xv_opaque       obj;

        obj = xv_create(owner, CANVAS,
                XV_KEY_DATA, INSTANCE, ip,
                XV_X, 0,
                XV_Y, 0,
                XV_WIDTH, WIN_EXTEND_TO_EDGE,
                XV_HEIGHT, 140,
                CANVAS_REPAINT_PROC, repaint_slice,
                CANVAS_X_PAINT_WINDOW, TRUE,
                NULL);
        xv_set(canvas_paint_window(obj), XV_KEY_DATA, INSTANCE, ip, NULL);
        return obj;
}

/*
 * Create object 'rheed_slice_controls' in the specified instance.

 */
Xv_opaque
xvid_rheed_slice_rheed_slice_controls_create(ip, owner)
        caddr_t         ip;
        Xv_opaque       owner;
{
        Xv_opaque       obj;
```

xvid_ui.c 6

```
        obj = xv_create(owner, PANEL,
                XV_KEY_DATA, INSTANCE, ip,
                XV_X, 0,
                XV_Y, 140,
                XV_WIDTH, WIN_EXTEND_TO_EDGE,
                XV_HEIGHT, WIN_EXTEND_TO_EDGE,
                WIN_BORDER, FALSE,
                NULL);
        return obj;
}

/*
 * Create object 'slice_message' in the specified instance.

 */
Xv_opaque
xvid_rheed_slice_slice_message_create(ip, owner)
        caddr_t         ip;
        Xv_opaque       owner;
{
        Xv_opaque       obj;

        obj = xv_create(owner, PANEL_MESSAGE,
                XV_KEY_DATA, INSTANCE, ip,
                XV_X, 0,
                XV_Y, 5,
                XV_WIDTH, 4,
                XV_HEIGHT, 13,
                PANEL_LABEL_STRING, " ",
                PANEL_LABEL_BOLD, TRUE,
                NULL);
        return obj;
}

/*
 * Initialize an instance of object 'full_video'.
 */
xvid_full_video_objects *
xvid_full_video_objects_initialize(ip, owner)
        xvid_full_video_objects *ip;
        Xv_opaque       owner;
{
        if (!ip && !(ip = (xvid_full_video_objects *) calloc(1, sizeof (xvid_full_video_
objects))))
                return (xvid_full_video_objects *) NULL;
        if (!ip->full_video)
                ip->full_video = xvid_full_video_full_video_create(ip, owner);
        if (!ip->full_video_canvas)
                ip->full_video_canvas = xvid_full_video_full_video_canvas_create(ip, ip-
>full_video);
        return ip;
}

/*
 * Create object 'full_video' in the specified instance.

 */
Xv_opaque
xvid_full_video_full_video_create(ip, owner)
        caddr_t         ip;
        Xv_opaque       owner;
{
        Xv_opaque       obj;

        obj = xv_create(owner, FRAME_CMD,
                XV_KEY_DATA, INSTANCE, ip,
                XV_WIDTH, 320,
                XV_HEIGHT, 240,
                XV_LABEL, " ",
                XV_SHOW, TRUE,
                FRAME_SHOW_FOOTER, FALSE,
                FRAME_SHOW_RESIZE_CORNER, FALSE,
                FRAME_CMD_PUSHPIN_IN, TRUE,
                NULL);
        xv_set(xv_get(obj, FRAME_CMD_PANEL), WIN_SHOW, FALSE, NULL);
        return obj;
}

/*
 * Create object 'full_video_canvas' in the specified instance.

 */
Xv_opaque
xvid_full_video_full_video_canvas_create(ip, owner)
        caddr_t         ip;
        Xv_opaque       owner;
{
        extern void     repaint_pattern();
        Xv_opaque       obj;

        obj = xv_create(owner, CANVAS,
                XV_KEY_DATA, INSTANCE, ip,
                XV_X, 0,
                XV_Y, 0,
                XV_WIDTH, WIN_EXTEND_TO_EDGE,
                XV_HEIGHT, WIN_EXTEND_TO_EDGE,
                CANVAS_REPAINT_PROC, repaint_pattern,
                CANVAS_X_PAINT_WINDOW, TRUE,
                NULL);
        xv_set(canvas_paint_window(obj), XV_KEY_DATA, INSTANCE, ip, NULL);
        return obj;
}

/*
 * Initialize an instance of object 'auto_popup'.
 */
xvid_auto_popup_objects *
xvid_auto_popup_objects_initialize(ip, owner)
        xvid_auto_popup_objects *ip;
        Xv_opaque       owner;
{
        if (!ip && !(ip = (xvid_auto_popup_objects *) calloc(1, sizeof (xvid_auto_popup_o
bjects))))
                return (xvid_auto_popup_objects *) NULL;
        if (!ip->auto_popup)
                ip->auto_popup = xvid_auto_popup_auto_popup_create(ip, owner);
        if (!ip->auto_controls)
                ip->auto_controls = xvid_auto_popup_auto_controls_create(ip, ip->auto_pop
up);
        if (!ip->auto_rot_setting)
                ip->auto_rot_setting = xvid_auto_popup_auto_rot_setting_create(ip, ip->au
to_controls);
        if (!ip->auto_start_button)
                ip->auto_start_button = xvid_auto_popup_auto_start_button_create(ip, ip->
auto_controls);
        if (!ip->auto_stop_button)
                ip->auto_stop_button = xvid_auto_popup_auto_stop_button_create(ip, ip->au
to_controls);
```

xvid_ui.c 7

```
        if (!ip->auto_meas_setting)
                ip->auto_meas_setting = xvid_auto_popup_auto_meas_setting_create(ip, ip-
>auto_controls);
        if (!ip->auto_count_setting)
                ip->auto_count_setting = xvid_auto_popup_auto_count_setting_create(ip, i
p->auto_controls);
        if (!ip->auto_write_button)
                ip->auto_write_button = xvid_auto_popup_auto_write_button_create(ip, ip-
>auto_controls);
        if (!ip->auto_write_textfield)
                ip->auto_write_textfield = xvid_auto_popup_auto_write_textfield_create(i
p, ip->auto_controls);
        if (!ip->auto_scan_rate_msg)
                ip->auto_scan_rate_msg = xvid_auto_popup_auto_scan_rate_msg_create(ip, i
p->auto_controls);
        if (!ip->auto_osc_rate_msg)
                ip->auto_osc_rate_msg = xvid_auto_popup_auto_osc_rate_msg_create(ip, ip-
>auto_controls);
        return ip;
}

/*
 * Create object 'auto_popup' in the specified instance.
 */
Xv_opaque
xvid_auto_popup_auto_popup_create(ip, owner)
        caddr_t         ip;
        Xv_opaque       owner;
{
        Xv_opaque       obj;

        obj = xv_create(owner, FRAME_CMD,
                XV_KEY_DATA, INSTANCE, ip,
                XV_WIDTH, 359,
                XV_HEIGHT, 205,
                XV_LABEL, "Auto Tracking",
                XV_SHOW, FALSE,
                FRAME_SHOW_FOOTER, TRUE,
                FRAME_SHOW_RESIZE_CORNER, TRUE,
                FRAME_CMD_PUSHPIN_IN, TRUE,
                NULL);
        xv_set(xv_get(obj, FRAME_CMD_PANEL), WIN_SHOW, FALSE, NULL);
        return obj;
}

/*
 * Create object 'auto_controls' in the specified instance.
 */
Xv_opaque
xvid_auto_popup_auto_controls_create(ip, owner)
        caddr_t         ip;
        Xv_opaque       owner;
{
        Xv_opaque       obj;

        obj = xv_create(owner, PANEL,
                XV_KEY_DATA, INSTANCE, ip,
                XV_X, 0,
                XV_Y, 0,
                XV_WIDTH, WIN_EXTEND_TO_EDGE,
                XV_HEIGHT, WIN_EXTEND_TO_EDGE,
                WIN_BORDER, FALSE,
                NULL);
        return obj;
}

/*
 * Create object 'auto_rot_setting' in the specified instance.
 */
Xv_opaque
xvid_auto_popup_auto_rot_setting_create(ip, owner)
        caddr_t         ip;
        Xv_opaque       owner;
{
        extern int              rot_choice_notify();
        Xv_opaque       obj;

        obj = xv_create(owner, PANEL_CHOICE,
                XV_KEY_DATA, INSTANCE, ip,
                XV_X, 20,
                XV_Y, 16,
                XV_WIDTH, 222,
                XV_HEIGHT, 23,
                PANEL_VALUE_X, 97,
                PANEL_VALUE_Y, 16,
                PANEL_LAYOUT, PANEL_HORIZONTAL,
                PANEL_CHOICE_NROWS, 1,
                PANEL_LABEL_STRING, "Substrate:",
                PANEL_NOTIFY_PROC, rot_choice_notify,
                PANEL_CHOICE_STRINGS,
                        "Stationary",
                        "Rotating",
                        0,
                NULL);
        return obj;
}

/*
 * Create object 'auto_start_button' in the specified instance.
 */
Xv_opaque
xvid_auto_popup_auto_start_button_create(ip, owner)
        caddr_t         ip;
        Xv_opaque       owner;
{
        extern void             auto_start_notify();
        Xv_opaque       obj;

        obj = xv_create(owner, PANEL_BUTTON,
                XV_KEY_DATA, INSTANCE, ip,
                XV_X, 280,
                XV_Y, 16,
                XV_WIDTH, 47,
                XV_HEIGHT, 19,
                PANEL_LABEL_STRING, "Start",
                PANEL_NOTIFY_PROC, auto_start_notify,
                NULL);
        return obj;
}

/*
 * Create object 'auto_stop_button' in the specified instance.
 */
```

xvid_ui.c

8

```
Xv_opaque
xvid_auto_popup_auto_stop_button_create(ip, owner)
	caddr_t		ip;
	Xv_opaque	owner;
{
	extern void		auto_stop_notify();
	Xv_opaque	obj;

	obj = xv_create(owner, PANEL_BUTTON,
		XV_KEY_DATA, INSTANCE, ip,
		XV_X, 280,
		XV_Y, 52,
		XV_WIDTH, 45,
		XV_HEIGHT, 19,
		PANEL_LABEL_STRING, "Stop",
		PANEL_NOTIFY_PROC, auto_stop_notify,
		NULL);
	return obj;
}

/*
 * Create object 'auto_meas_setting' in the specified instance.

 */
Xv_opaque
xvid_auto_popup_auto_meas_setting_create(ip, owner)
	caddr_t		ip;
	Xv_opaque	owner;
{
	extern int		meas_choice_notify();
	Xv_opaque	obj;

	obj = xv_create(owner, PANEL_CHOICE,
		XV_KEY_DATA, INSTANCE, ip,
		XV_X, 20,
		XV_Y, 56,
		XV_WIDTH, 200,
		XV_HEIGHT, 23,
		PANEL_VALUE_X, 98,
		PANEL_VALUE_Y, 56,
		PANEL_LAYOUT, PANEL_HORIZONTAL,
		PANEL_CHOICE_NROWS, 1,
		PANEL_LABEL_STRING, "Measure:  ",
		PANEL_NOTIFY_PROC, meas_choice_notify,
		PANEL_CHOICE_STRINGS,
			"Intensity",
			"Width",
			0,
		NULL);
	return obj;
}

/*
 * Create object 'auto_count_setting' in the specified instance.

 */
Xv_opaque
xvid_auto_popup_auto_count_setting_create(ip, owner)
	caddr_t		ip;
	Xv_opaque	owner;
{
	extern int		count_choice_notify();
	Xv_opaque	obj;

	obj = xv_create(owner, PANEL_CHOICE, PANEL_DISPLAY_LEVEL, PANEL_CURRENT,
		XV_KEY_DATA, INSTANCE, ip,
		XV_X, 20,
		XV_Y, 88,
		XV_WIDTH, 160,
		XV_HEIGHT, 23,
		PANEL_VALUE_X, 123,
		PANEL_VALUE_Y, 88,
		PANEL_LAYOUT, PANEL_HORIZONTAL,
		PANEL_CHOICE_NROWS, 1,
		PANEL_LABEL_STRING, "Count Peaks ?",
		PANEL_NOTIFY_PROC, count_choice_notify,
		PANEL_CHOICE_STRINGS,
			"Yes",
			"No",
			0,
		NULL);
	return obj;
}

/*
 * Create object 'auto_write_button' in the specified instance.

 */
Xv_opaque
xvid_auto_popup_auto_write_button_create(ip, owner)
	caddr_t		ip;
	Xv_opaque	owner;
{
	extern void		auto_write_notify();
	Xv_opaque	obj;

	obj = xv_create(owner, PANEL_BUTTON,
		XV_KEY_DATA, INSTANCE, ip,
		XV_X, 264,
		XV_Y, 92,
		XV_WIDTH, 82,
		XV_HEIGHT, 19,
		PANEL_LABEL_STRING, "Write Data",
		PANEL_NOTIFY_PROC, auto_write_notify,
		NULL);
	return obj;
}

/*
 * Create object 'auto_write_textfield' in the specified instance.

 */
Xv_opaque
xvid_auto_popup_auto_write_textfield_create(ip, owner)
	caddr_t		ip;
	Xv_opaque	owner;
{
	Xv_opaque	obj;

	obj = xv_create(owner, PANEL_TEXT,
		XV_KEY_DATA, INSTANCE, ip,
		XV_X, 16,
		XV_Y, 128,
		XV_WIDTH, 303,
		XV_HEIGHT, 15,
		PANEL_LABEL_STRING, "Write Data To:",
		PANEL_VALUE_X, 119,
		PANEL_VALUE_Y, 128,
```

xvid_ui.c

9

```
                PANEL_LAYOUT, PANEL_HORIZONTAL,
                PANEL_VALUE_DISPLAY_LENGTH, 25,
                PANEL_VALUE_STORED_LENGTH, 80,
                PANEL_READ_ONLY, FALSE,
                NULL);
        return obj;
}

/*
 * Create object 'auto_scan_rate_msg' in the specified instance.

 */
Xv_opaque
xvid_auto_popup_auto_scan_rate_msg_create(ip, owner)
        caddr_t         ip;
        Xv_opaque       owner;
{
        Xv_opaque       obj;

        obj = xv_create(owner, PANEL_MESSAGE,
                XV_KEY_DATA, INSTANCE, ip,
                XV_X, 16,
                XV_Y, 156,
                XV_WIDTH, 0,
                XV_HEIGHT, 0,
                PANEL_LABEL_BOLD, TRUE,
                NULL);
        return obj;
}

/*
 * Create object 'auto_osc_rate_msg' in the specified instance.

 */
Xv_opaque
xvid_auto_popup_auto_osc_rate_msg_create(ip, owner)
        caddr_t         ip;
        Xv_opaque       owner;
{
        Xv_opaque       obj;

        obj = xv_create(owner, PANEL_MESSAGE,
                XV_KEY_DATA, INSTANCE, ip,
                XV_X, 16,
                XV_Y, 180,
                XV_WIDTH, 0,
                XV_HEIGHT, 0,
                PANEL_LABEL_BOLD, TRUE,
                NULL);
        return obj;
}

/*
 * Initialize an instance of object 'slice_popup'.
 */
xvid_slice_popup_objects *
xvid_slice_popup_objects_initialize(ip, owner)
        xvid_slice_popup_objects        *ip;
        Xv_opaque       owner;
{
        if (!ip && !(ip = (xvid_slice_popup_objects *) calloc(1, sizeof (xvid_slice_popu
p_objects))))
                return (xvid_slice_popup_objects *) NULL;
        if (!ip->slice_popup)
                ip->slice_popup = xvid_slice_popup_slice_popup_create(ip, owner);
        if (!ip->slice_controls)
                ip->slice_controls = xvid_slice_popup_slice_controls_create(ip, ip->slice
_popup);
        if (!ip->slice_start_button)
                ip->slice_start_button = xvid_slice_popup_slice_start_button_create(ip, i
p->slice_controls);
        if (!ip->slice_stop_button)
                ip->slice_stop_button = xvid_slice_popup_slice_stop_button_create(ip, ip-
>slice_controls);
        if (!ip->slice_fit_button)
                ip->slice_fit_button = xvid_slice_popup_slice_fit_button_create(ip, ip->s
lice_controls);
        if (!ip->slice_write_data)
                ip->slice_write_data = xvid_slice_popup_slice_write_data_create(ip, ip->s
lice_controls);
        if (!ip->slice_write_fit)
                ip->slice_write_fit = xvid_slice_popup_slice_write_fit_create(ip, ip->sli
ce_controls);
        if (!ip->slice_line_slider)
                ip->slice_line_slider = xvid_slice_popup_slice_line_slider_create(ip, ip-
>slice_controls);
        if (!ip->start_slice_slider)
                ip->start_slice_slider = xvid_slice_popup_start_slice_slider_create(ip, i
p->slice_controls);
        if (!ip->end_slice_slider)
                ip->end_slice_slider = xvid_slice_popup_end_slice_slider_create(ip, ip->s
lice_controls);
        if (!ip->slice_write_textfield)
                ip->slice_write_textfield = xvid_slice_popup_slice_write_textfield_create
(ip, ip->slice_controls);
        return ip;
}

/*
 * Create object 'slice_popup' in the specified instance.

 */
Xv_opaque
xvid_slice_popup_slice_popup_create(ip, owner)
        caddr_t         ip;
        Xv_opaque       owner;
{
        Xv_opaque       obj;

        obj = xv_create(owner, FRAME_CMD,
                XV_KEY_DATA, INSTANCE, ip,
                XV_WIDTH, 277,
                XV_HEIGHT, 218,
                XV_LABEL, "Slice Controls",
                XV_SHOW, FALSE,
                FRAME_SHOW_FOOTER, TRUE,
                FRAME_SHOW_RESIZE_CORNER, TRUE,
                FRAME_CMD_PUSHPIN_IN, TRUE,
                NULL);
        xv_set(xv_get(obj, FRAME_CMD_PANEL), WIN_SHOW, FALSE, NULL);
        return obj;
}

/*
 * Create object 'slice_controls' in the specified instance.

 */
Xv_opaque
```

xvid_ui.c

```
xvid_slice_popup_slice_controls_create(ip, owner)
        caddr_t         ip;
        Xv_opaque       owner;
{
        Xv_opaque       obj;

        obj = xv_create(owner, PANEL,
                XV_KEY_DATA, INSTANCE, ip,
                XV_X, 0,
                XV_Y, 0,
                XV_WIDTH, WIN_EXTEND_TO_EDGE,
                XV_HEIGHT, WIN_EXTEND_TO_EDGE,
                WIN_BORDER, FALSE,
                NULL);
        return obj;
}

/*
 * Create object 'slice_start_button' in the specified instance.
 */
Xv_opaque
xvid_slice_popup_slice_start_button_create(ip, owner)
        caddr_t         ip;
        Xv_opaque       owner;
{
        extern void             width_notify();
        Xv_opaque       obj;

        obj = xv_create(owner, PANEL_BUTTON,
                XV_KEY_DATA, INSTANCE, ip,
                XV_X, 16,
                XV_Y, 16,
                XV_WIDTH, 47,
                XV_HEIGHT, 19,
                PANEL_LABEL_STRING, "Start",
                PANEL_NOTIFY_PROC, width_notify,
                NULL);
        return obj;
}

/*
 * Create object 'slice_stop_button' in the specified instance.
 */
Xv_opaque
xvid_slice_popup_slice_stop_button_create(ip, owner)
        caddr_t         ip;
        Xv_opaque       owner;
{
        extern void             stop_notify();
        Xv_opaque       obj;

        obj = xv_create(owner, PANEL_BUTTON,
                XV_KEY_DATA, INSTANCE, ip,
                XV_X, 96,
                XV_Y, 16,
                XV_WIDTH, 45,
                XV_HEIGHT, 19,
                PANEL_LABEL_STRING, "Stop",
                PANEL_NOTIFY_PROC, stop_notify,
                NULL);
        return obj;
}

/*
 * Create object 'slice_fit_button' in the specified instance.
 */
Xv_opaque
xvid_slice_popup_slice_fit_button_create(ip, owner)
        caddr_t         ip;
        Xv_opaque       owner;
{
        extern void             fit_notify();
        Xv_opaque       obj;

        obj = xv_create(owner, PANEL_BUTTON,
                XV_KEY_DATA, INSTANCE, ip,
                XV_X, 176,
                XV_Y, 16,
                XV_WIDTH, 40,
                XV_HEIGHT, 19,
                PANEL_LABEL_STRING, " fit ",
                PANEL_NOTIFY_PROC, fit_notify,
                NULL);
        return obj;
}

/*
 * Create object 'slice_write_data' in the specified instance.
 */
Xv_opaque
xvid_slice_popup_slice_write_data_create(ip, owner)
        caddr_t         ip;
        Xv_opaque       owner;
{
        extern void             slice_data_write_notify();
        Xv_opaque       obj;

        obj = xv_create(owner, PANEL_BUTTON,
                XV_KEY_DATA, INSTANCE, ip,
                XV_X, 32,
                XV_Y, 56,
                XV_WIDTH, 82,
                XV_HEIGHT, 19,
                PANEL_LABEL_STRING, "Write Data",
                PANEL_NOTIFY_PROC, slice_data_write_notify,
                NULL);
        return obj;
}

/*
 * Create object 'slice_write_fit' in the specified instance.
 */
Xv_opaque
xvid_slice_popup_slice_write_fit_create(ip, owner)
        caddr_t         ip;
        Xv_opaque       owner;
{
        extern void             fit_write_notify();
        Xv_opaque       obj;

        obj = xv_create(owner, PANEL_BUTTON,
                XV_KEY_DATA, INSTANCE, ip,
                XV_X, 140,
```

xvid_ui.c 11

```
                XV_Y, 56,
                XV_WIDTH, 70,
                XV_HEIGHT, 19,
                PANEL_LABEL_STRING, "Write Fit",
                PANEL_NOTIFY_PROC, fit_write_notify,
                NULL);
        return obj;
}

/*
 * Create object `slice_line_slider' in the specified instance.

 */
Xv_opaque
xvid_slice_popup_slice_line_slider_create(ip, owner)
        caddr_t         ip;
        Xv_opaque       owner;
{
        extern int              set_slice_line();
        Xv_opaque       obj;

        obj = xv_create(owner, PANEL_SLIDER,
                XV_KEY_DATA, INSTANCE, ip,
                XV_X, 8,
                XV_Y, 104,
                XV_WIDTH, 254,
                XV_HEIGHT, 20,
                PANEL_VALUE_X, 86,
                PANEL_VALUE_Y, 104,
                PANEL_SLIDER_WIDTH, 80,
                PANEL_LABEL_STRING, "Slice Line:",
                PANEL_LAYOUT, PANEL_HORIZONTAL,
                PANEL_DIRECTION, PANEL_HORIZONTAL,
                PANEL_SLIDER_END_BOXES, FALSE,
                PANEL_SHOW_RANGE, TRUE,
                PANEL_SHOW_VALUE, TRUE,
                PANEL_MIN_VALUE, 0,
                PANEL_MAX_VALUE, 475,
                PANEL_TICKS, 0,
                PANEL_NOTIFY_PROC, set_slice_line,
                NULL);
        return obj;
}

/*
 * Create object `start_slice_slider' in the specified instance.

 */
Xv_opaque
xvid_slice_popup_start_slice_slider_create(ip, owner)
        caddr_t         ip;
        Xv_opaque       owner;
{
        extern int              set_start_slice();
        Xv_opaque       obj;

        obj = xv_create(owner, PANEL_SLIDER,
                XV_KEY_DATA, INSTANCE, ip,
                XV_X, 8,
                XV_Y, 132,
                XV_WIDTH, 256,
                XV_HEIGHT, 20,
                PANEL_VALUE_X, 88,
                PANEL_VALUE_Y, 132,
                PANEL_SLIDER_WIDTH, 80,
                PANEL_LABEL_STRING, "Start Slice:",
                PANEL_LAYOUT, PANEL_HORIZONTAL,
                PANEL_DIRECTION, PANEL_HORIZONTAL,
                PANEL_SLIDER_END_BOXES, FALSE,
                PANEL_SHOW_RANGE, TRUE,
                PANEL_SHOW_VALUE, TRUE,
                PANEL_MIN_VALUE, 0,
                PANEL_MAX_VALUE, 640,
                PANEL_TICKS, 0,
                PANEL_NOTIFY_PROC, set_start_slice,
                NULL);
        return obj;
}

/*
 * Create object `end_slice_slider' in the specified instance.

 */
Xv_opaque
xvid_slice_popup_end_slice_slider_create(ip, owner)
        caddr_t         ip;
        Xv_opaque       owner;
{
        extern int              set_end_slice();
        Xv_opaque       obj;

        obj = xv_create(owner, PANEL_SLIDER,
                XV_KEY_DATA, INSTANCE, ip,
                XV_X, 8,
                XV_Y, 160,
                XV_WIDTH, 257,
                XV_HEIGHT, 20,
                PANEL_VALUE_X, 89,
                PANEL_VALUE_Y, 160,
                PANEL_SLIDER_WIDTH, 80,
                PANEL_LABEL_STRING, "End Slice:  ",
                PANEL_LAYOUT, PANEL_HORIZONTAL,
                PANEL_DIRECTION, PANEL_HORIZONTAL,
                PANEL_SLIDER_END_BOXES, FALSE,
                PANEL_SHOW_RANGE, TRUE,
                PANEL_SHOW_VALUE, TRUE,
                PANEL_MIN_VALUE, 0,
                PANEL_MAX_VALUE, 640,
                PANEL_TICKS, 0,
                PANEL_NOTIFY_PROC, set_end_slice,
                NULL);
        return obj;
}

/*
 * Create object `slice_write_textfield' in the specified instance.

 */
Xv_opaque
xvid_slice_popup_slice_write_textfield_create(ip, owner)
        caddr_t         ip;
        Xv_opaque       owner;
{
        Xv_opaque       obj;

        obj = xv_create(owner, PANEL_TEXT,
                XV_KEY_DATA, INSTANCE, ip,
                XV_X, 12,
```

```
                XV_Y, 192,
                XV_WIDTH, 252,
                XV_HEIGHT, 15,
                PANEL_LABEL_STRING, "Write To:",
                PANEL_VALUE_X, 80,
                PANEL_VALUE_Y, 192,
                PANEL_LAYOUT, PANEL_HORIZONTAL,
                PANEL_VALUE_DISPLAY_LENGTH, 23,
                PANEL_VALUE_STORED_LENGTH, 80,
                PANEL_READ_ONLY, FALSE,
                NULL);
        return obj;
}
```

xvid_colors.c 1

```
/* general graphics setups */


#include "xvid_includes.h"


/*--------------------------*/
void setup_graphics_defaults()
{
  dpy = XOpenDisplay(NULL);            /* !! the best way ? */
  default_screen = DefaultScreen(dpy);
  default_visual = DefaultVisual(dpy, default_screen);
  default_cmap   = DefaultColormap(dpy, default_screen);
  default_depth  = DefaultDepth(dpy, default_screen);
  if (default_depth != 8)
    fprintf(stderr, "M3: Warning - not an 8 bit plane display\n");

  gc = DefaultGC(dpy, default_screen);
}


/*--------------------------*/
void read_installed_colourmap()
{
  int n;

  /* Initialise the pixel entries */
  for (n = 0; n < MAX_COLOURS; n++)
    x_cells[n].pixel = (long) n;

  XQueryColors(dpy, default_cmap, x_cells, MAX_COLOURS);

  /* Now put them into our 8 bit resolution colourmap */
  for (n = 0; n < MAX_COLOURS; n++) {
     colour_map.red[(int) x_cells[n].pixel] = (ui8) (x_cells[n].red >> 8);
     colour_map.grn[(int) x_cells[n].pixel] = (ui8) (x_cells[n].green >> 8);
     colour_map.blu[(int) x_cells[n].pixel] = (ui8) (x_cells[n].blue >> 8);
  }
}


/*-----------------------------------------------*/
int allocate_colours()  /* get as many as possible */
{
  int n;

  x_free = MAX_COLOURS;
  for (n = 0; n < MAX_COLOURS; n++)   /* so we know where we are */
     x_pixels[n] = 0;

  while (TRUE)
  {
     if (XAllocColorCells(dpy, default_cmap, False, x_plane_masks, 0, x_pixels, x_free))
        break;
     x_free -= 1;
     if (x_free == 0)
        break;
  }
  fprintf(stderr, "\nM3: Allocated %d read/write colourcells.\n\n", x_free);
  return(x_free);
}


/*------------------------------------------------------------*/

void install_our_colourmap()  /* put colours into hardware palette */
{
  if (x_free > 0)
     XStoreColors(dpy, default_cmap, x_our_cells, x_free);
}


/*--------------------------------------------------------------------*/
/* This routine generates a colourmap based on 3 red, 3 green and 2 blue */
/* bits - like a 3:3:2 DirectColor colourmap.                           */
/* The idea is that incoming pixels can be shifted to generate          */
/* the index into the colourmap very quickly.                           */
/* Related functions are rt_hash(r,g,b) and the data structures -       */
/* rt_hash_to_pixel look up table.                                      */
/* Note with less free colours the algorithm works much slower.         */
/*--------------------------------------------------------------------*/
void generate_rt_hash_colour_cmap()
{
  int r_level, g_level, b_level;
  int colour_no;
  int hash_index;

  /* Generate table of colours and the index - notice the brightness
   * colours are used first
   * also we will use the XColor structure for convenience.
   * This loop is biassed against bright reds - they get done last !
   */
  colour_no = 0;
  for (r_level = 0; r_level <= 7; r_level++)       /* total number of red possibilities
*/
    for (g_level = 7; g_level >= 0; g_level--)     /* total number of green possibilities
*/
       for (b_level = 3; b_level >= 0; b_level--)  /* total number of blue possibilities
*/
       {
         /* x_pixel tells us how our x_free colours are indexed with pixel values */
         if (colour_no < x_free)
            x_our_cells[colour_no].pixel = (long) x_pixels[colour_no];
         else
            x_our_cells[colour_no].pixel = 999; /* means not allocated */

         x_our_cells[colour_no].red   = (ui16) ((r_level << 5) | 0x08) << 8;
         x_our_cells[colour_no].green = (ui16) ((g_level << 5) | 0x08) << 8;
         x_our_cells[colour_no].blue  = (ui16) ((b_level << 6) | 0x08) << 8;

         x_our_cells[colour_no].flags = DoRed | DoGreen | DoBlue;  /* update all values *
/


         /* now set rt_hash_table[] structure as a fast LUT */
         hash_index = (int) ( (ui8) (r_level << 5) | (g_level << 2) | b_level) & 0xff;
         rt_hash_to_pixel[hash_index] = x_our_cells[colour_no].pixel;
         colour_no++;
       }
  /* OK we now have our array of 256 colours using 3:3:2 direct colour */
}


/*--------------------------------------------------------------------*/
/* This routine generates a colourmap based on a 7 bits of grayscale -  */
/* 128 levels.                                                          */
/* Note with less free colours the algorithm works much slower.         */
/*--------------------------------------------------------------------*/
void generate_rt_hash_gray_cmap()
{
```

xvid_colors.c 2

```
  int g_level;
  int colour_no;
  int hash_index;

  /* Generate table of colours and the index - notice the brightness
   * gray levels are used first
   * also we will use the XColor structure for convenience.
   */
  g_level = 255;
  for (colour_no = 0; colour_no < x_free; colour_no++)
  {
     /* x_pixel tells us how our x_free colours are indexed with pixel values */
     if (colour_no < x_free)
        x_our_cells[colour_no].pixel = (long) x_pixels[colour_no];
     else
        x_our_cells[colour_no].pixel = 999; /* means not allocated */

     if (colour_no < 128) {   /* 0..127 = 128 gray levels */
       x_our_cells[colour_no].red   = (ui16) g_level << 8;
       x_our_cells[colour_no].green = (ui16) x_our_cells[colour_no].red;
       x_our_cells[colour_no].blue  = (ui16) x_our_cells[colour_no].red;
       g_level -= 2;
     }
     else {
       g_level++;
       x_our_cells[colour_no].red   = (ui16) g_level << 8;
       x_our_cells[colour_no].green = (ui16) x_our_cells[colour_no].red;
       x_our_cells[colour_no].blue  = (ui16) x_our_cells[colour_no].red;
     }
     x_our_cells[colour_no].flags = DoRed | DoGreen | DoBlue;  /* update all values */

     /* now set rt_hash_table[] structure as a fast LUT */
     hash_index = (int) (ui8) 127 - colour_no;
     rt_hash_to_pixel[hash_index] = x_our_cells[colour_no].pixel;
  }
  /* OK we now have our array of 128 gray levels using a 7 bit direct colourmap */
}


/*-------------------------------------------------------------------------*/
/* This function takes a 24 bit RGB value and returns the closest colour in
 * the X servers colourmap using our fast hashing technique - Real Time one.
 */
ui16 rt_hash_pixel(red, green, blue)
ui8 red, green, blue;
{
  ui16 pixel;
  int hash_index;

  hash_index = (int) ( (red & 0xC0) | ((green >> 3) & 0x1C) | ((blue >> 6) & 0x03) );
  pixel = rt_hash_to_pixel[hash_index];
  if (pixel != 999)
     return(pixel);
  else
     return(find_closest_colour(red, green, blue));  /* hash function failed */
}


/*-------------------------------------------------------------------------*/
/* This function takes an 8 bit value and returns the closest colour in
 * the X servers colourmap using our fast hashing technique - Real Time one.
 */
ui16 rt_gray_pixel(in_pixel)
ui8 in_pixel;
{
  ui16 pixel;
  int hash_index;

  hash_index = (int) (in_pixel >> 1);
  pixel = rt_hash_to_pixel[hash_index];
  if (pixel != 999)
     return(pixel);
  else
     return(find_closest_colour(in_pixel, in_pixel, in_pixel)); /* hash function failed *
/
}


/*-------------------------------------------------------------------------*/
/* This function takes a 24 bit RGB value and returns the closest colour in
 * the X servers colourmap using our generated index from the histogram.
 */
ui16 ol_hash_pixel(red, green, blue)  /* off line hashing */
ui8 red, green, blue;
{
  register red_i, green_i, blue_i;
  register int pixel, pixel_index;
  int hash_index;

  /* !! note 0xf0 - varies with BITS_PER_COLOUR - done for speed */
  red_i   = ( (int) red & 0xf0) << BITS_PER_COLOUR;
  green_i = (int) green & 0xf0;
  blue_i  = (int) blue >> BITS_PER_COLOUR;

  hash_index = red_i | green_i | blue_i;
  pixel_index = hist_global[hash_index].colour_map_index;

  if (pixel_index != -1)
     return(x_pixels[pixel_index]);         /* map our pixel index to X pixel */
  else
    return(find_closest_colour(red, green, blue));   /* hash function failed */
}


/*-------------------------------------------------------------------------*/
/* This function takes an 8 bit value and returns the closest colour in
 * the X servers colourmap using our generated index from the histogram.
 */
ui16 ol_gray_pixel(in_pix)  /* off line hashing */
ui8 in_pix;
{
  register int index;
  register int pixel, pixel_index;
  int hash_index;

  hash_index = (int) in_pix;
  pixel_index = hist_global[hash_index].colour_map_index;

  if (pixel_index != -1)
     return(x_pixels[pixel_index]);         /* map our pixel index to X pixel */
  else
    return(find_closest_colour(in_pix, in_pix, in_pix)); /* hash function failed */
}


/*-------------------------------------------------------------------------*/
/* This routine computes the closest colour to the one supplied using */
/* the least squares algorithm.                                        */
```

xvid_colors.c 3

```
/*---------------------------------------------------------------------*/
int find_closest_colour(red, green, blue)
u18 red, green, blue;
{
  int best_so_far = 31234567;        /* > 255 * 255 * 3 */
  register int n, closeness;
  register int r_diff, g_diff, b_diff;
  u18 pixel;
  int fb = 0;

  /* for each colour in the installed colourmap */
  for (n = 0; n < MAX_COLOURS; n++)
  {
     r_diff = abs((int) red   - (int) colour_map.red[n]);  /* !! make abs a #define */
     g_diff = abs((int) green - (int) colour_map.grn[n]);  /* better still add offset to
 index */
     b_diff = abs((int) blue  - (int) colour_map.blu[n]);  /* and make LUT twice the siz
e ? */

     closeness = square_lut_red[r_diff] +
                 square_lut_green[g_diff] +
                 square_lut_blue[b_diff];

     if (closeness < best_so_far) {
        best_so_far = closeness;
        pixel = n;
     }
  }

  return(pixel);
}

/*---------------------------------------------------------------------*/
void generate_square_luts() /* Generate 8 x 8 square function LUT */
{
  int a;

  for (a = 0; a < MAX_COLOURS; a++)  /* we could weight r,g,b separately if we wanted */
     square_lut_red[a] = a * a;      /* however tests showed little difference */

  for (a = 0; a < MAX_COLOURS; a++)
     square_lut_green[a] = a * a;

  for (a = 0; a < MAX_COLOURS; a++)
     square_lut_blue[a] = a * a;
}
```

xvid_xwindows.c

1

```
/* XView runtime setups - different from Devguide */

#include "xvid_includes.h"

/*----------------------------------------------------------------*/
void set_slider_default()
{
  char          msg[20];

  xv_set(xvid_basewin->rate_slider,
        PANEL_NOTIFY_LEVEL, PANEL_ALL,
        PANEL_VALUE,        5,
        NULL);

  xv_set(xvid_basewin->white_slider,
        PANEL_NOTIFY_LEVEL, PANEL_ALL,
        PANEL_VALUE,        212,
        NULL);

  xv_set(xvid_basewin->black_slider,
        PANEL_NOTIFY_LEVEL, PANEL_ALL,
        PANEL_VALUE,        80,
        NULL);

  xv_set(xvid_basewin->clamp_slider,
        PANEL_NOTIFY_LEVEL, PANEL_ALL,
        PANEL_VALUE,        80,
        NULL);

  xv_set(xvid_slice_popup->slice_line_slider,
        PANEL_NOTIFY_LEVEL, PANEL_ALL,
        PANEL_VALUE,        0,
        NULL);

  xv_set(xvid_slice_popup->start_slice_slider,
        PANEL_NOTIFY_LEVEL, PANEL_ALL,
        PANEL_VALUE,        0,
        NULL);

  xv_set(xvid_slice_popup->end_slice_slider,
        PANEL_NOTIFY_LEVEL, PANEL_ALL,
        PANEL_VALUE,        640,
        NULL);

  sprintf(msg,"/cl/data/");
  xv_set(xvid_auto_popup->auto_write_textfield, PANEL_VALUE, msg, NULL);
  xv_set(xvid_slice_popup->slice_write_textfield, PANEL_VALUE,msg,NULL);
}

/*----------------------------------------------------------------*/
void set_window_sizes()  /* according to status info */
{
  xv_set(xvid_rheed_slice->rheed_slice,
        XV_W[illegible] [illegible]atus.image_width,
        XV_[illegible] [illegible]tatus.image_height,
        NULL);
  xv_set(xvid_rheed_slice->slice_canvas,
        XV_WIDTH, WIN_EXTEND_TO_EDGE,
        XV_HEIGHT, WIN_EXTEND_TO_EDGE,
        NULL);
  xv_set(xvid_full_video->full_video,
        XV_WIDTH, status.image_width,
        XV_HEIGHT, status.image_height,
        NULL);
  xv_set(xvid_full_video->full_video_canvas,
        XV_WIDTH, WIN_EXTEND_TO_EDGE,
        XV_HEIGHT, WIN_EXTEND_TO_EDGE,
        NULL);
}
```

low_level.c 1

```
        // sccs id[] = "@(#)low_level.c, v2.0";

#include "example.h"

/*--------------------------*/
u18 get_default_colour_level()
{
  char hwstring[80];

  s2200_hwopt(hwstring);
  if (strstr(hwstring, OPT_PAL) != NULL)
    return (DEFAULT_COLOUR_PAL);
  else if (strstr(hwstring, OPT_NTSC) != NULL)
    return (DEFAULT_COLOUR_NTSC);
  else
  {
    fprintf(stderr, "S2200: unknown colour option - in 'get_default_colour_level'\n");
    return (0);
  }
}

/*---------------*/
void s2200_ioctl(n)
int n;
{
  int fd;

  fd = s2200_getfd();
  if ( ioctl(fd,n,0) )
  { /* serious problem */
    fprintf(stderr, "S2200: ioctl failed - in 's2200_ioctl'\n");
  }
  return;
}

/*------------------------------------------------------*/
void snap()  /* capture the image - note V_POST action */
{
  s2200_ioctl( IOSFG_SNAP );
  if ( vcon.vcon2 & V_POST )  /* set the shadow registers to the same as the board */
    vcon.vcon2 &= ~V_MODE;
}

/*------------------------------------------------------------------------*/

void s2200_string_ioctl(n,str)   /* returns a string value from the driver */
int n;
char str[];          /* do not need to validate str as driver uses copyout */
{
  int fd;

  fd = s2200_getfd();
  if ( ioctl(fd,n,&str) )
  {  /* serious problem - a useless error message! */
    fprintf(stderr, "S2200: ioctl failed - in 's2200_string_ioctl'\n");
  }
  return;
}

/*-------------------------------------------------------------------------*/
void s2200_hwopt(str)   /* returns the s2200 hardware option string ( FCode ) */
char str[];
{
  s2200_string_ioctl(IOSFG_HWOPT,str);
}

/*-----------------------------------------------------------------*/
void set_ccir_or_eia() /* sets up display height and width globals */
{
  char hwstring[80];

  s2200_hwopt(hwstring);
  if ( strstr(hwstring,OPT_EIA) != NULL )
  { /* board is 60 Hz, 480 lines */
    full_width = 640;
    full_height = 480;
    status.display_width = full_width;
    status.display_height = full_height;
  }
  else
  { /* board is 50Hz, 576 lines */
    full_width = 768;
    full_height = 576;
    status.display_width = full_width;
    status.display_height = full_height;
  }
  if ( strstr(hwstring,OPT_512) != NULL )
  { /* 512 pixels full screen sampling */
    full_width = 512;
    status.display_width = full_width;
  }
}

/*-------------*/
int s2200_getfd()
{
  char s2200_name[20];

  if (s2200_fd < 0)  /* device not opened */
  {
    /* calculate full path to descriptor */
    sprintf(s2200_name,"%s%d",s2200_device,s2200_unit);

    /* open s2200 driver(n) */
    s2200_fd = open(s2200_name,O_RDWR);
    if ( s2200_fd < 0 )
```

low_level.c 2

```
    { /* open failed */
      fprintf(stderr,"\nS2200: Device driver open failed - in 's2200_getfd'\n");
      return(-1);
    }
  }
  return(s2200_fd);
}


/*---------------------------------------------------------------------*/
/* s2200_mapin takes a slot offset and returns a virtual mapping*/
/* Note - written for SPARC - casting to ui32 may be dubious    */
/* on other processors                                          */
/*---------------------------------------------------------------------*/
char *s2200_mapin(offset,size)
ui32 offset,size;
{
  ui32 pagesize, base_address, page_offset, vaddr, nbytes;
  int fd;

  if ( ( fd = s2200_getfd() ) < 0 )
    return(NULL);            /* cannot map if driver unopenable */

  pagesize = getpagesize(); /* need to know system MMU boundary */
  base_address = offset & ~( pagesize - 1 ); /* address to map to */
  page_offset = offset - base_address;
                        /* address in page where device is located */

  nbytes = page_offset + size;
  vaddr = (ui32) mmap(NULL,nbytes,PROT_READ|PROT_WRITE,MAP_SHARED,fd,base_address);
  if (vaddr == -1)
  { /* mmap failed */
    fprintf(stderr,"S2200: device mmap failed - 'in s2200_mapin'");
    return(NULL);
  }
  return( (char*) (vaddr + page_offset));
}


/*--------------------*/
void s2200_map_devices()
{
  struct s2200_offsets offset_table;
  int fd;

  fd = s2200_getfd();
  if (fd < 0)
  {
    fprintf(stderr, "\nS2200: Failed to get fd - in 's2200_map_devices'\n");
    exit(0);
  }
  if ( ioctl(fd,IOSFG_OFFSETS,&offset_table) )
  { /* could not get addressing information */
    fprintf(stderr,"S2200: Device offset fetch failed - in 's2200_map_devices'\n");
  }
  else /* map in devices */
  {
    bt473 = (Bt473_t *)s2200_mapin(offset_table.Bt473,sizeof(Bt473_t));
    bt253 = (Bt253_t *)s2200_mapin(offset_table.Bt253,sizeof(Bt253_t));
    bt281 = (Bt281_t *)s2200_mapin(offset_table.Bt281,sizeof(Bt281_t));
    vram = (char *)s2200_mapin(offset_table.vram,offset_table.vram_size);
    s2200_vram_size = offset_table.vram_size;
  }
}


/*---------------------------------------------------------------------------------*/
void s2200_flush_vcon()  /* write out the VCON registers during field blanking */
{
  int fd;

  fd = s2200_getfd();
  if ( ioctl(fd,IOSFG_VCON,&vcon) )
  { /* could not write vcon area */
    fprintf(stderr, "S2200: vcon area inaccessible - in 's2200_flush_vcon'\n");
  }
}


/*-------------------------------------------------------------*/
void s2200_waitnvb(n)  /* wait n vertical blanking periods */
int n;
{
  int fd;

  fd = s2200_getfd();
  if ( ioctl(fd,IOSFG_WAITVB,&n) )
  { /* serious problem */
    fprintf(stderr, "S2200: ioctl failed - in 's2200_waitnvb'\n");
  }
}
```

s2200_lib.c

1

```
static char sccs_id[] = "@(#)s2200_lib.c, v2.1";

#include "example.h"

/*-----------------------------------------------------------------------*/
void s2200_init_composite()  /* initialises global flags and the board */
{
  set_ccir_or_eia();    /* sets up status.display_width & height */

  bt473->command = EIGHTBIT | Bt473_FC24D | Bt281RESET;
  bt473->palette_read_mask = 0xff;           /* don't forget this one */
  bt253->command = ADC_DECODER | SYNC_NTSC | ADC_24TRUE | ADC_SYNC125;
  bt281->address_low  = Bt281_CR0 & 0xff;
  bt281->address_high = (Bt281_CR0 & 0x0300) >> 8;

  bt253->white = DEFAULT_WHITE_LEVEL;
  bt253->black = DEFAULT_BLACK_LEVEL;
  bt253->clamp = DEFAULT_CLAMP_LEVEL;
  bt253->color = get_default_colour_level();
  bt253->uv_offset = DEFAULT_UV_OFFSET;
  bt253->IOUT5 = 0;

  vcon.vcon1  = V_EXTERNAL;
  vcon.vcon2  = V_ENABLE | V_MODE | V_POST;
  vcon.vcon3 = 0;                 /* Contains interrupts - use ioctls: */
  s2200_ioctl(IOSFG_SYNCG);       /* sync on green */
  vcon.vcon4  = V_INTERLACED;
  vcon.vcon5  = V_FULL;
  vcon.vcon6a = V_X1;
  vcon.vcon6b = V_X1;
  vcon.vcon7a = 2;
  vcon.vcon7b = 0;
  s2200_set_vram_start_address(0);

  /* Now enable Bt281 - and we should have a picture ! */
  bt473->command = EIGHTBIT | Bt281_NOT_RESET | Bt473_FC24D;
  bt281->data = 0x00;
  bt281->data = 0xe0;             /* e1 to disable outputs */

  s2200_clear_overlay();
  s2200_setup_default_overlay_colours();
  s2200_write_ramp_to_luts();
  s2200_determine_image_size();  /* setup image size globals */
  s2200_flush_vcon();             /* write out VCON registers */
}

/*-----------------------------------------------------------------*/
void s2200_init_rgb()  /* initialises global flags and the board */
{
  s2200_init_composite();
  bt253->command |= ADC_RGB;   /* select CAV inputs */

  /* select sync on green input */
  bt253->command &= ~Bt253_SYNC_MASK;
  bt253->command |= SYNC_GVID1;
  s2200_flush_vcon();            /* write out VCON registers */
}

/*-----------------------------------------------------------------*/
void s2200_init_mono()  /* initializes global flags and the board */
{
  s2200_init_composite();
  bt253->command &= ~ADC_8PSEUDO;  /* mask the two bits */

  bt253->color = 0;               /* set analogue decoder to kill colour */
  bt253->command |= ADC_RGB;      /* select CAV inputs */
  bt253->command |= ADC_8PSEUDO;  /* pipe green to all outputs */

  /* select sync on green input */
  bt253->command &= ~Bt253_SYNC_MASK;
  bt253->command |= SYNC_GVID1;

  bt473->command &= ~Bt473_MODE_MASK;
  bt473->command |= EIGHTBIT | Bt473_PC8 | Bt281RESET;
  bt473->command |= Bt473_RED;   /* pipe red plane to all outputs */

  vcon.vcon1 |= V_MONO;
  s2200_flush_vcon();             /* write out VCON registers */
}

/*-----------------------------------------------------------------*/
/* s2200_select_comp_input - Select the composite input via the colour*/
/*                          decoder to feed into the ADCs.           */
/* Input parameters:                                                  */
/*   none                                                             */
/* Returns:                                                           */
/*   nothing                                                          */
/* Globals used/affected:                                             */
/*   two hardware registers read and updated                          */
/*-----------------------------------------------------------------*/
void s2200_select_comp_input()
{
  bt253->command &= ~ADC_RGB;  /* deselect CAV inputs */
  bt473->command &= ~SVIDEO;   /* deselect S-video    */
}

/*-----------------------------------------------------------------*/
/* s2200_select_svideo_input - Select the composite input via the    */
/*                             colour decoder to feed into the ADCs. */
/* Input parameters:                                                  */
/*   none                                                             */
/* Returns:                                                           */
/*   nothing                                                          */
```

s2200_lib.c 2

```
/* Globals used/affected:                                               */
/*   two hardware registers read and updated                            */
/*----------------------------------------------------------------------*/
void s2200_select_svideo_input()
{
  bt253->command &= ~ADC_RGB;  /* deselect CAV inputs */
  bt473->command |= SVIDEO;    /* select S-video      */
}


/*----------------------------------------------------------------------*/
/* s2200_select_rgb_input - Feed the RGB inputs into the ADCs and then*/
/*                          to each respective memory plane.            */
/* Input parameters:                                                    */
/*   none                                                               */
/* Returns:                                                             */
/*   nothing                                                            */
/* Globals used/affected:                                               */
/*   bt253 (digitizer) command register read and updated                */
/*----------------------------------------------------------------------*/
void s2200_select_rgb_input()
{
  bt253->command |= ADC_RGB;    /* select CAV inputs */
}


/*----------------------------------------------------------------------*/
/* s2200_select_green_input - Feeds the green input to the ADCs and    */
/*                            the digital output to all three planes. */
/* Input parameters:                                                    */
/*   none                                                               */
/* Returns:                                                             */
/*   nothing                                                            */
/* Globals used/affected:                                               */
/*   bt253 (digitizer) command register read and updated                */
/*----------------------------------------------------------------------*/
void s2200_select_green_input()
{
  bt253->command |= ADC_RGB;        /* select CAV inputs */
  bt253->command &= ~ADC_8PSEUDO;   /* mask the two bits */
  bt253->command |= ADC_8PSEUDO;    /* pipe green to all outputs */
}


/*----------------------------------------------------------------------*/
/* s2200_sync_off_colour_decoder - Strips the sync off the signal fed */
/*                                 into the colour decoder.  Note     */
/* that the selection is off the colour decoder.  The status of the   */
/* video input select determines whether it is the composite or the   */
/* S-Video signal off which the sync is actually taken from.           */
/* Input parameters:                                                    */
/*   none                                                               */
/* Returns:                                                             */
/*   nothing                                                            */
/* Globals used/affected:                                               */
/*   bt253 (d[illegible]) command register read and updated & vcon1     */
/*----------------------------------------------------------------------*/
void s2200_sync_off_colour_decoder()
{
  vcon.vcon1 |= V_EXTERNAL;
  bt253->command &= ~Bt253_SYNC_MASK;
  bt253->command |= SYNC_NTSC;
  s2200_flush_vcon();
}

void s2200_sync_off_green()   /* strip sync off green input */
{
  vcon.vcon1 |= V_EXTERNAL;
  bt253->command &= ~Bt253_SYNC_MASK;
  bt253->command |= SYNC_GVID1;
  s2200_flush_vcon();
}

void s2200_sync_off_red()     /* strip sync off red input */
{
  vcon.vcon1 |= V_EXTERNAL;
  bt253->command &= ~Bt253_SYNC_MASK;
  bt253->command |= SYNC_RVID1;
  s2200_flush_vcon();
}

void s2200_sync_off_blue()    /* strip sync off blue input */
{
  vcon.vcon1 |= V_EXTERNAL;
  bt253->command &= ~Bt253_SYNC_MASK;
  bt253->command |= SYNC_BVID1;
  s2200_flush_vcon();
}

void s2200_sync_off_direct()  /* strip sync off direct sync in */
{                             /* (TTL levels as standard)      */
  vcon.vcon1 |= V_EXTERNAL;
  bt253->command &= ~Bt253_SYNC_MASK;
  bt253->command |= SYNC_DIRECT;
  s2200_flush_vcon();
}

void s2200_sync_off_internal()
{
  vcon.vcon1 &= ~V_EXTERNAL;
  s2200_flush_vcon();
}

void s2200_sync_off_external()  /* use external syncs */
{
  vcon.vcon1 |= V_EXTERNAL;
  s2200_flush_vcon();
}


/*----------------------------------------------------------------------*/
/* s2200_sync_on_green_out - Puts syncs onto green video output (and  */
/*                           red and blue).                            */
/* Input parameters:                                                    */
/*   none                                                               */
/* Returns:                                                             */
/*   nothing                                                            */
/* Globals used/affected:                                               */
/*   vcon3 updated                                                      */
/*----------------------------------------------------------------------*/
void s2200_sync_on_green_out()
{
  s2200_ioctl(IOSFG_SYNCG);     /* put syncs on video */
}

void s2200_sync_off_green_out()  /* No syncs on green (or red/blue) */
{
  s2200_ioctl(IOSFG_NOSYNCG);
```

```
}

/*---------------------------------------------------------------------*/
/* s2200_live - Puts the board into acquisition mode.  It also sets   */
/*              the post capture bit to put the board into display   */
/* mode at the end of acquisition.                                    */
/* channel monochrome imaging.                                        */
/* Input parameters:                                                  */
/*   none                                                             */
/* Returns:                                                           */
/*   nothing                                                          */
/* Globals used/affected:                                             */
/*   vcon2 and vcon4 updated                                          */
/*---------------------------------------------------------------------*/
void s2200_live()
{
  vcon.vcon2 |= V_MODE | V_POST;  /* set to capture mode */
  vcon.vcon4 &= ~(V_EXT_TRIG | V_POLARITY);
  vcon.vcon4 |= V_INTERLACED;     /* force to interlaced */
  s2200_flush_vcon();
}


void s2200_capture()
{
  snap();
}


void s2200_freeze()
{
  fprintf(stderr, "\n*** Sorry not implemented in this release ***\n"); /*!!*/
}


/*---------------------------------------------------------------------*/
/* s2200_active_high_capture - Captures on an active high external    */
/*                             trigger.                               */
/* Input parameters:                                                  */
/*   none                                                             */
/* Returns:                                                           */
/*   nothing                                                          */
/* Globals used/affected:                                             */
/*   vcon4 updated                                                    */
/*---------------------------------------------------------------------*/
void s2200_active_high_capture()
{
  vcon.vcon4 |= V_EXT_TRIG | V_POLARITY;
  s2200_flush_vcon();
}


/*---------------------------------------------------------------------*/
/* s2200_mode_colour - Puts the board into colour mode - this  mode   */
/*                     enables all three video memory planes          */
/* simultaneously - thus allowing colour/stereoscopic or multiple     */
/* channel monochrome imaging.                                        */
/* NOTICE that this routine does not change the output palette        */
/* settings, which may also need to be changed to display the image in*/
/* colour.                                                            */
/* Input parameters:                                                  */
/*   none                                                             */
/* Returns:                                                           */
/*   nothing                                                          */
/* Globals used/affected:                                             */
/*   vcon1 updated                                                    */
/*---------------------------------------------------------------------*/
void s2200_mode_colour()  /* video access to all three planes */
{
  vcon.vcon1 &= ~V_MONO;
  s2200_flush_vcon();
}

void s2200_mode_mono()    /* video access to one memory plane */
{
  vcon.vcon1 |= V_MONO;
  s2200_flush_vcon();
}

void s2200_mode_interlaced()
{
  vcon.vcon4 |= V_INTERLACED;  /* affects syncs and memory access */
  s2200_flush_vcon();
}

void s2200_mode_non_interlaced()
{
  vcon.vcon4 &= ~V_INTERLACED;
  s2200_flush_vcon();
}


void s2200_512_image()
{
  vcon.vcon5 = V_512;
  s2200_flush_vcon();
}

void s2200_full_screen_image()
{
  vcon.vcon5 = V_FULL;
  s2200_flush_vcon();
}


/*---------------------------------------------------------------------*/
/* s2200_bars - Generates bars test patterns - colour bars in colour  */
/*              and monochrome (grayscale) bars in mono mode.         */
/* NOTE that the operation of the board is not checked - i.e. if in   */
/* live mode, the test pattern will be written, but obviously over-   */
/* written immediately.                                               */
/* Input parameters:                                                  */
/*   none                                                             */
/* Returns:                                                           */
/*   nothing                                                          */
/* Globals used/affected:                                             */
/*   reads status, then writes to video memory.                       */
/*---------------------------------------------------------------------*/
void s2200_bars()  /* only sensible in display mode */
{
  ui32 *vram_word_ptr;    /* SBus convention - 32 bit words */
  ui8  *vram_byte_ptr;
  int line, pixel, bar_width;

  vram_word_ptr = (ui32*) vram;
  bar_width = status.display_width/8;
  for (line = 0; line < status.display_height; line++)
```

s2200_lib.c

4

```
  {
    for (pixel = 0; pixel < bar_width; pixel++)
      *vram_word_ptr++ = 0x0000ffff;     /* 1st bar - Yellow  */
    for (pixel = 0; pixel < bar_width; pixel++)
      *vram_word_ptr++ = 0x00ffff00;     /* 2nd bar - Cyan    */
    for (pixel = 0; pixel < bar_width; pixel++)
      *vram_word_ptr++ = 0x0000ff00;     /* 3rd bar - Green   */
    for (pixel = 0; pixel < bar_width; pixel++)
      *vram_word_ptr++ = 0x00ff00ff;     /* 4th bar - Magenta */
    for (pixel = 0; pixel < bar_width; pixel++)
      *vram_word_ptr++ = 0x000000ff;     /* 5th bar - Red     */
    for (pixel = 0; pixel < bar_width; pixel++)
      *vram_word_ptr++ = 0x00ff0000;     /* 6th bar - Blue    */
    for (pixel = 0; pixel < bar_width; pixel++)
      *vram_word_ptr++ = 0x00000000;     /* 7th bar - Black   */
    for (pixel = 0; pixel < bar_width; pixel++)
      *vram_word_ptr++ = 0x00ffffff;     /* 7th bar - White   */
  }
}


/*------------------------------------------------------------*/
void s2200_border()   /* Write a border in the overlay plane */
{
  char *vram_ptr;
  int line, pixel;

  vram_ptr = (char*) vram;
  if (s2200_in_interlaced_mode() == TRUE)
  {
    /* 1st field */
    for (line = 0; line < status.display_height/2; line++)
      for (pixel = 0; pixel < status.display_width; pixel++)
        if ((line < 4) || (line > ((status.display_height/2) - 5)) || (pixel < 8) || (pi
xel > (status.display_width-9)))
        {
          *vram_ptr = 1;
          vram_ptr += 4;
        }
        else
          vram_ptr += 4;

    /* 2nd field */
    for (line = 0; line < status.display_height/2; line++)
      for (pixel = 0; pixel < status.display_width; pixel++)
        if ((line < 4) || (line > ((status.display_height/2) - 5)) || (pixel < 8) || (pi
xel > (status.display_width-9)))
        {
          *vram_ptr = 1;
          vram_ptr += 4;
        }
        else
          vram_ptr += 4;
  }
  else
  {
    for (line = 0; line < status.display_height; line++)
      for (pixel = 0; pixel < status.display_width; pixel++)
        if ((line < 4) || (line > ((status.display_height) - 5)) || (pixel < 8) || (pixe
l > (status.display_width-9)))
        {
          *vram_ptr = 1;
          vram_ptr += 4;
        }
        else
          vram_ptr += 4;
  }
}


/*------------------------------------------------------------*/
void s2200_horizontal_ramp()   /* smooth grayscale tone */
{
  ui32 *vram_ptr, pel;
  int line, pixel, level, two_or_three;
  ui32 line_buf[768];

  if (status.display_width < 640)
    two_or_three = 2;
  else
    two_or_three = 3;

  /* Calculate ramp for each line in advance for speed */
  for (pixel = 0; pixel < status.display_width; pixel++)
  {
    level = pixel/two_or_three;
    pel = (level << 16) | (level << 8) | level; /* for R,G,B */
    line_buf[pixel] = pel;
  }

  vram_ptr = (ui32*) vram;
  for (line = 0; line < status.display_height; line++)
    for (pixel = 0; pixel < status.display_width; pixel++)
    {
      *vram_ptr++ = line_buf[pixel];
    }
}


/*------------------------------------------------------------*/
void s2200_vertical_ramp()   /* smooth grayscale tone */
{
  ui32 *vram_ptr, pel, level;
  int frame, line, pixel;

  vram_ptr = (ui32*) vram;
  if (s2200_in_interlaced_mode() == TRUE)
  {
    for (line = 0; line < status.display_height/2; line++)
    {
      level = line;
      if (level > 255)
        level = 255;
      pel = (level << 16) | (level << 8) | level; /* for R,G,B */

      for (pixel = 0; pixel < status.display_width; pixel++)
        *vram_ptr++ = pel;
    }

    for (line = 0; line < status.display_height/2; line++)
    {
      level = line;
      if (level > 255)
        level = 255;
      pel = (level << 16) | (level << 8) | level; /* for R,G,B */

      for (pixel = 0; pixel < status.display_width; pixel++)
        *vram_ptr++ = pel;
```

s2200_lib.c 5

```
    }

  }
  else  /* non-interlaced */
  {
    for (line = 0; line < status.display_height; line++)
    {
      level = line;
      if (level > 255)
        level = 255;
      pel = (level << 16) | (level << 8) | level; /* for R,G,B */

      for (pixel = 0; pixel < status.display_width; pixel++)
        *vram_ptr++ = pel;
    }
  }
}


/*-----------------------------------------------------------------------*/
/* s2200_set_vram_start_address - Sets the video memory start address */
/*                               by writing the appropriate nibbles  */
/* to the video control registers. A global is used to keep track to */
/* accelerate panning and scrolling.                                  */
/* Input parameters:                                                  */
/*   ui32 addr : start address                                        */
/* Returns:                                                           */
/*   nothing                                                          */
/* Globals used/affected:                                             */
/*   status.vram_start_address - updated                              */
/*-----------------------------------------------------------------------*/
void s2200_set_vram_start_address(addr)
ui32 addr;
{
  status.vram_start_address = addr;   /* use global to accelerate panning */
  vcon.vcon8a = addr & VCON_MASK;
  vcon.vcon8b = (addr >> 4) & VCON_MASK;
  vcon.vcon8c = (addr >> 8) & VCON_MASK;
  vcon.vcon8d = (addr >> 12) & VCON_MASK;
  vcon.vcon8e = (addr >> 16) & VCON_MASK;
  vcon.vcon8f = (addr >> 24) & VCON_MASK;
}


/*-----------------------------------------------------------------------*/
/* s2200_determine_image_size - Sets up globals that reflect the size */
/*                  the image - taking into account the sub-sampling*/
/* factors.  e.g. in 512 x 512 mode, with sub-sampling x 2, the image */
/* size would be 256 x 256 - this information is used for file saving */
/*  amongst other things.                                             */
/* Input parameters:                                                  */
/*   none                                                             */
/* Returns:                                                           */
/*   nothing                                                          */
/* Globals used/affected:                                             */
/*   status.image_width and .image_height are updated                 */
/*   status.display_width and . display_height are read               */
/*-----------------------------------------------------------------------*/
void s2200_determine_image_size()
{
  int divisor;

  switch (s2200_get_subsample())  /* read the vcon register */
  {
    case V_X1 : divisor = 1;
                break;
    case V_X2 : divisor = 2;
                break;
    case V_X4 : divisor = 4;
                break;
  }
  status.image_width = status.display_width / divisor;
  status.image_height = status.display_height / divisor;
}


void s2200_set_fcount(fcount)
ui8 fcount;
{
  vcon.vcon7a = fcount & VCON_MASK;
  vcon.vcon7b = (fcount >> 4) & VCON_MASK;
  s2200_flush_vcon();
}


/*-----------------------------------------------------------------------*/
/* s2200_clear_overlay() - clears down the overlay plane to 0        */   /* I
nput parameters:                                                     */
/*   none                                                              */
/* Returns:                                                            */
/*   nothing                                                           */
/* Globals used/affected:                                              */
/*   none                                                              */
/*-----------------------------------------------------------------------*/
void s2200_clear_overlay()
{
  s2200_set_overlay(0);
}


/*-----------------------------------------------------------------------*/
/* s2200_set_overlay() - sets the overlay plane to value specified   */   /* I
nput parameters:                                                     */
/*   value: value to set in all overlay plane                          */
/* Returns:                                                            */
/*   nothing                                                           */
/* Globals used/affected:                                              */
/*   none                                                              */
/*-----------------------------------------------------------------------*/
void s2200_set_overlay(value)
ui8 value;
{
  char *vram_ptr;
  int line, pixel;

  vram_ptr = (char*) vram;
  for (line = 0; line < 1024; line++)       /* !! should be #define */
    for (pixel = 0; pixel < 512; pixel++)
    {
      *vram_ptr = value;
      vram_ptr += 4;
    }
}


/*-----------------------------------------------------------------------*/
/* s2200_setup_default_overlay_colours - Sets up colours in the       */
```

s2200_lib.c 6

```
/*                                        overlay.                              */
/* Input parameters:                                                            */
/*   none                                                                       */
/* Returns:                                                                     */
/*   nothing                                                                    */
/* Globals used/affected:                                                       */
/*   none                                                                       */
/*------------------------------------------------------------------------------*/
void s2200_setup_default_overlay_colours()
{
  int data, loop;

  bt473->overlay_write_addr = 0x01; /*"base" address of LUT - colour 1 */

  bt473->overlay = 0xff; /* red - colour 1   */
  bt473->overlay = 0x00;
  bt473->overlay = 0x00;

  bt473->overlay = 0x00; /* green - colour 2 */
  bt473->overlay = 0xff;
  bt473->overlay = 0x00;

  bt473->overlay = 0x00; /* blue - colour 3  */
  bt473->overlay = 0x00;
  bt473->overlay = 0xff;

  bt473->overlay = 0x00; /* cyan - colour 4  */
  bt473->overlay = 0xff;
  bt473->overlay = 0xff;

  bt473->overlay = 0xff; /* magenta - colour 5  */
  bt473->overlay = 0x00;
  bt473->overlay = 0xff;

  bt473->overlay = 0xff; /* yellow - colour 6  */
  bt473->overlay = 0xff;
  bt473->overlay = 0x00;

  bt473->overlay = 0x00; /* light green - colour 7 */
  bt473->overlay = 0x7f;
  bt473->overlay = 0x00;

  /* Colours 8 to 15 - grey scale */
  for (loop = 0; loop < 8; loop++)
  {
    data = loop << 5;
    bt473->overlay = data;
    bt473->overlay = data;
    bt473->overlay = data;
  }
}


void s2200_overlay_on()
{
  vcon.vcon1 |= V_OVERLAY;
  s2200_flush_vcon();
}


void s2200_overlay_off()
{
  vcon.vcon1 &= ~V_OVERLAY;
  s2200_flush_vcon();
}


/*------------------------------------------------------------------------------*/
/* s2200_write_ramp_to_luts - Writes a ramp - i.e. an input = output  */
/*                            transfer function, to both input and    */
/*                            output LUTs.                            */
/* Input parameters:                                                  */
/*   none                                                             */
/* Returns:                                                           */
/*   nothing                                                          */
/* Globals used/affected:                                             */
/*   none                                                             */
/*--------------------------------------------------------------------*/
void s2200_write_ramp_to_luts() /* BETA: Only writes output - not 281+matrix*/
{
  int n;

  bt473->palette_write_addr = 0x0;
  for (n = 0; n < 256; n++)
  {
    bt473->palette = n; /* red   */
    bt473->palette = n; /* green */
    bt473->palette = n; /* blue  */
  }
}


/*----------------------------------------------------------------------*/
/* image_copy_32bit(source, dest, x, y, FLAG) - Copies an image, assumed */
/* to be 32 bits - RGB,alpha from source pointer to destination pointer. */
/* Red is bits D0..D7, green D8..D15 etc.                                */
/* Parameters:                                                           */
/*      source: Pointer to source image.                                 */
/*        dest: Pointer to destination image.                            */
/*           x: Width of image.                                          */
/*           y: Height of image.                                         */
/* The FLAG can be:                                                      */
/*        COPY: Simply copies image.                                     */
/* DEINTERLACE: De-interlaces - assumes field 1 stored before field 2 in */
/*              the input image.                                         */
/* REINTERLACE: Opposite of above.                                       */
/*----------------------------------------------------------------------*/
int image_copy_32bit(source, dest, x, y, flag)
ui32 *source;
ui32 *dest;
ui32 x;        /* width of image  */
ui32 y;        /* height of image */
ui32 flag;     /* equal to COPY, DEINTERLACE, REINTERLACE */
{
  register ui32 line, pixel, lines_per_field;
  register ui32 *field1_ptr, *field2_ptr;

  if (flag == COPY)
  {
    for (line = 0; line < y; line++)
      for (pixel = 0; pixel < x; pixel++)
      {
        *dest = *source;
        dest++; source++;
      }
  }
  else if (flag == DEINTERLACE)
  {
```

s2200_lib.c 7

```
    lines_per_field = y/2;
    field1_ptr = source;
    /* notice '4' in line below as 32 bit ints used */
    field2_ptr = (ui32*) ( (int) source + (x*lines_per_field)*4);
    for (line = 0; line < lines_per_field; line++)
    {
      for (pixel = 0; pixel < x; pixel++)
      {
        *dest++ = *field1_ptr++;
      }
      for (pixel = 0; pixel < x; pixel++)
      {
        *dest++ = *field2_ptr++;
      }
    }
  }
  else /* REINTERLACE */
  {
    lines_per_field = y/2;
    field1_ptr = dest;
    field2_ptr = (ui32*) dest + (x*lines_per_field);
    for (line = 0; line < lines_per_field; line++)
    {
      for (pixel = 0; pixel < x; pixel++)
      {
        *field1_ptr++ = *source++;
      }
      for (pixel = 0; pixel < x; pixel++)
      {
        *field2_ptr++ = *source++;
      }
    }
  }
}

/*------------------------------------------------------------------------
        The following functions were written/scavunged by DAC
------------------------------------------------------------------------*/
```

xvid_auto.c 1

```
#include "xvid_includes.h"

double running_time_average();
double running_width_average();
double savgol_time();
double savgol_width();
float outlier();

void
auto_start_notify(item, event)
        Panel_item      item;
        Event           *event;
{
        struct itimerval timer;
        Notify_client   me;
        char            *temp;
        float           time_interval;
        double          fsec;
        long int        usec;
        struct timeval  tp;
        struct timezone tzp;
        int             n;

printf("   \n");
        temp = "35";
        sscanf(temp, "%f", &time_interval);
        usec = (long int)(1000000 * modf((1 / time_interval), &fsec));

        timer.it_interval.tv_usec = timer.it_value.tv_usec = usec;
        timer.it_interval.tv_sec = timer.it_value.tv_sec = (long int) fsec;

        Dx = Dy = 0;
        Width = 640;
        Height = 480;

        FrameCount = ScanCount = TimeHold= 0;

        gettimeofday(&tp, &tzp);
        InitialTime = tp.tv_sec;
        AUTO = 1;
        peakcount = -1;
        oscflag = 0;
        Range =  status.rate/2;
        if (ROT)
            Range = 9;
        Half = (Range-1)/2;
        if (ROT)
            Points = status.rate/4;
        else
            Points = status.rate/3;

        printf("Rate: %d,     Range: %d,     Half: %d     Points: %d\n", status.rate,
Range, Half, Points);
        xv_set(xvid_auto_popup->auto_scan_rate_msg,PANEL_LABEL_STRING,"",NULL);
        xv_set(xvid_auto_popup->auto_osc_rate_msg,PANEL_LABEL_STRING,"",NULL);

        scale=0;
        for( n = 0; n < Range; ++n)
                scale += (((double) 1/(1+((n-Half < 0) ? -(n-Half):n-Half))));

        for(n=0; n <= 100; ++n)
                peak[n] = 0.0;
        XClearArea(dpy, xwinl_id, 0, 0, 0, 0, False);
        Colnum=1;
}


void
auto_stop_notify(item, event)
        Panel_item      item;
        Event           *event;
{
        float           slope;
        char            msg[20];

        xv_set(xvid_auto_popup->auto_scan_rate_msg, PANEL_LABEL_STRING, "", NULL);
        AUTO = 0;
        slope = outlier();

    if (COUNT) {
        sprintf(msg, "Final Growth Rate: %3.2f ml/sec", slope);
        xv_set(xvid_auto_popup->auto_scan_rate_msg, PANEL_LABEL_STRING, msg, NULL);
        sprintf(msg, "Based on %d peaks", peakcount);
        xv_set(xvid_auto_popup->auto_osc_rate_msg, PANEL_LABEL_STRING, msg, NULL);
    }

}

void
 auto_write_notify()
{
        char    fn1[255], fn2[255], *fname;
        FILE    *fp1, *fp2;
        int     i, temprate;

        temprate = status.rate;

printf("ScanCount = %d\n" , ScanCount);

        fname = (char *)xv_get(xvid_auto_popup->auto_write_textfield,PANEL_VALUE);
        if (INTEN)
                sprintf(fn2, "%s.inten", fname);
        else
                sprintf(fn2, "%s.width", fname);
        fp2 = fopen(fn2,"w");

        for(i=Range; i < ScanCount-Range-1; i++) {
                fprintf(fp2, "%lf  %lf\n", data[i].time, data[i].width);
        }

        fclose(fp1);
        fclose(fp2);
}

void
which()
{
        int             x, y, i, j, LrRg, done, XOff, YOff, LineWidth;
        unsigned char   *InPtr, *OutPtr;
        int             PixOut;
        char            msg[20];
        Rect            rectangle;
        register ui32 *vram_ptr;
        double          temp;

        struct timeval  tp;
```

xvid_auto.c 2

```
        struct timezone tzp;
        struct Rg {
          int           x0, y0, x1, y1;
          long int      size, xcount, ycount;
          char          full;
        }               Region[10];

printf("");
        for(i=0; i < 10; i++) {
          Region[i].full = 0;
          Region[i].size = 0;
        }

        gettimeofday(&tp, &tzp);
        ClockTime = (double)(tp.tv_sec - InitialTime) +
                    (double)(tp.tv_usec / 1000000.0);
printf("");

        if (ClockTime >= TimeHold + 2) {
          sprintf(msg, "Scan Rate (frames/sec): %3.1f", (float)FrameCount/2);
          xv_set(xvid_auto_popup->auto_scan_rate_msg, PANEL_LABEL_STRING, msg, NULL);
          TimeHold = ClockTime;
          FrameCount = 0;
        }

        data[ScanCount].time = ClockTime;
printf("");

        vram_ptr =  (ui32*) vram;

        for (x=Dx; x < Width + Dx; x++)
         for (y=Dy; y < Height + Dy; y++) {
           PixOut=(char) rt_hash_to_pixel[((ui8) *(vram_ptr+x+y*status.full_width))>>1];
                if(PixOut > 0) {
                  for(i = done = 0; ((!done) && (i < 10)); i++) {
                    if (!Region[i].full) {
                          Region[i].size = 1;
                          Region[i].x0 = x;
                          Region[i].y0 = y;
                          Region[i].x1 = x;
                          Region[i].y1 = y;
                          Region[i].full = 1;
                          done = 1;
                    }
                    else if (Region[i].x0 < x && x < Region[i].x1 &&
                    Region[i].y0 < y && y < Region[i].y1) {
                          Region[i].size++;
                          done = 1;
                    }
                    else if (Region[i].x0 - 10 < x && x < Region[i].x1 + 10 &&
                    Region[i].y0 - 10 < y && y < Region[i].y1 + 10) {
                          Region[i].x0 = (Region[i].x0 < x) ? Region[i].x0 : x;
                          Region[i].x1 = (Region[i].x1 > x) ? Region[i].x1 : x;
                          Region[i].y0 = (Region[i].y0 < y) ? Region[i].y0 : y;
                          Region[i].y1 = (Region[i].y1 > y) ? Region[i].y1 : y;
                          Region[i].size++;
                          done = 1;
                    }
                  }
                }
        }


        LrRg = 0;
        for(i=0; i < 10; i++)
          LrRg = (Region[i].size > Region[LrRg].size) ? i : LrRg;
        if ((Region[LrRg].size > 10) && (!INTEN)) {
            Width = Region[LrRg].x1 - Region[LrRg].x0 + 40;
            Height = Region[LrRg].y1 - Region[LrRg].y0 + 80;
/*            data[ScanCount].height = Height - 80;*/
            data[ScanCount].width = Width - 40;
            Dx = Region[LrRg].x0 - 20;
            if (Dx < 0)
                Dx=0;
            Dy = Region[LrRg].y0 - 40;
            if (Dy < 0)
                Dy=0;
            Width = (Width + Dx < 640) ? Width : 640 - Dx;
            Height = (Height + Dy < 480) ? Height : 480 - Dy;
            XOff = ((300 - Width) / 2) - 20;
            YOff = ((480 - Height) / 2) - 40;
        }
        else if ((Region[LrRg].size > 10) && INTEN) {
            vram_ptr =  (ui32*) vram;
            data[ScanCount].width = 0;
            for (x=Region[LrRg].x0; x <= Region[LrRg].x1; x++)
               for (y=Region[LrRg].y0; y <= Region[LrRg].y1; y++) {
                  PixOut=(char) rt_hash_to_pixel[((ui8) *(vram_ptr+x
+y*status.full_width))>>1];
                  if (PixOut > 0)
                      data[ScanCount].width += (double) PixOut;
               }
        }

     if(ScanCount > Range) {
         j = ScanCount - Half;
         if (ROT) {
             data[j].width = savgol_width();
             data[j].time  = savgol_time();
             data[j].width = running_width_average();
             data[j].time  = running_time_average();
         }
             data[j].width = running_width_average();
             data[j].time  = running_time_average();
         }


     if(ScanCount > (Range+Half)) {
         if(oscflag && COUNT) {
             if (data[j].width > data[j-1].width && data[j-1].width < data[j-2].width) {
                     if (peakcount == -1)
                         time_start = data[j-1].time;
                     peakcount++;
                     oscflag = 0;
                     sprintf(msg, "Growth Rate (ml/sec): %3.2f", ((float)peakcount)/(data[
j-1].time-time_start));
                     xv_set(xvid_auto_popup->auto_osc_rate_msg, PANEL_LABEL_STRING, msg, N
ULL);
                peak[peakcount] = data[j-1].time;
}
         }
     else {
         i = j - Points + 1;
         while(data[i].width > data[i+1].width && i < ScanCount - Half)
             i++;
         if( i == ScanCount - Half)
             oscflag = 1;
     }
```

xvid_auto.c 3

```
    }

        FrameCount++;
        ScanCount++;

}

double
running_time_average()
    {
        int m ;
        double tempr = 0;
        for( m = 0; m < Range; ++m)
                tempr += data[m+ScanCount-Range+1].time *(((double) 1/(1+((m - Half < 0)
 ? -(m-Half):m-Half))));
        return (tempr / scale);
    }

double
running_width_average()
    {
        int m ;
        double tempr = 0;
        for( m = 0; m < Range; ++m)
                tempr +=data[m+ScanCount-Range+1].width*(((double) 1/(1+((m - Half < 0)
? -(m-Half):m-Half))));
        return (tempr / scale);
    }

double
savgol_width()
    {
        int m ;
        double temp = 0;
        m = ScanCount;
        temp=59.0*data[m-4].width+54.0*(data[m-5].width+data[m-3].width)
+39.0*(data[m-6].width+data[m-2].width)+14.0*(data[m-7].width
+data[m-1].width)-21.0*(data[m-8].width+data[m].width);
        return (temp / 231);
    }

double
savgol_time()
    {
        int m ;
        double temp = 0;
        m = ScanCount;
        temp=59.0*data[m-4].time+54.0*(data[m-5].time+data[m-3].time)
                +39.0*(data[m-6].time+data[m-2].time)+14.0*(data[m-7].time
                +data[m-1].time)-21.0*(data[m-8].time+data[m].time);
        return (temp / 231);
    }

float
outlier()
{
int     bins=0, i, j, tempcount = peakcount;
double  bin[100], temp=0;
int     flag=0, count[100];

bin[0] = -1;
count[0] = 0;
for(i=0; i <= peakcount; i++)
    peak[i] = peak[i+1] - peak[i];

for(i=0; i<=peakcount; i++) {
    flag =0;
    for (j=0; j<= bins; j++) {
        if ((peak[i] < 1.2 * bin[j]) && (peak[i] > 0.8 * bin[j])) {
                flag = j;
                j = bins + 1;
        }
    }

    if (!flag) {
        bins ++;
        bin[bins] = peak[i];
        count[bins] = 1;
    }
    else
        count[flag]++;
}

flag =0;
i=0;
for (j=1; j<=bins; j++)
        if (i < count[j]) {
                flag = j;
                i = count[j];
        }

printf("bins = %d\n", bins);
bins = peakcount;
peakcount =0;
for (i =1; i <= bins; i++)
        if ((peak[i] < 1.20*bin[flag]) && (peak[i] > 0.80*bin[flag])) {
                temp += peak[i];
                peakcount++;
        }
temp /= ((double) peakcount);

printf("peakcount = %lf;   temp = %lf\n", (double) peakcount, temp);
return (1/((float) temp));
}
```

xvid_popup.c 1

```
#include "xvid_includes.h"

Menu_item
auto_popup_handler(item, op)
        Menu_item       item;
        Menu_generate   op;
{
        xvid_basewin_objects *ip = (xvid_basewin_objects *)xv_get(item,
XV_KEY_DATA, INSTANCE);
                xv_set(xvid_auto_popup->auto_popup, WIN_SHOW, TRUE,
                        WIN_FRONT, 0);
        return item;
}

Menu_item
slice_popup_handler(item, op)
        Menu_item       item;
        Menu_generate   op;
{
        xvid_basewin_objects *ip = (xvid_basewin_objects *)xv_get(item,
                        XV_KEY_DATA, INSTANCE);
                xv_set(xvid_slice_popup->slice_popup, WIN_SHOW, TRUE,
                        WIN_FRONT, 0);
        return item;
}
```

xvid_globals.c 1

```
/* Globals */


/* XView objects */
/* ------------- */
xvid_basewin_objects          *xvid_basewin;
xvid_rheed_slice_objects      *xvid_rheed_slice;
xvid_full_video_objects       *xvid_full_video;
xvid_auto_popup_objects       *xvid_auto_popup;
xvid_slice_popup_objects      *xvid_slice_popup;

/*
 * Instance XV_KEY_DATA key.  An instance is a set of related
 * user interface objects.  A pointer to an object's instance
 * is stored under this key in every object.  This must be a
 * global variable.
 */
Attr_attribute  INSTANCE;

/* s2200 register variables */
/* ------------------------ */
vcon_t  vcon;    /* from definition in "vcon.h" */
Bt253_t *bt253;
Bt281_t *bt281;
Bt473_t *bt473;
char    *vram;   /* pointer set to base address of boards VRAM */


/* Low level globals */
/* ----------------- */
/*
int  s2200_unit = 0;
int  s2200_fd = -1;
char *s2200_device = "/dev/s2200";
int  s2200_vram_size;
*/

struct Tstatus status;
struct DATA     data[10000];

/* globals for graphics stuff */
/* -------------------------- */
Display *dpy;
int      default_screen;
Visual  *default_visual;
Colormap default_cmap;
int      default_depth;
GC       gc;

XColor   x_cells[MAX_COLOURS];      /* the full X colourmap      */
XColor   x_our_cells[MAX_COLOURS];  /* our r/w 'sub'- colourmap  */
struct Tcolour_map colour_map;      /* the full map - to 8 bit resolution */
                                    /* a copy of x_cell - for speed */
ui32     x_pixels[MAX_COLOURS];     /* mapping of our colours to pixels to (colourcells)
*/
int      x_plane_masks[8];          /* needed, but not used    */
int      x_free;                    /* number of free colours - for us  */

XImage  *x_image;    /* X Image representation    */


/* globals for fast closest colour generation standard */
/* -------------------------------------------------- */
ui16 rt_hash_to_pixel[MAX_COLOURS];  /* Run Time RGB value to pixel LUT */
int  square_lut_red[MAX_COLOURS];
int  square_lut_green[MAX_COLOURS];
int  square_lut_blue[MAX_COLOURS];


/* globals for optimum colourmap generation */
/* ---------------------------------------- */
struct Thist_element hist_global[ARRAYSIZE];


/* Canvas Paint Window ID */
/* ---------------------- */
Window xwin1_id, xwin2_id, xwin3_id;


struct itimerval timer;

Notify_value update();

XImage  *x_image_green;    /* X Image representation */
XImage  *x_image_slice;    /* X Image representation */

/* General Globals */
/* --------------- */
/*struct Tgeneral_status status; */  /* display widths etc */
/*struct Timage_info image_info; */  /* info on image ready for file saving */

int full_width, full_height;  /* set up by call to low_level.c */

/* Fit variables */

HeadStruct      Header;
SpaceStruct     *ScanSpace = NULL;
BoxStruct       *topbox, *curbox, *holdbox, *BoxTemp = NULL;
int             ScanPix[640];
double          TimeHold, ClockTime;
long int        InitialTime;
long int        BoxCount, PixIndex, ScanCount, FrameCount;
long int        MaxNumScans = 0;
int             ScanHeight, XWindowWidth, TWindowWidth;
float           x[641], y[641], sig[641];
float           inten[641];

Rect *rect;
int disp_flag, mode_flag = 0;
int X1, X2, Y1, Y2;

int  GETWIDTH=0;
int  PAINTVIDEO=1;
int  AUTO=0;
int  DUMP=0;

FILE    *fp1, *fp2;
int Colnum=1;

double          TimeHold, ClockTime;
long int        InitialTime;
long int        ScanCount, FrameCount;
int             Width, Height, Dx, Dy;

int       Range, Half, Points, peakcount, oscflag;
float     scale, time_start;
```

xvid_globals.c 2

```
double   peak[200], rawt[30], rawd[30];

float sqrarg;

int      INTEN=1, ROT=0, COUNT=1;
```

xvid_includes.h

```
/* All include files */

#include <stdio.h>
#include <sys/param.h>
#include <sys/types.h>
#include <sys/mman.h>
#include <sys/stat.h>
#include <errno.h>
#include <fcntl.h>
#include <sys/ioctl.h>
#include <malloc.h>
#include <sys/time.h>

#include <X11/X.h>
#include <X11/Xlib.h>
#include <X11/Xos.h>

#include <xview/xview.h>
#include <xview/panel.h>
#include <xview/textsw.h>
#include <xview/xv_xrect.h>
#include <xview/notify.h>
#include <gdd.h>

#include <s2200_types.h>
#include <s2200_colours.h>
#include <Bt253.h>
#include <Bt281.h>
#include <Bt473.h>
#include <vcon.h>
#include <s2200.h>

#include "xvid_ui.h"
#include "low_level.h"
#include "xvid.h"
#include "xvid_colors.h"

#include "protos.h"

#include "xvid_externs.h"
```

What is claimed is:

1. A method comprising the steps of:

extracting characteristics of a surface on a substrate, the extracting step is performed in near real-time and includes the steps of:

obtaining a video image of an energy pattern coming from said substrate, said video image having pixels, monitoring a selected set of said pixels, repeating the steps of obtaining and monitoring to generate a plurality of time-domain data, and filtering said plurality of time-domain data; and controlling a deposition apparatus in near real-time to control a thickness of a layer of a material applied to said substrate in response to the characteristics extracted in near real-time.

2. The method according to claim 1 wherein said substrate is rotating.

3. The method according to claim 2 wherein when said plurality of time-domain data are not evenly spaced with respect to time, said method includes the steps of:

interpolating said plurality of time-domain data before said step of filtering to produce a second plurality of time-domain data, and filtering said second plurality of time-domain data in near real-time.

4. The method according to claim 3 wherein said step of monitoring includes the steps of:

defining a framing box around a specular spot on said video image; and counting the number of said pixels within said framing box having intensities greater than a pre-selected threshold value to produce one of said plurality of time-domain data that represents the size of the specular spot.

5. The method according to claim 4 wherein said step of filtering is performed to eliminate noise due to the rotation of said substrate.

6. The method according to claim 4 further including the step of identifying peaks of said plurality of time-domain data when said plurality of time-domain data are evenly spaced with respect to time and identifying peaks of said second plurality of time-domain data when said plurality of time-domain data are not evenly spaced with respect to time.

7. The method according to claim 6 wherein:

when said plurality of time-domain data are evenly spaced with respect to time, said step of identifying said peaks includes the steps of:

taking a derivative of said plurality of time-domain data; and locating where said derivative is zero; and when said plurality of time-domain data are not evenly spaced with respect to time, said step of identifying said peaks includes the steps of:

taking a derivative of said second plurality of time-domain data, and locating where said derivative is zero.

8. The method according to claim 6 wherein at least one material is deposited on said substrate, and the deposition rate is determined by counting said peaks wherein each of said peaks corresponds to one monolayer of epilayer; and wherein when said deposition rate is different from a target growth rate, then at said step of controlling, at least one deposition parameter that controls said deposition apparatus is changed.

9. A method of monitoring oxide description of a surface of a substrate near real-time and controlling a deposition apparatus, the method comprising the steps of:

obtaining a video image of an energy pattern coming from said substrate, said video image having pixels;

monitoring a selected set of said pixels;

repeating the steps of obtaining and monitoring to generate a plurality of time-domain data;

filtering said plurality of time-domain data in near real-time;

checking values of said plurality of time-domain data, wherein the surface of said substrate is free of oxide when the values increase and level out; and controlling said deposition apparatus in near real-time, said step of controlling includes introducing at least one material to be deposited on said substrate.

10. The method according to claim 1 wherein said step of extracting further includes the step of monitoring surface exchange reactions by introducing a first type of atoms associated with the material to said substrate prior to said step of obtaining said video image, and said step of controlling further includes the step of introducing a second type of atoms associated with a second material to said substrate when the values of said plurality of time-domain data level out after initially decreasing and increasing.

11. A method of extracting characteristics of the surface of a substrate substantially in real-time and controlling a deposition apparatus substantially in real-time, said method comprising the steps of:

obtaining a video image of an energy pattern coming from said substrate, said video image having pixels;

monitoring a selected set of said pixels and generating a time-domain data from said selected set by obtaining intensity values along one of a diffraction line on said video image and a specular spot; and changing at least one deposition parameter when said time-domain data includes a plurality of intensity maxima.

12. The method according to claim 11 wherein each of said plurality of intensity values is determined to be an intensity maxima by comparing each of said plurality of intensity values to a threshold value.

13. An apparatus for extracting near real-time characteristics of the surface of a rotatable substrate and for controlling a deposition apparatus in near real-time, said apparatus comprising:

(a) said deposition apparatus having said rotatable substrate, said deposition apparatus for depositing at least one material on said rotatable substrate;

(b) an energy pattern generator coupled to said deposition apparatus, said energy pattern generator for subjecting said substrate to a beam of energy and for producing energy patterns;

(c) an imaging unit coupled to said energy pattern generator, said imaging unit for obtaining video images of said energy patterns, said video images each having pixels;

(d) a data processing unit coupled to said imaging unit, said data processing unit for monitoring a selected set of said pixels on each of said video images, for generating a time-domain data for a corresponding one of said video images and for generating at least one deposition parameter in near real-time; and (e) a deposition control unit coupled to said data processing unit and to said deposition apparatus, said deposition control unit for receiving said deposition parameter from said data processing unit and for controlling said deposition apparatus to control a thickness of a layer of the at least one material applied to said rotatable substrate in response to receiving said deposition parameter in near real-time.

14. The apparatus of claim 13 wherein said imaging unit comprises a video camera and a frame grabber card, said frame grabber card having a frame grabber memory, said frame grabber card for digitizing said video images and for storing said digitized video images to said frame grabber memory; and said substrate is rotating.

15. The apparatus of claim 13 wherein said data processing unit defines a framing box around a specular spot on each of said video images and counts the number of said pixels within said framing box having intensities greater than a pre-selected threshold value to produce said time-domain data for each of said video images, said time-domain data representing the size of the specular spot;

when said plurality of time-domain data are evenly spaced with respect to time, said data processing unit filters said plurality of time-domain data in near real-time; and when said plurality of time-domain data are not evenly spaced with respect to time, said data processing unit interpolates said plurality of time-domain data to generate a second plurality of time-domain data and filters said second plurality of time-domain data in near real-time.

16. The apparatus of claim 15 wherein when said plurality of time-domain data are evenly spaced with respect to time, said data processing unit identifies peaks of said plurality of time-domain data to obtain the growth rate of said material being deposited on said substrate that is rotating; and when said plurality of time-domain data are not evenly spaced with respect to time, said data processing unit identifies peaks of said second plurality of time-domain data to obtain the growth rate of said material being deposited on said substrate that is rotating.

17. The apparatus of claim 15 wherein said data processing unit monitors oxide desorption;

when the values of said plurality of time-domain data increase and level out, the surface of said substrate is free of oxide; and said deposition control unit receives said deposition parameter for introducing at least said material to be deposited on said substrate.

18. The apparatus of claim 15 wherein said data processing unit monitors surface exchange reactions;

a first type of atoms is being deposited on said substrate; and when the values of said plurality of time-domain data level out after initially decreasing and increasing, said deposition control unit receives said deposition parameter for introducing a second type of atoms to said substrate.

19. The apparatus of claim 13 wherein said data processing unit monitors a surface reconstruction process;

a plurality of materials are being deposited on said substrate;

said substrate is rotating;

said data processing unit identifies the number of diffraction lines and the spacing between said diffraction lines on each of said video images and compares each of said plurality of time-domain data to a target value substantially in real-time; and said data processing unit generates said deposition parameter when any of said plurality of time-domain data is different from said target value.

20. The apparatus of claim 13 wherein said data processing unit monitors the smoothness of the surface of said substrate;

said substrate is rotating;

said data processing unit obtains intensity values along a diffraction line or spots on one of said video images to generate one of said plurality of time-domain data and thresholds said one time-domain data; and said data processing unit generates said deposition parameter when said one time-domain data includes a plurality of intensity maxima.

21. The apparatus of claim 13 wherein said near real-time does not exceed a delay of 0.33 seconds.

* * * * *